(12) United States Patent
Park et al.

(10) Patent No.: US 12,414,423 B2
(45) Date of Patent: Sep. 9, 2025

(54) PIXEL AND DISPLAY DEVICE INCLUDING THE SAME

(71) Applicant: Samsung Display Co., LTD., Yongin-si (KR)

(72) Inventors: Do Yeong Park, Yongin-si (KR); Kyung Bae Kim, Yongin-si (KR); No Kyung Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 837 days.

(21) Appl. No.: 17/387,373

(22) Filed: Jul. 28, 2021

(65) Prior Publication Data
US 2022/0181382 A1    Jun. 9, 2022

(30) Foreign Application Priority Data
Dec. 3, 2020    (KR) .......................... 10-2020-0167843

(51) Int. Cl.
  *H10H 29/14*    (2025.01)
  *H10H 20/821*    (2025.01)
  *H10H 20/831*    (2025.01)

(52) U.S. Cl.
  CPC ........ *H10H 29/142* (2025.01); *H10H 20/821* (2025.01); *H10H 20/831* (2025.01)

(58) Field of Classification Search
  None
  See application file for complete search history.

(56) References Cited

U.S. PATENT DOCUMENTS

| | | | |
|---|---|---|---|
| 10,038,305 B2 | 7/2018 | Kondo | |
| 10,249,603 B2 | 4/2019 | Cho et al. | |
| 10,276,630 B2 | 4/2019 | Lee et al. | |
| 10,340,419 B2 | 7/2019 | Kim et al. | |
| 2016/0211245 A1* | 7/2016 | Do | G02F 1/133603 |

(Continued)

FOREIGN PATENT DOCUMENTS

| | | |
|---|---|---|
| CN | 107219741 | 9/2017 |
| KR | 10-2018-0009014 | 1/2018 |

(Continued)

OTHER PUBLICATIONS

International Search Report Corresponding to International Application No. PCT/KR2021/017890 dated Mar. 11, 2022.

*Primary Examiner* — Yara B Green
*Assistant Examiner* — Tessa Elizabeth McNamee
(74) *Attorney, Agent, or Firm* — Womble Bond Dickinson (US) LLP

(57) ABSTRACT

A pixel includes a first pattern and a second pattern spaced apart from each other in a light emitting area; a light emitting element between the first pattern and the second pattern; a first electrode electrically connected to a first end portion of the light emitting element; a second electrode electrically connected to a second end portion of the light emitting element; and a bank in a non-light emitting area. The first electrode and the second electrode extend from the light emitting area through the non-light emitting area to a separating area. The second pattern extends from the light emitting area through the non-light emitting area to the separating area, and overlaps an edge of the bank, and is disposed in an area between the first electrode and the second electrode at a boundary of the non-light emitting area and the separating area.

24 Claims, 25 Drawing Sheets

(56) References Cited

U.S. PATENT DOCUMENTS

| | | | | |
|---|---|---|---|---|
| 2018/0175009 A1* | 6/2018 | Kim | ............... | H01L 25/0753 |
| 2019/0229163 A1* | 7/2019 | Murai | ............... | H10K 59/124 |
| 2019/0244985 A1* | 8/2019 | Kim | ............... | H01L 27/124 |
| 2021/0217739 A1 | 7/2021 | Lee et al. | | |
| 2022/0068901 A1 | 3/2022 | Kong et al. | | |
| 2022/0077228 A1 | 3/2022 | Do et al. | | |

FOREIGN PATENT DOCUMENTS

| | | |
|---|---|---|
| KR | 10-2018-0011404 | 2/2018 |
| KR | 10-1987196 | 6/2019 |
| KR | 10-2020-0027136 | 3/2020 |
| KR | 10-2020-0042075 | 4/2020 |
| KR | 10-2020-0073340 | 6/2020 |
| KR | 10-2020-0088962 | 7/2020 |
| KR | 10-2020-0105598 | 9/2020 |

\* cited by examiner

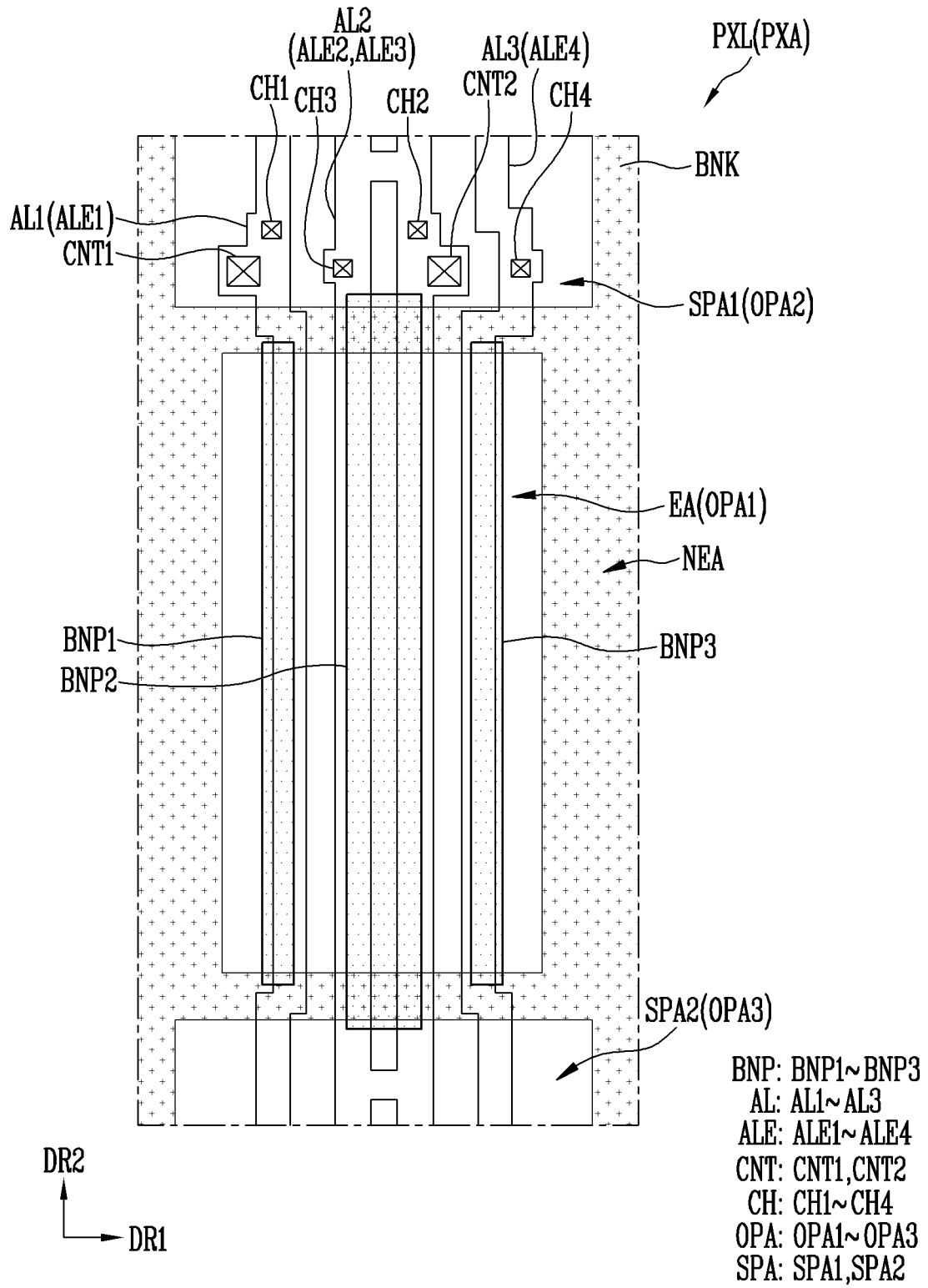

PIXEL AND DISPLAY DEVICE INCLUDING THE SAME

CROSS-REFERENCE TO RELATED APPLICATION(S)

This application claims priority to and benefits of Korean Patent Application No. 10-2020-0167843 under 35 U.S.C. § 119 filed on Dec. 3, 2020, in the Korean Intellectual Property Office, the entire contents of which are incorporated herein by reference.

BACKGROUND

(a) Technical Field

Embodiments relate to a pixel and a display device including the same.

(b) Description of the Related Art

Recently, interest in an information display is increasing. Accordingly, research and development on display devices are continuously being conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a pixel and a display device including the same that may prevent short-circuit defects of pixel electrodes.

The objects of the disclosure are not limited to the objects mentioned above, and other technical objects that are not mentioned may be clearly understood to a person of ordinary skill in the art using the following description.

An embodiment provides a pixel that may include a light emitting area, a non-light emitting area adjacent to the light emitting area, and a separating area spaced apart from the light emitting area, the non-light emitting area disposed between the light emitting area and the separating area; a first pattern and a second pattern that are spaced apart from each other along a first direction in the light emitting area and respectively extend along a second direction; a first light emitting element disposed between the first pattern and the second pattern; a first electrode electrically connected to a first end portion of the first light emitting element; a second electrode electrically connected to a second end portion of the first light emitting element; and a bank disposed in the non-light emitting area. The first electrode and the second electrode may extend from the light emitting area through the non-light emitting area to the separating area. The second pattern may extend from the light emitting area through the non-light emitting area to the separating area, and may overlap an edge of the bank, and may be disposed in an area between the first electrode and the second electrode at a boundary of the non-light emitting area and the separating area.

The pixel may further include a first alignment electrode that is disposed on the first pattern, extends along the second direction in the light emitting area, and extends from the light emitting area through the non-light emitting area to the separating area; a second alignment electrode that is disposed on the second pattern, extends along the second direction in the light emitting area, and extends from the light emitting area through the non-light emitting area to the separating area; and a first insulating film that overlaps the first alignment electrode and the second alignment electrode in the light emitting area, and the first insulating film being disposed between the first alignment electrode and the second alignment electrode and the first electrode and the second electrode.

The first alignment electrode may be electrically connected to the first electrode through a first contact hole formed in the first insulating film in the separating area, and the second alignment electrode may be electrically connected to the second electrode through a second contact hole formed in the first insulating film in the separating area.

The first alignment electrode and the second alignment electrode may be spaced apart from each other at a substantially uniform interval in the light emitting area and respectively have a substantially uniform width.

The first pattern may partially overlap the first alignment electrode and has a substantially uniform width in the light emitting area; and the second pattern may partially overlap the second alignment electrode and may have a substantially uniform width, is the second pattern being spaced apart from the first pattern by a constant interval in the light emitting area.

The pixel may further include a second light emitting element disposed between the first pattern and the second pattern.

The pixel may further include a third electrode that is disposed between the first electrode and the second electrode, and is electrically connected between the first electrode and the second electrode through the first light emitting element and the second light emitting element; and a third alignment electrode that is disposed between the first alignment electrode and the second alignment electrode, and overlaps an area of the second pattern.

The first electrode may overlap a first area of the first alignment electrode and a first end portion of the first light emitting element; the third electrode may overlap a first area of the third alignment electrode, a second end portion of the first light emitting element, a second area of the first alignment electrode, and a first end portion of the second light emitting element, and the third electrode may have a substantially curved or substantially bent shape.

The third electrode may extend from the light emitting area through the non-light emitting area to the separating area, and may be electrically connected to the third alignment electrode through a third contact hole formed in the first insulating film in the separating area.

The second pattern may overlap the edge of the bank and may be disposed in an area between the third electrode and the second electrode at a boundary of the non-light emitting area and the separating area.

The pixel may further include a third pattern facing the first pattern, the second pattern being disposed between the third pattern and the first pattern; and a fourth alignment electrode that is disposed on the third pattern, extends along the second direction in the light emitting area, and extends from the light emitting area through the non-light emitting area to the separating area.

The first alignment electrode and the third alignment electrode may be spaced apart from each other by a first constant distance along the first direction, and have a substantially uniform width in the light emitting area; and the second alignment electrode and the fourth alignment electrode may be spaced apart from each other by the first constant distance along the first direction, and may have a substantially uniform width in the light emitting area.

The first pattern may overlap an area of the first alignment electrode in the light emitting area; and the second pattern may overlap an area of the second alignment electrode and the third alignment electrode in the light emitting area. The third pattern may overlap an area of the fourth alignment electrode in the light emitting area; and the first pattern, the second pattern, and the third pattern may have a substantially uniform width, and the second pattern may be spaced apart from the first pattern and the third pattern by a same distance in the light emitting area.

The pixel may further include a fourth electrode that has a substantially curved or substantially bent shape, overlaps a second area of the third alignment electrode and a first area of the fourth alignment electrode, and is electrically connected between the second electrode and the third electrode; and a fifth electrode that has a substantially curved or substantially bent shape, overlaps a first area of the second alignment electrode and a second area of the fourth alignment electrode, and is electrically connected between the second electrode and the fourth electrode.

The pixel may further include a third light emitting element that is disposed between the second pattern and the third pattern, and includes a first end portion electrically connected to the fourth electrode and a second end portion electrically connected to the fifth electrode; and a fourth light emitting element that is disposed between the second pattern and the third pattern, and includes a first end portion electrically connected to the fifth electrode and a second end portion electrically connected to the second electrode.

At least one of the first pattern and the third pattern may extend from the light emitting area through the non-light emitting area to the separating area.

The third pattern may extend to the separating area, and may be closer to the outside of the separating area than the fifth electrode along the first direction in the separating area.

The separating area may be disposed below the light emitting area, and the first electrode and the second electrode may be electrically connected to the first alignment electrode and the second alignment electrode, respectively, through respective contact holes in the separating area.

The first alignment electrode and the second alignment electrode may be electrically connected to the first power line and the second power line, respectively, through respective contact parts in an area disposed at an upper end of the light emitting area.

The pixel may further include a conductive pattern that is disposed between the first electrode and the second electrode at a boundary between the non-light emitting area and the separating area or at a boundary between the non-light emitting area and the light emitting area, and extends along a boundary of the non-light emitting area.

An end portion of the conductive pattern may be electrically connected to one of the first electrode and the second electrode, and another end portion of the conductive pattern may be floating.

The conductive pattern may not overlap the second pattern, and an end portion of the conductive pattern may be removed around the second pattern.

A display device according to an embodiment may include a pixel disposed in a display area. The pixel may include a light emitting area, a non-light emitting area adjacent to the light emitting area, and a separating area spaced apart from the light emitting area, the non-light emitting area being disposed between the light emitting area and the separating area; and a first pattern and a second pattern that are spaced apart from each other along a first direction in the light emitting area and respectively extend along a second direction; a light emitting element disposed between the first pattern and the second pattern; a first electrode electrically connected to a first end portion of the light emitting element; a second electrode electrically connected to a second end portion of the light emitting element; and a bank disposed in the non-light emitting area. The first electrode and the second electrode may extend from the light emitting area through the non-light emitting area to the separating area. The second pattern may extend from the light emitting area through the non-light emitting area to the separating area, and may overlap an edge of the bank, and may be disposed in an area between the first electrode and the second electrode at a boundary of the non-light emitting area and the separating area.

Other embodiments are included in the detailed description and drawings.

According to embodiments, light emitting elements may be stably aligned within a light emitting area of a pixel. Thus, it is possible to prevent short circuit defects from occurring between pixel electrodes. Accordingly, it is possible to improve a yield of a display device.

Effects of embodiments of the disclosure are not limited by what is illustrated in the above, and more various effects are included in the specification.

BRIEF DESCRIPTION OF THE DRAWINGS

The above and other aspects and features of the disclosure will become more apparent by describing in detail embodiments thereof with reference to the attached drawings, in which:

FIG. 13A to FIG. 13D illustrate top plan views of a manufacturing method of a pixel according to an embodiment.

DETAILED DESCRIPTION OF THE EMBODIMENTS

Figure 1A:
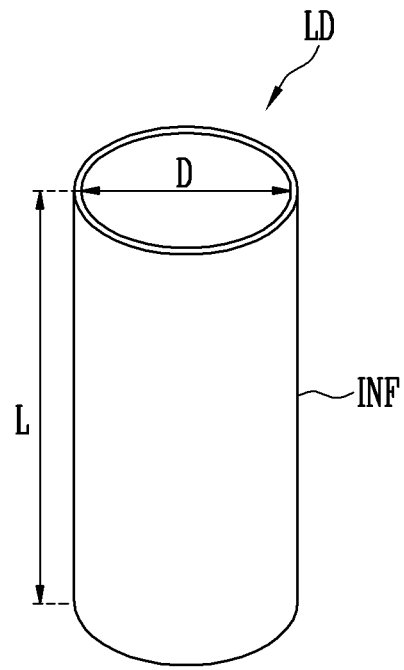
FIG. 1A illustrates a perspective view of a light emitting element according to an embodiment.

Since the disclosure may be variously modified and have various forms, embodiments will be illustrated and described in detail in the following. In the description below, singular forms are to include plural forms unless the context clearly indicates only the singular.

However, the disclosure is not limited to the embodiments disclosed hereinafter and may be implemented in various forms. In addition, each embodiment disclosed below may be implemented alone, or may be implemented in combination with at least one other embodiment.

Some of the elements not directly related to the features of the disclosure in the drawing may be omitted in order to clearly illustrate the disclosure. In addition, some of the elements in the drawing can be shown in somewhat exaggerated sizes, ratios, and the like within the spirit and the scope of the drawings and the disclosure. The same or similar elements throughout the drawings may be accorded the same reference numerals and symbols even if they are displayed on different drawings, and duplicate descriptions will be omitted.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
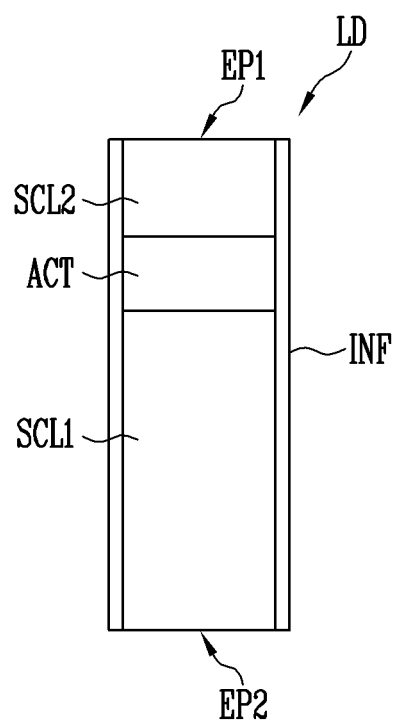
FIG. 1B to FIG. 1D respectively illustrate a schematic cross-sectional view of a light emitting element according to an embodiment.
Figure 1C:
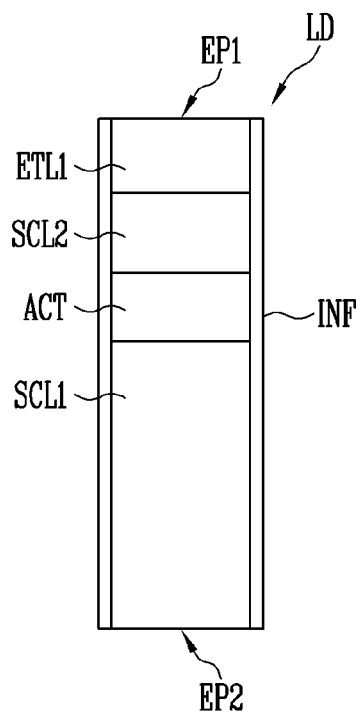
Figure 1D:
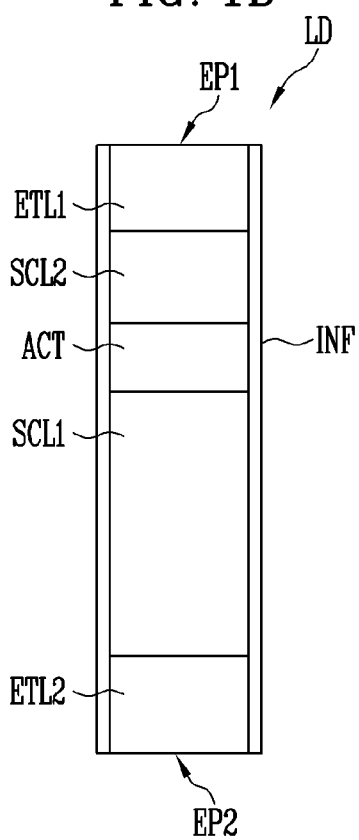

FIG. 1A illustrates a perspective view of a light emitting element LD according to an embodiment. FIG. 1B to FIG. 1D respectively illustrate a schematic cross-sectional view of a light emitting element LD according to an embodiment. For example, FIG. 1B to FIG. 1D illustrate embodiments of different configurations from that of the light emitting element LD of FIG. 1A. FIG. 1A to FIG. 1D illustrate a substantially rod-like light emitting element LD of a substantially circular cylinder shape, but a type and/or shape of the light emitting element LD is not limited thereto.

Referring to FIG. 1A to FIG. 1D, the light emitting element LD may include a first semiconductor layer SCL1 and a second semiconductor layer SCL2, and an active layer ACT interposed between the first and second semiconductor layers SCL1 and SCL2. For example, the light emitting element LD may include the first semiconductor layer SCL1, the active layer ACT, and the second semiconductor layer SCL2 sequentially stacked each other along a length L direction.

The light emitting element LD may be provided to have a substantially rod shape extending along one or a direction. In case that the extending direction of the light emitting element LD is the length L direction, the light emitting element LD may have a first end portion EP1 and a second end portion EP2 along the length L direction.

One of the first and second semiconductor layers SCL1 and SCL2 may be disposed on the first end portion EP1 of the light emitting element LD. The remaining one of the first and second semiconductor layers SCL1 and SCL2 may be disposed on the second end portion EP2 of the light emitting element LD. For example, the second semiconductor layer SCL2 and the first semiconductor layer SCL1 may be disposed on the first end portion EP1 and the second end portion EP2 of the light emitting element LD, respectively.

In an embodiment, the light emitting element LD may be a substantially rod-shaped light emitting element (also referred to as a "rod-shaped light emitting diode") manufactured in a rod shape through an etching method or the like within the spirit and the scope of the disclosure. In the specification, "rod shape" refers to a rod-like shape or bar-like shape (for example, with an aspect ratio greater than 1) that may be long in the length L direction, such as a circular cylinder or a polygonal cylinder, but a shape of a cross section thereof is not particularly limited. For example, the length L of the light emitting element LD may be larger than a diameter D thereof (or a width of a lateral cross-section thereof).

The light emitting element LD may have a size as small as a nano-scale to a micro-scale. For example, the light emitting element LD may each have the diameter D (or width) and/or the length L ranging from a nano scale to a micro scale. However, the size of the light emitting element LD in the disclosure is not limited thereto. For example, the size of the light emitting element LD may be changed according to design conditions of various devices using the light emitting element LD as a light source, for example, the display device.

The first semiconductor layer SCL1 may be a first conductive semiconductor layer. For example, the first semiconductor layer SCL1 may include an N-type semiconductor layer. For example, the first semiconductor layer SCL1 may include a semiconductor material of one of InAlGaN, GaN, AlGaN, InGaN, AlN, and InN, and may include a N-type semiconductor layer doped with a first conductive dopant such as Si, Ge, Sn, or the like within the spirit and the scope of the disclosure. The first semiconductor layer SCL1 may be formed of various materials.

The active layer ACT may be disposed on the first semiconductor layer SCL1, and may be formed to have a single-quantum or multi-quantum well structure. A position of the active layer ACT may be variously changed according to a type of the light emitting element LD. The active layer ACT may emit light having a wavelength in a range of about 400 nm to about 900 nm, and may have a double hetero-structure.

A clad layer (not shown) doped with a conductive dopant may be formed or disposed at an upper portion and/or a lower portion of the active layer ACT. For example, the clad layer may be formed as an AlGaN layer or an InAlGaN layer. In an embodiment, a material such as AlGaN and AlInGaN may be used to form the active layer ACT, and in addition, various materials may form the active layer ACT.

The second semiconductor layer SCL2 may be disposed to on the active layer ACT, and may include a semiconductor layer of a type different from that of the first semiconductor layer SCL1. For example, the second semiconductor layer SCL2 may include a P-type semiconductor layer. For example, the second semiconductor layer SCL2 may include at least one semiconductor material of InAlGaN, GaN, AlGaN, InGaN, AlN, and InN, and may include a P-type semiconductor layer doped with a second conductive dopant such as Mg. The second semiconductor layer SCL2 may be formed of various materials.

In an embodiment, the first semiconductor layer SCL1 and the second semiconductor layer SCL2 may have different lengths (or thicknesses) in the length L direction of the light emitting element LD. For example, the first semiconductor layer SCL1 may have a longer length (or thicker thickness) than that of the second semiconductor layer SCL2 along the length L direction of the light emitting element LD. Accordingly, the active layer ACT of the light emitting element LD may be disposed closer to the first end portion EP1 than to the second end portion EP2.

In case that a voltage of a threshold voltage or more is applied to respective ends of the light emitting element LD, the light emitting element LD emits light while electron-hole pairs are combined in the active layer ACT. By controlling the light emission of the light emitting element LD by using this principle, the light emitting element LD may be used as a light source for various light emitting devices in addition to pixels of a display device.

In an embodiment, the light emitting element LD may further include an additional constituent element in addition to the first semiconductor layer SCL1, the active layer ACT, the second semiconductor layer SCL2, and/or an insulating film INF surrounding them. For example, the light emitting element LD may additionally include one or more of a phosphor layer, an active layer, a semiconductor layer, and/or an electrode layer disposed on one or an end side of the first semiconductor layer SCL1, the active layer ACT, and/or the second semiconductor layer SCL2.

For example, the light emitting element LD may further include an electrode layer ETL1 disposed at one or an end side of the second semiconductor layer SCL2 as shown in FIG. 1C. The electrode layer ETL1 may be disposed at the first end portion EP1 of the light emitting element LD.

The light emitting element LD may further include another electrode layer ETL2 disposed at one or an end side of the first semiconductor layer SCL1 as shown in FIG. 1D. For example, the electrode layers ETL1 and ETL2 may be disposed at the first and second end portions EP1 and EP2 of the light emitting element LD.

The electrode layers ETL1 and ETL2 may be an ohmic contact electrode, but are not limited thereto. For example, the electrode layers ETL1 and ETL2 may be a short Schottky contact electrode.

The electrode layers ETL1 and ETL2 may include a metal or a conductive oxide. For example, the electrode layers ETL1 and ETL2 may be formed by singly using or mixing chromium (Cr), titanium (Ti), aluminum (Al), gold (Au), nickel (Ni), an oxide thereof or alloy thereof, and an indium tin oxide (ITO). Materials included in respective electrode layers ETL1 and ETL2 may be the same or different from each other.

The electrode layers ETL1 and ETL2 may be substantially transparent or translucent. Accordingly, light generated by the light emitting element LD may pass through the electrode layers ETL1 and ETL2 and may be emitted to the outside of the light emitting element LD. In an embodiment, in case that the light generated by the light emitting element LD does not transmit through the electrode layers ETL1 and ETL2 and is emitted to the outside of the light emitting element LD through an area excluding respective end portions of the light emitting element LD, the electrode layers ETL1 and ETL2 may be opaque.

In an embodiment, the light emitting element LD may further include the insulating film INF provided or disposed on a surface thereof. The insulating film INF may be formed or disposed on the surface of the light emitting element LD to surround at least an outer circumferential surface of the active layer ACT, and may further surround one or an area of the first and second semiconductor layers SCL1 and SCL2.

In case that the light emitting element LD may include the electrode layers ETL1 and ETL2, the insulating film INF may at least partially or may not cover or overlap external circumferential surfaces of the electrode layers ETL1 and ETL2. For example, the insulating film INF may be selectively formed or disposed on the surfaces of the electrode layers ETL1 and ETL2.

The insulating film INF may expose respective end portions of the light emitting element LD in the length (L) direction of the light emitting element LD. For example, the insulating film INF exposes at least one of the first and second semiconductor layers SCL1 and SCL2 and of the electrode layers ETL1 and ETL2 at the first and second end portions EP1 and EP2 of the light emitting element LD. In an embodiment, the insulating film INF may not be provided or disposed in the light emitting element LD.

In case that the insulating film INF is provided or disposed to cover or overlap a surface of the light emitting element LD, for example, an external circumferential surface of the active layer ACT, it is possible to prevent the active layer ACT from being short-circuited to at least one electrode that is not shown (for example, an alignment electrode and/or a pixel electrode to be described later). Therefore, electrical stability of the light emitting element LD may be secured.

The insulating film INF may include a transparent insulating material. For example, the insulating film INF may include at least one insulating material of $SiO_2$ or a silicon oxide ($SiO_x$) not determined or limited thereby, $Si_3N_4$ or a silicon nitride ($SiN_x$) not determined or limited thereby, $Al_2O_3$ or an aluminum oxide ($Al_xO_y$) not determined or limited thereby, and $TiO_2$ or a titanium oxide ($TiO_x$) not determined or limited thereby, but is not limited thereto. For example, the material included in the insulating film INF is not particularly limited.

In case that the insulating film INF is provided or disposed on the surface or on a surface of the light emitting element LD, it is possible to improve a life-span and efficiency thereof by minimizing surface defects of the light emitting element LD. In case that the insulating film INF is formed or disposed on each light emitting element LD, it is possible to prevent an unwanted short circuit between the light emitting elements LD from occurring even in case that light emitting elements LD are disposed in close contact with each other.

In an embodiment, the light emitting element LD may be manufactured through a surface treatment process. For example, in case that the light emitting elements LD are mixed with a fluid solution (or a solvent) and supplied to each light emitting area (for example, a light emitting area of each pixel), each light emitting element LD may be surface-treated so that the light emitting elements LD are uniformly aggregated in the solution and are uniformly distributed. As a non-limiting embodiment in this regard, the insulating film INF itself may be formed as a hydrophobic film using a hydrophobic material, or a hydrophobic film made of a hydrophobic material may be additionally formed on the insulating film INF.

The insulating film INF may be formed as a single layer or multilayer. For example, the insulating film INF may be formed as a double film.

The insulating film INF may be partially etched in at least one or an area, for example, at least one of an upper area and a lower area. The insulating film INF may have a substantially rounded shape in the at least one or an area, but is not limited thereto.

For example, in at least one of the upper and lower areas of the insulating film INF, the insulating film INF may be partially or entirely removed. Accordingly, at least one of the first semiconductor layer SCL1, the second semiconductor layer SCL2, and the electrode layers ETL1 and ETL2 may be partially exposed.

The light emitting element LD may be used in various types of devices that require a light source, including a display device. For example, light emitting elements LD may be disposed in each pixel of a display panel, and the light emitting elements LD may be used as a light source of each pixel. However, an application field of the light emitting element LD is not limited to the above-described example. For example, the light emitting element LD may be used in other types of devices that require a light source, such as a lighting device.

Figure 2:
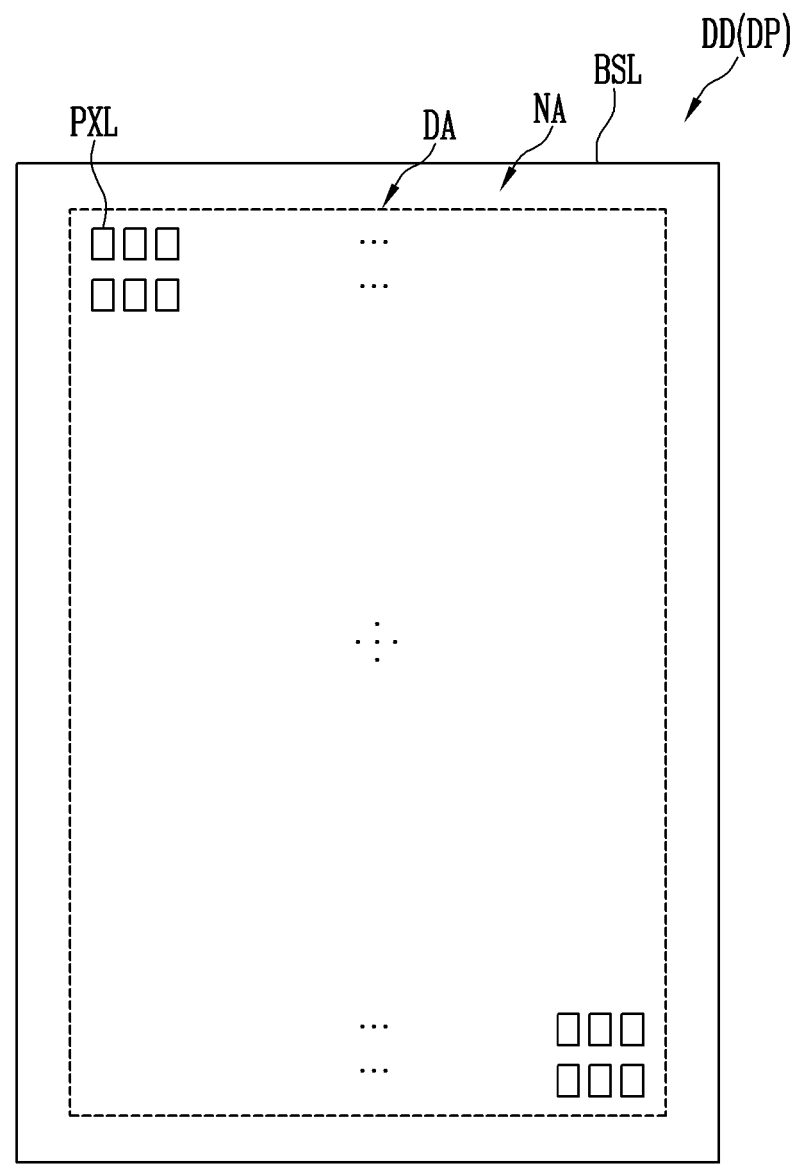
FIG. 2 illustrates a top plan view of a display device according to an embodiment.
Figure 2:
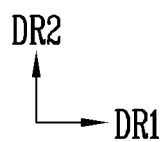

FIG. 2 illustrates a top plan view of a display device DD according to an embodiment. In FIG. 2, the display device DD will be disclosed as an example of an electronic device that may use the light emitting element LD described in the embodiments of FIG. 1A to FIG. 1D as a light source, and for example, a structure of the display device DD will be described based on the display panel DP. For example, each pixel PXL of the display panel DP may include at least one light emitting element LD.

For convenience, FIG. 2 illustrates a structure of the display panel DP based on the display area DA. However, in an embodiment, at least one driving circuit portion, wires, and/or pads, which are not shown, may be further provided or disposed in the display panel DP.

Referring to FIG. 2, the display panel DP according to an embodiment may include a base layer BSL and pixels PXL provided or disposed on the base layer BSL.

The display panel DP may have various shapes. For example, the display panel DP may be provided or disposed in a substantially rectangular plate shape, but is not limited thereto. For example, the display panel DD may have a shape such as substantially a circle or substantially an ellipse. The display panel DP may include an angled corner and/or curved line type corner. For convenience, FIG. 2 illustrates that the display panel DP has a substantially rectangular plate shape. In FIG. 2, an extending direction of a long side (for example, horizontal direction) of the display panel DP is indicated as a first direction DR1, and an extending direction of a short side (for example, vertical direction) is indicated as a second direction DR2.

The display panel DP and the base layer BSL for forming the display panel include a display area DA for displaying an image and a non-display area NA excluding the display area DA. The display area DA may include a screen on which an image is displayed, and the non-display area NA may be the remaining area except for the display area DA.

The pixels PXL may be disposed in the display area DA on the base layer BSL. For example, the display area DA may include pixel areas in which respective pixels PXL may be disposed.

The non-display area NA may be disposed around or adjacent to the display area DA. In the non-display area NA, various wires electrically connected to the pixels PXL of the display area DA, pads, and/or internal circuit parts may be disposed. In describing embodiments, the term "connection (or coupling)" may comprehensively mean a physical and/or electrical connection (or coupling). This may comprehensively mean a direct or indirect connection (or coupling), and an integrated or non-integrated connection (or coupling).

In an embodiment, at least two types of pixels PXL emitting light of different colors may be disposed in the display area DA. Each pixel unit formed of pixels PXL of different colors disposed adjacent to each other may display various colors.

In an embodiment, each pixel PXL may be set to a pixel of a predetermined color, and may include a light emitting element LD that generates light of the predetermined color. In an embodiment, at least some or a number of the pixels PXL may include a light emitting element LD that generates light of a first color, and a light conversion layer for converting the light of the first color into light of a second color may be disposed at an upper portion of the pixel PXL. Accordingly, the light of the second color may be generated by using the at least some or a number of the pixels PXL.

The pixel PXL may include at least one light source driven by a predetermined control signal (for example, a scan signal and a data signal) and/or a predetermined power source (for example, a first power source and a second power source). In an embodiment, the light source may include at least one light emitting element LD according to the embodiments of FIG. 1A to FIG. 1D, for example, at least one substantially rod-shaped light emitting element LD having a size as small as a nanoscale to a microscale. Various types of light emitting elements may be used as a light source of the pixel PXL. For example, in an embodiment, a light source for each pixel PXL may be formed by using a light emitting element having a core-shell structure.

The pixel PXL may have a structure according to at least one of embodiments to be described below. For example, each pixel PXL may have a structure to which one of embodiments to be described later is applied, or a structure to which at least two embodiments are applied in combination.

In an embodiment, the pixel PXL may be an active pixel, but is not limited thereto. For example, the pixel PXL may be a pixel of a passive or active light emitting display device of various structures and/or driving methods.

Figure 3A:
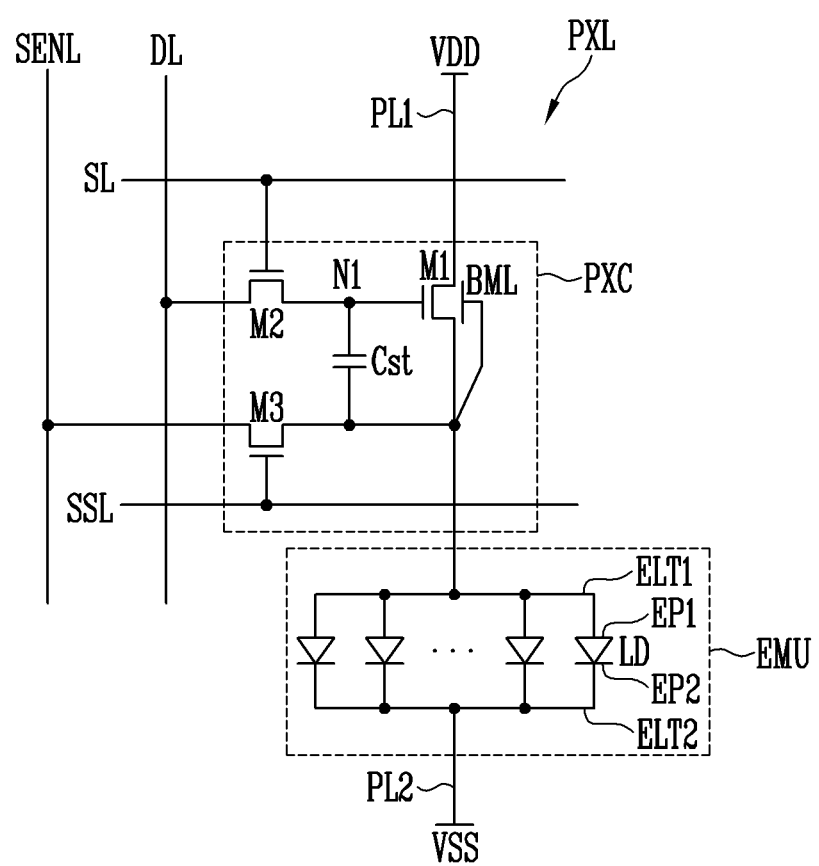
FIG. 3A to FIG. 3C respectively illustrate an equivalent circuit diagram of a pixel according to an embodiment.
Figure 3B:
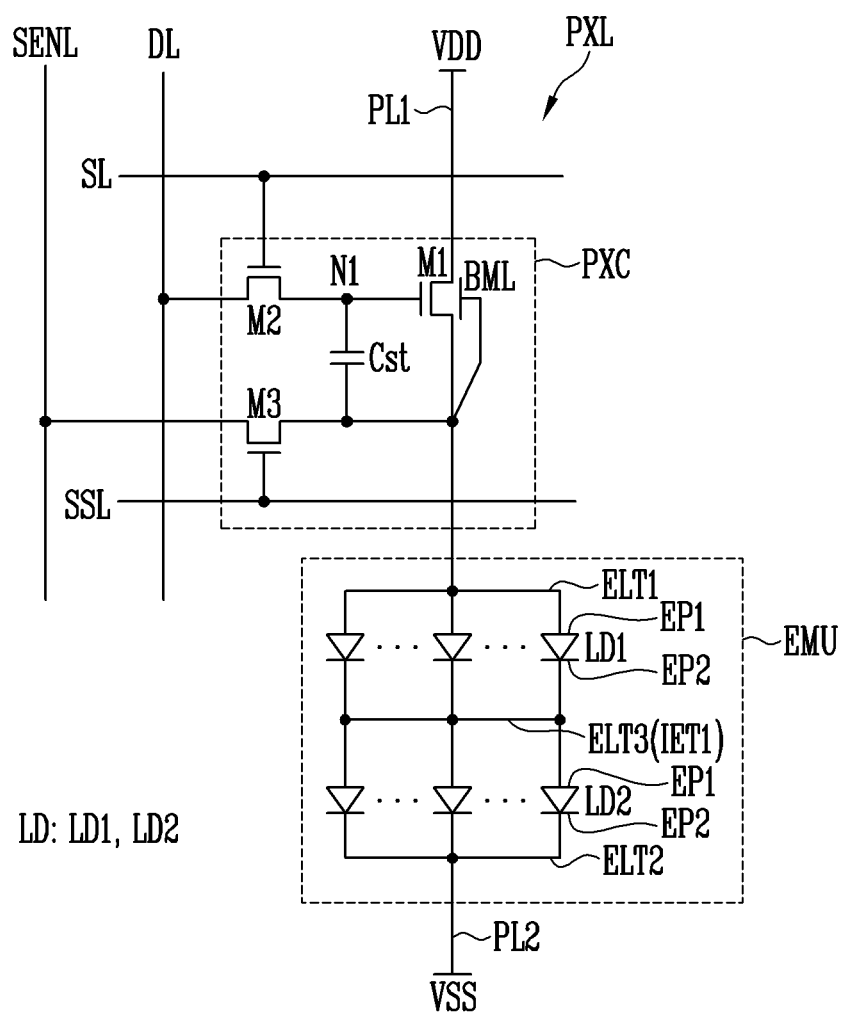
Figure 3C:
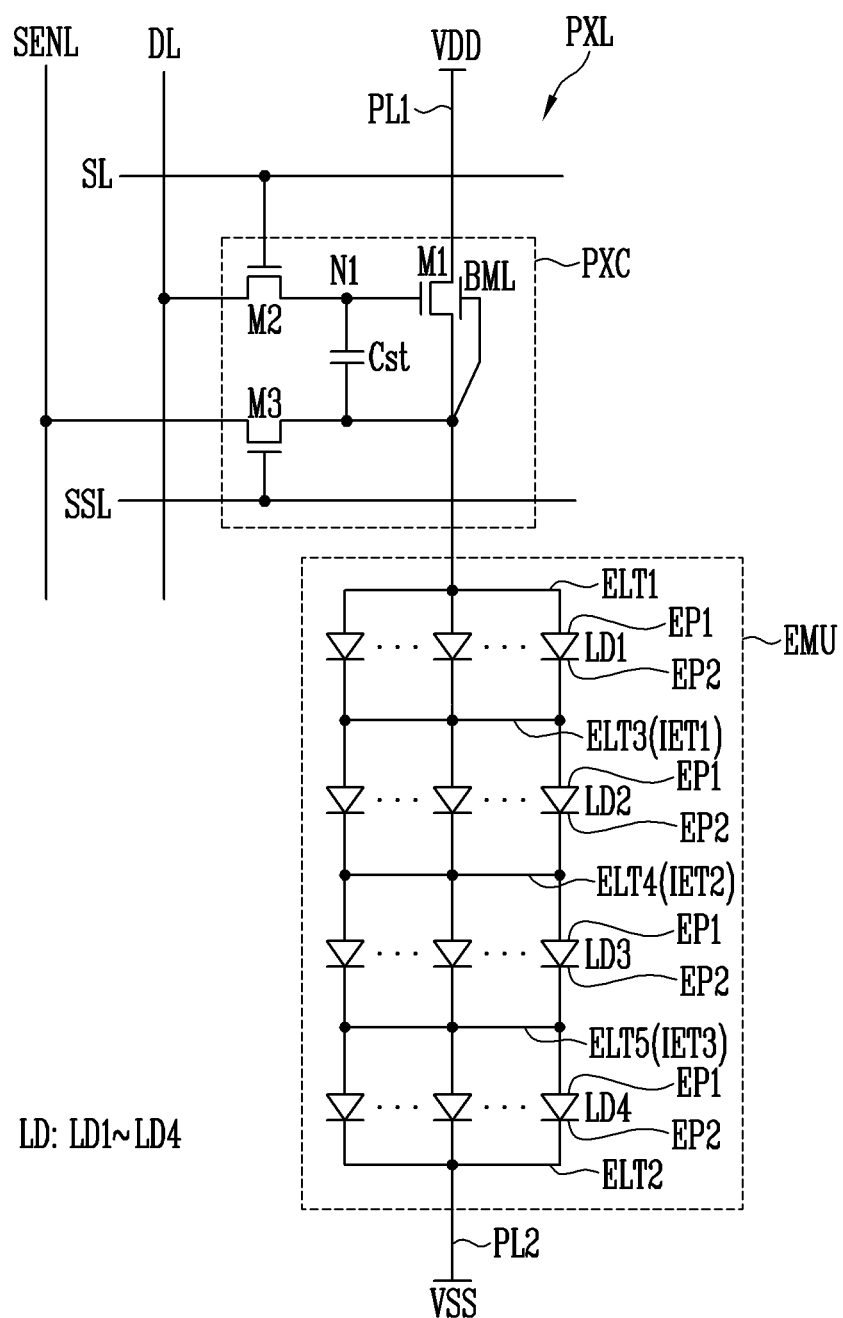

FIG. 3A to FIG. 3C respectively illustrate an equivalent circuit diagram of the pixel PXL according to an embodiment. For example, FIG. 3A to FIG. 3C illustrate embodiments of a pixel PXL that may be applied to an active display device, and illustrate different embodiments from each other with respect to a structure of a light emitting part EMU.

In an embodiment, each pixel PXL illustrated in FIG. 3A to FIG. 3C may be one of pixels PXL disposed in the display area DA of FIG. 2. In an embodiment, the pixels PXL disposed in the display area DA may have substantially the same or similar structure.

Referring to FIG. 3A to FIG. 3C, the pixel PXL may include the light emitting part EMU for generating light with luminance corresponding to a data signal. The pixel PXL may further include a pixel circuit PXC for driving the light emitting part EMU.

The pixel circuit PXC may be electrically connected between a first power source VDD and the light emitting part EMU. The pixel circuit PXC may be electrically connected to a scan line SL and a data line DL of the pixel PXL to control an operation of the light emitting part EMU in response to a scan signal and a data signal supplied from the scan line SL and the data line DL. The pixel circuit PXC may be further selectively electrically connected to a sensing signal line SSL and a sensing line SENL.

The pixel circuit PXC may include at least one transistor and a capacitor. For example, the pixel circuit PXC may include a first transistor M1, a second transistor M2, a third transistor M3, and a storage capacitor Cst.

The first transistor M1 may be electrically connected between the first power source VDD and the first pixel electrode ELT1. A gate electrode of the first transistor M1 may be electrically connected to a first node N1. The first transistor M1 controls a driving current supplied to the light emitting part EMU in response to a voltage of the first node N1. For example, the first transistor M1 may be a driving transistor that controls a driving current of the pixel PXL.

In an embodiment, the first transistor M1 may optionally include a bottom metal layer BML (also referred to as a "lower electrode", "back gate electrode", or "lower light blocking layer"). The gate electrode of the first transistor M1 and the bottom metal layer BML may overlap each other with an insulating layer interposed therebetween. In an embodiment, the bottom metal layer BML may be electrically connected to one electrode of the first transistor M1, for example a source or drain electrode thereof.

In an embodiment in which the first transistor M1 may include the bottom metal layer BML, by applying a back-biasing voltage to the bottom metal layer BML of the first transistor M1 in case that the pixel PXL is driven, a back-biasing technique (or a sync technique) of moving a threshold voltage of the first transistor M1 in a negative or positive direction may be applied. For example, by connecting the bottom metal layer BML to the source electrode of the first transistor M1 to apply a source-sync technique, the threshold voltage of the first transistor M1 may be moved in the negative or positive direction. In case that the bottom metal layer BML is disposed under or below a semiconductor pattern forming a channel of the first transistor M1, the bottom metal layer BML may serve as a light blocking pattern to stabilize an operating characteristic of the first transistor M1. However, the function and/or utilization method of the bottom metal layer BML is not limited thereto.

The second transistor M2 may be electrically connected between the data line DL and the first node N1. A gate electrode of the second transistor M2 may be electrically connected to the scan line SL. In case that a scan signal of a gate-on voltage (for example, a high level voltage) is supplied from the scan line SL, the second transistor M2 may be turned on to connect the data line DL and the first node N1.

For each frame period, a data signal of the corresponding frame is supplied to the data line DL, and the data signal is transmitted to the first node N1 through the turned-on second transistor M2 during a period in which the scan signal of the gate-on voltage is supplied. For example, the second transistor M2 may be a switching transistor for transmitting each data signal to the inside of the pixel PXL.

One electrode of the storage capacitor Cst may be electrically connected to the first node N1, and the other electrode thereof may be electrically connected to a second electrode of the first transistor M1. The storage capacitor Cst may be charged with a voltage corresponding to the data signal supplied to the first node N1 during each frame period.

The third transistor M3 may be electrically connected between the first pixel electrode ELT1 (or the second electrode of the first transistor M1) and the sensing line SENL. A gate electrode of the third transistor M3 may be electrically connected to the sensing signal line SSL. The third transistor M3 may transmit a voltage applied to the first pixel electrode ELT1 to the sensing line SENL according to a sensing signal supplied to the sensing signal line SSL. The voltage transmitted through the sensing line SENL may be provided to an external circuit (for example, a timing controller), and the external circuit may detect characteristic information (for example, a threshold voltage of the first transistor M1) of each pixel PXL based on the supplied voltage. The detected characteristic information may be used to convert image data so that a characteristic deviation between the pixels PXL is compensated.

In FIG. 3A to FIG. 3C, all of the transistors included in the pixel circuit PXC are illustrated as N-type transistors, but the disclosure is not limited thereto. For example, at least one of the first, second, and third transistors M1, M2, and M3 may be changed to a P-type transistor.

The structure and driving method of the pixel PXL may be variously changed. For example, the pixel circuit PXC may be a pixel circuit having various structures and/or driving methods in addition to those of the embodiments shown in FIG. 3A to FIG. 3C.

For example, the pixel circuit PXC may not include the third transistor M3. The pixel circuit PXC may further include other circuit elements such as a compensation transistor for compensating for a threshold voltage of the first transistor M1, an initialization transistor for initializing the voltage of the first node N1 and/or of the first pixel electrode ELT1, a light emission control transistor for controlling a period in which a driving current is supplied to the light emitting part EMU, and/or a boosting capacitor for boosting the voltage of the first node N1.

In an embodiment, in case that the pixel PXL is a pixel of a passive light emitting display device, the pixel circuit PXC may be omitted. The light emitting part EMU may be electrically connected or directly electrically connected to the scan line SL, the data line DL, a first power line PL1, a second power line PL2, and/or other signal line or power line.

The light emitting part EMU may include at least one light emitting element LD electrically connected between the first power source VDD and a second power source VSS, for example, light emitting elements LD.

For example, the light emitting part EMU may include the first pixel electrode ELT1 (also referred to as a "first electrode" or "first contact electrode") electrically connected to the first power VDD through the pixel circuit PXC and the first power line PL1, the second pixel electrode ELT2 (also referred to as a "second electrode" or "second contact electrode") electrically connected to the second power VSS through the second power line PL2, and light emitting elements LD electrically connected between the first and second pixel electrodes ELT1 and ELT2.

The first and second power sources VDD and VSS may have different potentials so that the light emitting elements LD may emit light. For example, the first power source VDD may be set as a high potential power source, and the second power source VSS may be set as a low potential power source.

In an embodiment, the light emitting part EMU may include light emitting elements LD that are electrically connected in parallel to each other in the same direction between the first pixel electrode ELT1 and the second pixel electrode ELT2 as in an embodiment of FIG. 3A. For example, each light emitting element LD may include a first end portion EP1 (for example, a P-type end portion thereof) electrically connected to the first power source VDD through the first pixel electrode ELT1 and/or the pixel circuit PXC, and a second end portion EP2 (for example, an N-type end portion thereof) electrically connected to the second power source VSS through the second pixel electrode ELT2. For example, the light emitting elements LD may be electrically connected in parallel in a forward direction between the first and second pixel electrodes ELT1 and ELT2.

Each light emitting element LD electrically connected in a forward direction between the first power source VDD and the second power source VSS may form each effective light source. The effective light sources may be combined to form the light emitting part EMU of the pixel PXL.

The first end portions EP1 of the light emitting elements LD may be commonly electrically connected to the pixel circuit PXC through one electrode (for example, first pixel electrode ELT1) of the light emitting part EMU, and may be electrically connected to the first power source VDD through the pixel circuit PXC and the first power line PL1. The second end portions EP2 of the light emitting elements LD may be commonly electrically connected to the second power source VSS through the other electrode (for example, second pixel electrode ELT2) of the light emitting part EMU and the second power line PL2.

FIG. 3A illustrates an embodiment in which the pixel PXL may include the light emitting part EMU having an in-parallel structure, but the disclosure is not limited thereto. For example, the pixel PXL may include a light emitting part EMU of a serial structure or a serial or in-parallel structure. For example, the light emitting part EMU may include light emitting elements LD that are divided and electrically connected to serial stages as in embodiments of FIG. 3B and FIG. 3C.

Referring to FIG. 3B, the light emitting part EMU may include a first serial stage including at least one first light emitting element LD1 and a second serial stage including at least one second light emitting element LD2.

The first serial stage may include the first pixel electrode ELT1, a third pixel electrode ELT3 (also referred to as a "third electrode" or "third contact electrode"), and at least one first light emitting element LD1 electrically connected between the first and third pixel electrode ELT1 and ELT3. Each first light emitting element LD1 may be electrically connected in a forward direction between the first and third pixel electrodes ELT1 and ELT3. For example, the first end portion EP1 of the first light emitting element LD1 may be electrically connected to the first pixel electrode ELT1, and the second end portion EP2 of the first light emitting element LD1 may be electrically connected to the third pixel electrode ELT3. The third pixel electrode ELT3 may form a first intermediate electrode IET1 connecting the first and second serial stages.

The second serial stage may include the third pixel electrode ELT3, the second pixel electrode ELT2, and at least one second light emitting element LD2 electrically connected between the second and third pixel electrodes ELT2 and ELT3. Each second light emitting element LD2 may be electrically connected in a forward direction between the second and third pixel electrodes ELT2 and ELT3. For example, the first end portion EP1 of the second light emitting element LD2 may be electrically connected to the third pixel electrode ELT3, and the second end portion EP2 of the second light emitting element LD2 may be electrically connected to the second pixel electrode ELT2.

The number of serial stages forming each light emitting part EMU may be variously changed according to embodiments. For example, the light emitting part EMU may include light emitting elements LD that are divided into four serial stages and electrically connected to each other, as in an embodiment of FIG. 3C.

Referring to FIG. 3C, the light emitting part EMU may include a first serial stage including at least one first light emitting element LD1, a second serial stage including at least one second light emitting element LD2, a third serial stage including at least one third light emitting element LD3, and a fourth serial stage including at least one fourth light emitting element LD4.

The first serial stage may include the first pixel electrode ELT1, the third pixel electrode ELT3, and at least one first light emitting element LD1 electrically connected between the first and third pixel electrodes ELT1 and ELT3. Each first light emitting element LD1 may be electrically connected in a forward direction between the first and third pixel electrodes ELT1 and ELT3. For example, the first end portion EP1 of the first light emitting element LD1 may be electrically connected to the first pixel electrode ELT1, and the second end portion EP2 of the first light emitting element LD1 may be electrically connected to the third pixel electrode ELT3.

The second serial stage may include the third pixel electrode ELT3, a fourth pixel electrode ELT4 (also referred to as a "fourth electrode" or "fourth contact electrode"), and at least one second light emitting element LD2 electrically connected between the third and fourth pixel electrode ELT3 and ELT4. Each second light emitting element LD2 may be electrically connected in a forward direction between the third and fourth pixel electrodes ELT3 and ELT4. For example, the first end portion EP1 of the second light emitting element LD2 may be electrically connected to the third pixel electrode ELT3, and the second end portion EP2 of the second light emitting element LD2 may be electrically connected to fourth pixel electrode ELT4.

The third serial stage may include the fourth pixel electrode ELT4, a fifth pixel electrode ELT5 (also referred to as a "fifth electrode" or "fifth contact electrode"), and at least one third light emitting element LD3 electrically connected between the fourth and fifth pixel electrode ELT4 and ELT5. Each third light emitting element LD3 may be electrically connected in a forward direction between the fourth and fifth pixel electrodes ELT4 and ELT5. For example, the first end portion EP1 of the third light emitting element LD3 may be electrically connected to the fourth pixel electrode ELT4, and the second end portion EP2 of the third light emitting element LD3 may be electrically connected to fifth pixel electrode ELT5.

The fourth serial stage may include the fifth pixel electrode ELT5, the second pixel electrode ELT2, and at least one fourth light emitting element LD4 electrically connected between the second and fifth pixel electrodes ELT2 and ELT5. Each fourth light emitting element LD4 may be electrically connected in a forward direction between the second and fifth pixel electrodes ELT2 and ELT5. For example, the first end portion EP1 of the fourth light emitting element LD4 may be electrically connected to the fifth pixel electrode ELT5, and the second end portion EP2 of the fourth light emitting element LD4 may be electrically connected to the second pixel electrode ELT2.

For example, in embodiments of FIG. 3A to FIG. 3C, the light emitting part EMU may include at least one serial stage. Each serial stage may include a pair of pixel electrodes (for example, two pixel electrodes) and at least one light emitting element LD electrically connected in a forward direction between the pair of pixel electrodes. Here, the number of serial stages forming the light emitting part EMU and the number of light emitting elements LD forming each serial stage are not particularly limited. For example, the number of the light emitting elements LD forming respective serial stages may be the same or different from each other, but the number of the light emitting elements LD is not particularly limited.

A first electrode of the light emitting part EMU, for example, the first pixel electrode ELT1 may be an anode electrode of the light emitting part EMU. A last electrode of the light emitting part EMU, for example, the second pixel electrode ELT2 may be a cathode electrode of the light emitting part EMU.

The remaining electrodes of the light emitting part EMU, for example, the third pixel electrode ELT3, the fourth pixel electrode ELT4, and/or the fifth pixel electrode ELT5 of FIG. 3B and FIG. 3C may form each intermediate electrode. For example, the third pixel electrode ELT3 may form the first intermediate electrode IET1, the fourth pixel electrode ELT4 may form the second intermediate electrode IET2, and the fifth pixel electrode ELT5 may form the third intermediate electrode IET3.

In case that the light emitting elements LD are electrically connected only in parallel as in an embodiment of FIG. 3A, the structure of the pixel PXL may be simplified. As in embodiments of FIG. 3B and FIG. 3C, in case that the light emitting elements LD are electrically connected in a serial or serial or parallel structure, power efficiency may be improved compared with an embodiment in which the same number of light emitting elements LD are electrically connected only in parallel (for example, an embodiment of FIG. 3A). In the pixel PXL in which the light emitting elements LD are electrically connected in a serial structure or in a serial or parallel structure, even if a short circuit defect occurs at some or a number of the serial stages, since a predetermined degree of luminance may be displayed through the light emitting elements LD in the remaining serial stages, the possibility of dark spot defects of the pixel PXL may be reduced.

FIG. 3A to FIG. 3C illustrate embodiments in which the light emitting elements LD are electrically connected in a parallel or serial or parallel structure, but the disclosure is not limited thereto. For example, in an embodiment, the light emitting part EMU may be formed by connecting the light emitting elements LD only in series.

Each of the light emitting elements LD may include at least one pixel electrode (for example, the first pixel electrode ELT1), the first end portion EP1 (for example, a P-type end portion) electrically connected to the first power source VDD via the pixel circuit PXC and/or the first power line PL1, and the second end portion EP2 (for example, an N-type end portion) electrically connected to the second power source VSS via at least one other pixel electrode (for example, the second pixel electrode ELT2) and the second power line PL2. For example, the light emitting elements LD may be electrically connected in a forward direction between the first power source VDD and the second power source VSS. The light emitting elements LD electrically connected to the forward direction may form the effective light sources of the light emitting part EMU.

In case that a driving current is supplied through the corresponding pixel circuit PXC, the light emitting elements LD may emit light with a luminance corresponding to the driving current. For example, during each frame period, the pixel circuit PXC may supply a driving current corresponding to a gray value to be displayed in the corresponding frame to the light emitting part EMU. Accordingly, while the light emitting elements LD emit light with a luminance corresponding to the driving current, the light emitting part EMU may display the luminance corresponding to the driving current.

In an embodiment, the light emitting part EMU may further include at least one ineffective light source in addition to the light emitting elements LD forming each effective light source. For example, in at least one serial stage, at least one ineffective light emitting element that is arranged or disposed in a reverse direction or of which at least one or an end portion floats may be further connected. The ineffective light emitting element maintains a deactivated state even in case that a driving voltage of a forward direction is applied between the pixel electrodes, thereby substantially maintaining a non-light emitting state.

Figure 4A:
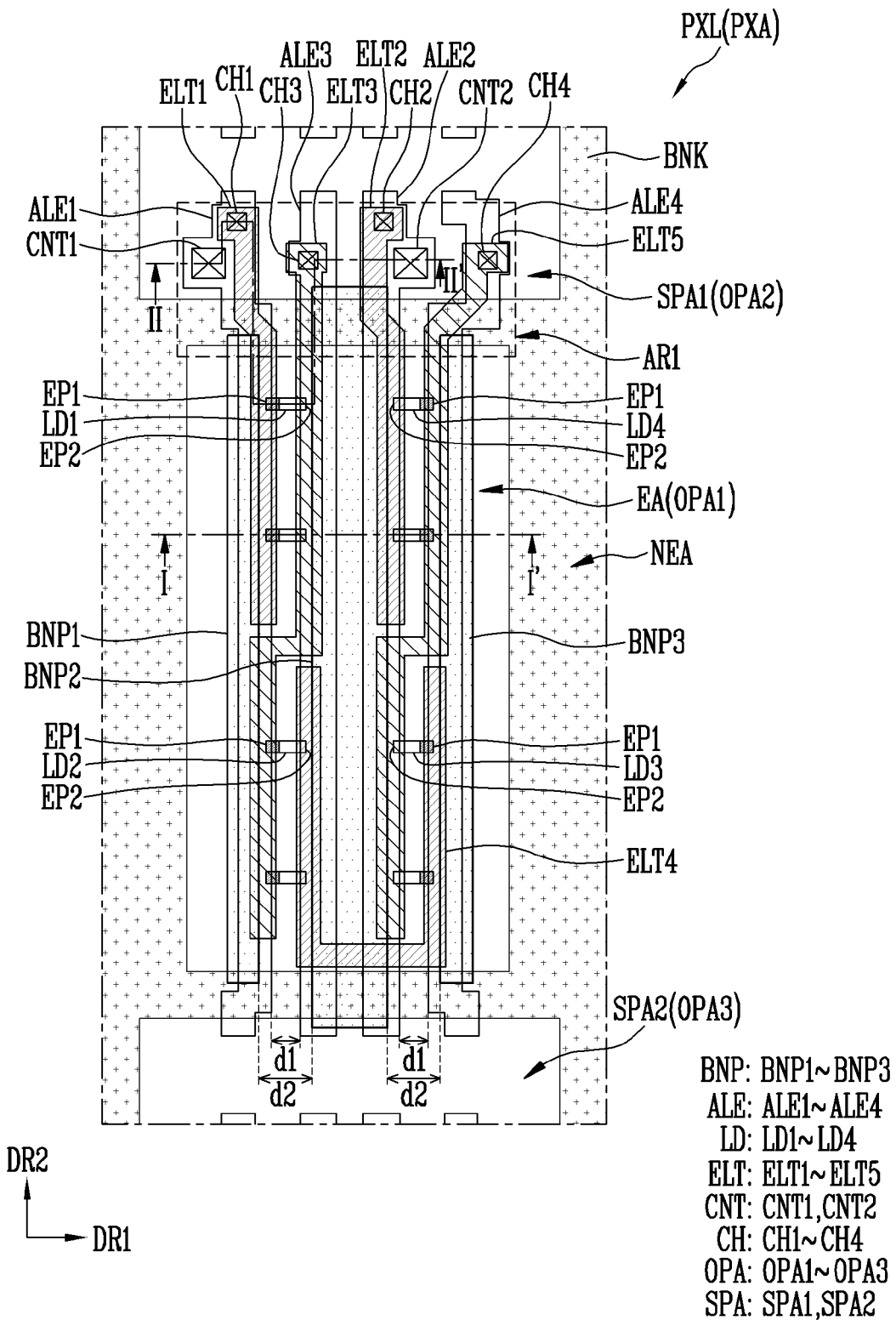
FIG. 4A and FIG. 4B respectively illustrate a top plan view of a pixel according to an embodiment.
Figure 4B:
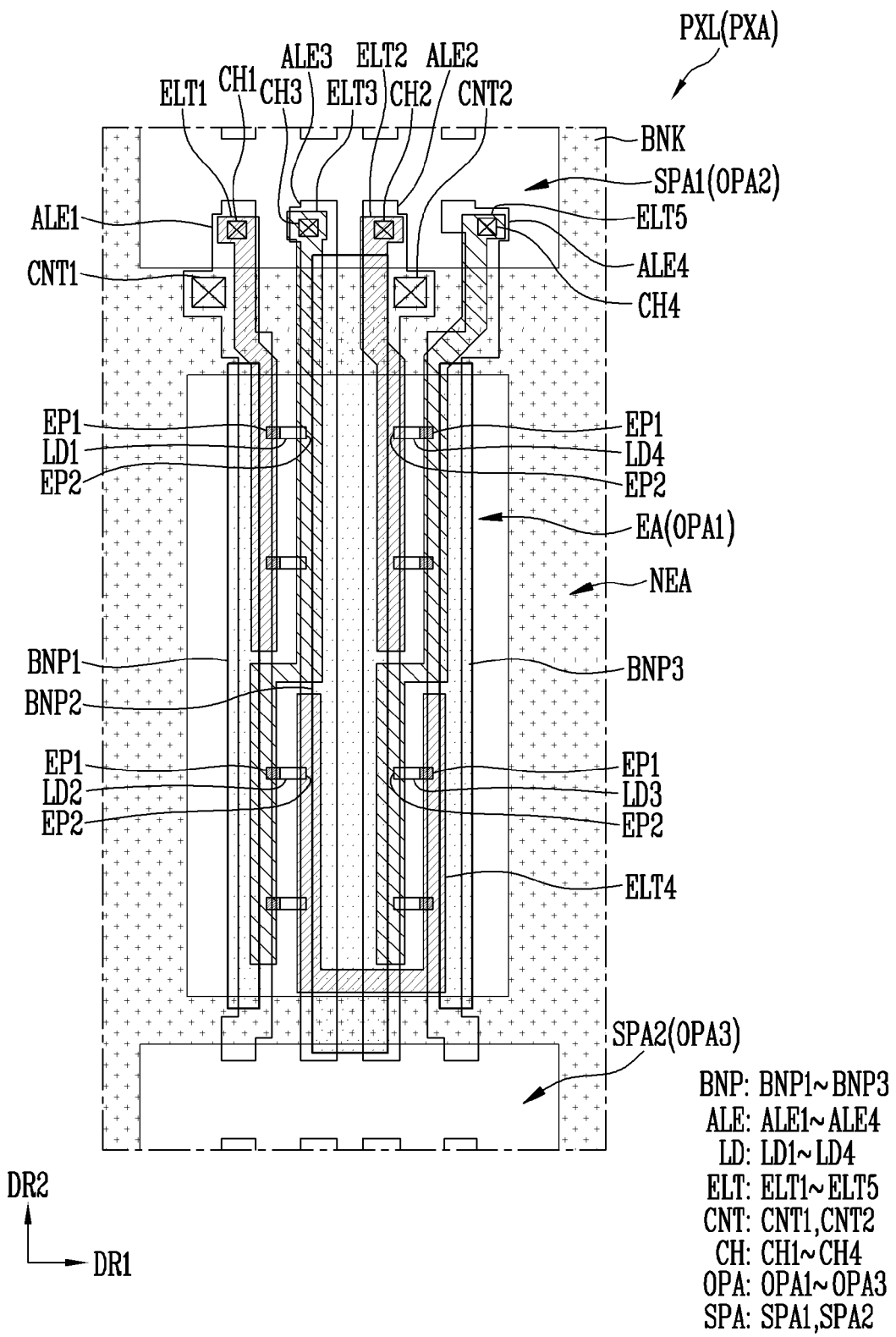

FIG. 4A and FIG. 4B respectively illustrate a top plan view of the pixel PXL according to an embodiment. For example, FIG. 4A and FIG. 4B illustrate a pixel area PXA of the pixel PXL based on the light emitting part EMU of the pixel PXL including four serial stages as in an embodiment of FIG. 3C. Compared with an embodiment of FIG. 4A, in an embodiment of FIG. 4B, first and second contact parts CNT1 and CNT2 are provided or disposed in a non-light emitting area NEA to overlap a bank BNK.

Referring to FIG. 2 to FIG. 4B, the pixel PXL may include a light emitting area EA, the non-light emitting area NEA, and a separating area SPA. For example, the pixel area PXA in which each pixel PXL is provided or disposed may include the light emitting area EA in which the light emitting elements LD are provided or disposed and/or aligned, the non-light emitting area NEA surrounding the light emitting area EA, and the separating area SPA spaced apart from the light emitting area EA with the non-light emitting area NEA therebetween. In an embodiment, the separating area SPA may include a first separating area SPA1 disposed at an upper end of the light emitting area EA, and a second separating area SPA2 disposed at a lower end of the light emitting area EA.

The light emitting area EA may be an area that may emit light by including the light emitting elements LD. The non-light emitting area NEA may be an area in which the bank BNK surrounding the light emitting area EA is provided or disposed. The separating area SPA may be an area of the remaining pixel areas PXA excluding the light emitting area EA, which may be disposed in an opening OPA of the bank BNK and in which at least one alignment electrode ALE may be disconnected.

The pixel PXL may include pixel electrodes ELT at least provided or disposed in the light emitting area EA, light emitting elements LD electrically connected between the pixel electrodes ELT, alignment electrodes ALE provided or disposed at positions corresponding to the pixel electrodes ELT, and patterns BNP provided or disposed under or below the alignment electrodes ALE to overlap at least one alignment electrode ALE, respectively. For example, the pixel PXL may include first to fifth pixel electrodes ELT1 to ELT5 provided or disposed in the light emitting area EA, first to fourth light emitting elements LD1 to LD4 electrically connected between the first to fifth pixel electrodes ELT1 to ELT5, first to fourth alignment electrodes ALE1 to ALE4 provided or disposed under or below the first to fifth pixel electrodes ELT1 to ELT5 to overlap at least one pixel electrode ELT, respectively, and first to third patterns BNP1 to BNP3 provided or disposed under or below the first to fourth alignment electrodes ALE1 to ALE4 to partially overlap at least one alignment electrode ALE, respectively. Each pixel PXL may include at least a pair of pixel electrodes ELT, at least a pair of alignment electrodes ALE, and/or at least a pair of patterns BNP, and the number, shape, size, and arrangement structure of each of the pixel electrodes ELT, the alignment electrodes ALE, and/or the patterns BNP may be variously changed according to the structure of the pixel PXL (for example, the light emitting part EMU).

In an embodiment, the patterns BNP, the alignment electrodes ALE, the light emitting elements LD, and the pixel electrodes ELT may be sequentially provided based on one or a surface of the base layer BSL on which the pixel PXL may be formed. In an embodiment, the alignment electrodes ALE, the patterns BNP, the light emitting elements LD, and the pixel electrodes ELT may be sequentially provided based on one or a surface of the base layer BSL on which the pixel PXL may be formed. The position and formation order of the electrode patterns and/or the insulating patterns forming the pixel PXL may be variously changed according to embodiments. A detailed description of the cross-sectional structure of the pixel PXL will be described later.

The patterns BNP may be at least provided or disposed in the light emitting area EA, may be spaced apart from each other along the first direction DR1 in the light emitting area EA, and may respectively extend along the second direction DR2. In an embodiment, the first direction DR1 may be a horizontal direction or row direction, and the second direction DR2 may be a vertical direction or column direction, but the disclosure is not limited thereto.

Each pattern BNP (also referred to as a "wall pattern" or "protruding pattern") may have a uniform or substantially uniform width in the light emitting area EA. For example, each of the first, second, and third patterns BNP1, BNP2, and BNP3 may have a substantially linear pattern shape having a constant or substantially constant width in the light emitting area EA when viewed in a plan view.

The patterns BNP may have the same width or similar widths or different widths. For example, the first and third patterns BNP1 and BNP3 may at least have the same width in the light emitting area EA, and may face each other with the second pattern BNP2 interposed therebetween. For example, the first and third patterns BNP1 and BNP3 may be formed to be symmetrical to each other around the second pattern BNP2 in the light emitting area EA.

The patterns BNP may be arranged or disposed at constant intervals in the light emitting area EA. For example, the first, second, and third patterns BNP1, BNP2, and BNP3 may be sequentially arranged or disposed at constant intervals by a second distance d2 along the first direction DR1 in the light emitting area EA.

Each pattern BNP may at least partially overlap at least one alignment electrode ALE in the light emitting area EA. For example, the first pattern BNP1 may be provided or disposed under or below the first alignment electrode ALE1 to overlap one or an area of the first alignment electrode ALE1, the second pattern BNP2 may be provided or disposed under or below the second and third alignment electrodes ALE2 and ALE3 to overlap one area or an area of each of the second and third alignment electrodes ALE2 and ALE3, and the third pattern BNP3 may be provided or disposed under or below the fourth alignment electrode ALE4 to overlap one area or an area of the fourth alignment electrode ALE4.

As the patterns BNP are provided or disposed under or below one area or an area of each of the alignment electrodes ALE, one area or an area of each of the alignment electrodes ALE may protrude in an upper direction of the pixel PXL in the areas in which the patterns BNP are formed or disposed. Accordingly, a wall structure may be formed around the light emitting elements LD. For example, a wall structure may be formed in the light emitting area EA to face the first and second end portions EP1 and EP2 of the light emitting elements LD.

In an embodiment, in case that the patterns BNP and/or alignment electrodes ALE include a reflective material, a reflective wall structure may be formed around the light emitting elements LD. Accordingly, as light emitted from the light emitting elements LD is further directed in an upper direction (for example, a front direction of the display panel DP including a predetermined viewing angle range) of the pixel PXL, light efficiency of the pixel PXL may be improved.

In an embodiment, at least one pattern BNP may extend from the light emitting area EA through the non-light emitting area NEA to the separating area SPA. The at least one pattern BNP may overlap an edge area (for example, an upper edge area) of the bank BNK so that one or an area thereof is disposed in one or an area between a pair of pixel electrodes ELT at a boundary between the non-light emitting area NEA and the separating area SPA. Similarly, the at least one pattern BNP may overlap an edge area (for example, a lower edge area) of the bank BNK so that the other area thereof is disposed between the pair of pixel electrodes ELT at a boundary between the non-light emitting area NEA and the light emitting area EA. Here, the pair of pixel electrodes ELT may be pixel electrodes ELT formed or disposed on the same layer or on a same layer in the same process, and/or pixel electrodes ELT adjacent to each other.

For example, the second pattern BNP2 may extend from the light emitting area EA to the first separating area SPA1. One or an area of the second pattern BNP2, when viewed in a plan view, may overlap the edge area of the bank BNK while being positioned between the first and second pixel electrodes ELT1 and ELT2, between the third and fourth pixel electrodes ELT3 and ELT4, and/or between the second and third pixel electrodes ELT2 and ELT3.

The second pattern BNP2 may also extend to the second separating area SPA2. For example, the second pattern BNP2 may have a shape that is substantially vertically symmetrical around the light emitting area EA. However, the disclosure is not limited thereto. For example, in an embodiment, the second pattern BNP2 may not extend to the second separating area SPA2, but may be cut off or removed in the non-light emitting area NEA between the light emitting area EA and the second separating area SPA2.

The alignment electrodes ALE may be at least provided or disposed in the light emitting area EA, may be spaced apart from each other along the first direction DR1 in the light emitting area EA, and may respectively extend along the second direction DR2. The alignment electrodes ALE may extend from the light emitting area EA through the non-light emitting area NEA to the separating area SPA, and may be cut off or removed in the separating area SPA. For example, each of the first to fourth alignment electrodes ALE1 to ALE4 extends from the light emitting area EA to the first and second separating areas SPA1 and SPA2, and is cut off or removed in the first and second separating areas SPA1 and SPA2, so that it may be separated from the alignment electrodes ALE of the adjacent pixel PXL. In an embodiment, at least one of the alignment electrodes ALE, for example, the second alignment electrode ALE2, may be integrally connected to the second alignment electrode ALE2 of the adjacent pixel PXL without being cut off or removed in the separating area SPA.

One and the other of the alignment electrodes ALE may be electrically connected to the pixel circuit PXC and/or a predetermined power line through each contact part CNT. For example, the first alignment electrode ALE1 may be electrically connected to the pixel circuit PXC and/or the first power line PL1 through the first contact part CNT1, and the second alignment electrode ALE2 may be electrically connected to the second power line PL2 through the second contact part CNT2.

In an embodiment, each contact part CNT may be formed in the separating area SPA, but is not limited thereto. For example, the first and/or second contact parts CNT1 and CNT2 may be formed in the separating area SPA (for example, first separating area SPA1) as shown in FIG. 4A, or in the non-light emitting area NEA as shown in FIG. 4B.

In an embodiment, each alignment electrode ALE may be electrically connected to one pixel electrode ELT through each contact hole CH. The alignment electrodes ALE may be electrically connected to different pixel electrodes ELT. For example, the first alignment electrode ALE1 may be electrically connected to the first pixel electrode ELT1 through a first contact hole CH1, and the second alignment electrode ALE2 may be electrically connected to the second pixel electrode ELT2 through a second contact hole CH2. The third alignment electrode ALE3 may be electrically connected to the third pixel electrode ELT3 through a third contact hole CH3, and the fourth alignment electrode ALE4 may be electrically connected to the fifth pixel electrode ELT5 through a fourth contact hole CH4.

In an embodiment, the contact holes CH for connecting the alignment electrodes ALE to respective pixel electrodes ELT may be provided or disposed in the separating area SPA. For example, the contact holes CH may be formed in at least one insulating film (for example, the first insulating film INS1 of FIG. 5A to FIG. 5E and FIG. 6) covering or overlapping the alignment electrodes ALE, and may not be formed in the light emitting area EA, but may be formed in the separating area SPA. The alignment electrodes ALE may be completely covered or overlapped by the insulating film in the light emitting area EA and may be exposed by the contact holes CH formed in the insulating film in the separating area SPA to be electrically connected to respective pixel electrodes ELT through the contact holes CH.

Each alignment electrode ALE may be disposed on one pattern BNP. For example, the first alignment electrode ALE1 may be disposed in one or an area of the first pattern BNP1, the second and third alignment electrodes ALE2 and ALE3 may be disposed in different areas of the second pattern BNP2, and the fourth alignment electrode ALE4 may be disposed in one or an area of the third pattern BNP3. In an embodiment, in case that the third alignment electrode ALE3 is disposed between the first and second alignment electrodes ALE1 and ALE2, the third alignment electrode ALE3 may be disposed at a left area of the second pattern BNP2, and the second alignment electrode ALE2 may be disposed at a right area of the second pattern BNP2.

Each alignment electrode ALE may have a uniform or substantially uniform width in the light emitting area EA. For example, each of the first, second, third, and fourth alignment electrodes ALE1, ALE2, ALE3, and ALE4 may have a substantially linear pattern shape having a constant or substantially constant width in the light emitting area EA when viewed in a plan view. The alignment electrodes ALE may have the same width or similar width or different widths.

Each alignment electrode ALE may be continuously formed along the second direction DR2 in the light emitting area EA. For example, each alignment electrode ALE may extend along the second direction DR2 to not be cut off or removed in the light emitting area EA.

A pair of alignment electrodes ALE adjacent to each other may receive different signals in an alignment step of the light emitting elements LD, and may be spaced apart from each other at uniform intervals in the light emitting area EA. In case that at least two pairs of alignment electrodes ALE are provided or disposed in the light emitting area EA, respective pairs of alignment electrodes ALE may be spaced apart from each other at the same interval.

For example, in case that the first alignment electrode ALE1, the third alignment electrode ALE3, the second alignment electrode ALE2, and the fourth alignment electrode ALE4 are sequentially arranged or disposed along the first direction DR1 in the light emitting area EA, the first and third alignment electrodes ALE1 and ALE3 form a pair to receive different alignment signals, and the second and fourth alignment electrodes ALE2 and ALE4 form a pair to receive different alignment signals. In the light emitting area EA, the first and third alignment electrodes ALE1 and ALE3 may be spaced apart from each other by a first distance d1 along the first direction DR1, and the second and fourth alignment electrodes ALE2 and ALE4 may also be spaced apart from each other by the first distance d1 along the first direction DR1.

In an embodiment, the second and third alignment electrodes ALE2 and ALE3 may receive the same signal in the alignment step of the light emitting elements LD. The second and third alignment electrodes ALE2 and ALE3 may be spaced apart from each other at a distance equal to or different from the first distance d1. The second and third alignment electrodes ALE2 and ALE3 may be integrally or non-integrally connected to each other in the alignment step of the light emitting elements LD.

Each alignment electrode ALE may or may not have a curved or a substantially curved portion in the non-light emitting area NEA, but the shape and/or size thereof are not particularly limited in the remaining area excluding the light emitting area EA. For example, in the non-light emitting area NEA and/or the separating area SPA, the shape and/or size of the alignment electrodes ALE may be variously changed.

The light emitting elements LD may be each aligned between a pair of patterns BNP, and may be each electrically connected between a pair of pixel electrodes ELT.

For example, each of the first light emitting elements LD1 may be aligned between the first and second patterns BNP1 and BNP2 to be electrically connected between the first and third pixel electrodes ELT1 and ELT3, and each of the second light emitting elements LD2 may be aligned between the first and second patterns BNP1 and BNP2 to be electrically connected between the third and fourth pixel electrodes ELT3 and ELT4. For example, each of the first light emitting elements LD1 may be arranged or disposed in an upper area of an area between the first and second patterns BNP1 and BNP2, and the first end portion EP1 and the second end portion EP2 of the first light emitting element LD1 may be electrically connected to the first pixel electrode ELT1 and the third pixel electrode ELT3, respectively. Each of the second light emitting elements LD2 may be arranged or disposed in a lower area of an area between the first and second patterns BNP1 and BNP2, and the first end portion EP1 and the second end portion EP2 of the second light emitting element LD2 may be electrically connected to the third pixel electrode ELT3 and the fourth pixel electrode ELT4, respectively.

Similarly, each of the third light emitting elements LD3 may be aligned between the second and third patterns BNP2 and BNP3 to be electrically connected between the fourth and fifth pixel electrodes ELT4 and ELT5, and each of the fourth light emitting elements LD4 may be aligned between the second and third patterns BNP2 and BNP3 to be electrically connected between the second and fifth pixel electrodes ELT2 and ELT5. For example, each of the third light emitting elements LD3 may be arranged or disposed in a lower area of an area between the second and third patterns BNP2 and BNP3, and the first end portion EP1 and the second end portion EP2 of the third light emitting element LD3 may be electrically connected to the fourth pixel electrode ELT4 and the fifth pixel electrode ELT5, respectively. Each of the fourth light emitting elements LD4 may be arranged or disposed in an upper area of an area between the second and third patterns BNP2 and BNP3, and the first end portion EP1 and the second end portion EP2 of the fourth light emitting element LD4 may be electrically connected to the fifth pixel electrode ELT5 and the second pixel electrode ELT2, respectively.

For example, first light emitting elements LD1 may be disposed in an upper left area of the light emitting area EA, and the second light emitting elements LD2 may be disposed in a lower left area of the light emitting area EA. The third light emitting elements LD3 may be disposed in a lower right area of the light emitting area EA, and the fourth light emitting elements LD4 may be disposed in an upper right area of the light emitting area EA. However, the arrangement and/or connection structure of the light emitting elements LD may be variously changed depending on the structure of the light emitting part EMU and/or the number of serial stages.

The pixel electrodes ELT may be at least provided or disposed in the light emitting area EA, and may be provided or disposed at positions corresponding to at least one alignment electrode ALE and at least one light emitting element LD, respectively. For example, each pixel electrode ELT may be formed on the alignment electrode(s) ALE and the light emitting element(s) LD to overlap respective alignment electrode(s) ALE and respective light emitting element(s) LD, so that it may be at least electrically connected to the light emitting element(s) LD. For example, each pixel electrode ELT may be electrically connected to one or an end portion of at least one light emitting element LD in the light emitting area EA.

The first pixel electrode ELT1 may be formed or disposed on the first area (for example, the upper area) of the first alignment electrode ALE1 and the first end portions EP1 of the first light emitting elements LD1 to be electrically connected to the first end portions EP1 of the first light emitting elements LD1. For example, the first pixel electrode ELT1 may be electrically connected to the first end portions EP1 of the first light emitting elements LD1 in the light emitting area EA.

The second pixel electrode ELT2 may be formed or disposed on the first area (for example, the upper area) of the second alignment electrode ALE2 and the second end portions EP2 of the fourth light emitting elements LD4 to be electrically connected to the second end portions EP2 of the fourth light emitting elements LD4. For example, the second pixel electrode ELT2 may be electrically connected to the second end portions EP2 of the fourth light emitting elements LD4 in the light emitting area EA.

The second pixel electrode ELT2 may be electrically connected to the first, second, and third light emitting elements LD1, LD2, and LD3 via at least one other pixel electrode ELT and/or light emitting element LD. For example, the second pixel electrode ELT2 may be electrically connected to the second end portions EP2 of the first light emitting elements LD1 via the third pixel electrode ELT3, the second light emitting element LD2, the fourth pixel electrode ELT4, the third light emitting element LD3, the fifth pixel electrode ELT5, and the fourth light emitting element LD4.

The third pixel electrode ELT3 may be formed or disposed on the first area (for example, the upper area) of the third alignment electrode ALE3 and the second end portions EP2 of the first light emitting elements LD1 to be electrically connected to the second end portions EP2 of the first light emitting elements LD1. The third pixel electrode ELT3 may be formed or disposed on the second area (for example, the lower area) of the first alignment electrode ALE1 and the first end portions EP1 of the second light emitting elements LD2 to be electrically connected to the first end portions EP1 of the second light emitting elements LD2. For example, the third pixel electrode ELT3 may be electrically connected to the second end portions EP2 of the first light emitting elements LD1 and the first end portions EP1 of the second light emitting elements LD2 in the light emitting area EA.

For example, the third pixel electrode ELT3 may have a substantially curved or curved shape. For example, the third pixel electrode ELT3 may have a curved or substantially curved or bent substantially bent structure at a boundary between an area in which at least one first light emitting element LD1 may be arranged or disposed and an area in which at least one second light emitting element LD2 may be arranged or disposed.

The third pixel electrode ELT3 may be disposed between the first and second pixel electrodes ELT1 and ELT2, and may be electrically connected between the first and second pixel electrodes ELT1 and ELT2 through the light emitting elements LD. For example, the third pixel electrode ELT3 may be electrically connected to the first pixel electrode ELT1 through at least one first light emitting element LD1, and may be electrically connected to the second pixel electrode ELT2 through at least one of the second, third, and/or fourth light emitting elements LD2, LD3, and/or LD4.

The fourth pixel electrode ELT4 may be formed or disposed on the second area (for example, the lower area) of the third alignment electrode ALE3 and the second end portions EP2 of the second light emitting elements LD2 to be electrically connected to the second end portions EP2 of the second light emitting elements LD2. The fourth pixel electrode ELT4 may be formed or disposed on the first area (for example, the lower area) of the fourth alignment electrode ALE4 and the first end portions EP1 of the third light emitting elements LD3 to be electrically connected to the first end portions EP1 of the third light emitting elements LD3. For example, the fourth pixel electrode ELT4 may be electrically connected to the second end portions EP2 of the second light emitting elements LD2 and the first end portions EP1 of the third light emitting elements LD3 in the light emitting area EA.

For example, the fourth pixel electrode ELT4 may have a substantially curved or curved shape. For example, the fourth pixel electrode ELT4 may have a curved or substantially curved or bent substantially bent structure at or around a boundary between an area in which at least one second light emitting element LD2 may be arranged or disposed and an area in which at least one third light emitting element LD3 may be arranged or disposed. In an embodiment, the fourth pixel electrode ELT4 may not extend to the separating area SPA and may be formed inside of or only inside of the light emitting area EA, but is not limited thereto.

The fourth pixel electrode ELT4 may be electrically connected between the first and second pixel electrodes ELT1 and ELT2 through the light emitting elements LD. For example, the fourth pixel electrode ELT4 may be electrically connected to the first pixel electrode ELT1 through at least one of the first and second light emitting elements LD1 and LD2, and may be electrically connected to the second pixel electrode ELT2 through at least one of the third and/or fourth light emitting elements LD3 and/or LD4.

The fifth pixel electrode ELT5 may be formed or disposed on the second area (for example, the lower area) of the second alignment electrode ALE2 and the second end portions EP2 of the third light emitting elements LD3 to be electrically connected to the second end portions EP2 of the third light emitting elements LD3. The fifth pixel electrode ELT5 may be formed or disposed on the second area (for example, the upper area) of the fourth alignment electrode ALE4 and the first end portions EP1 of the fourth light emitting elements LD4 to be electrically connected to the first end portions EP1 of the fourth light emitting elements LD4. For example, the fifth pixel electrode ELT5 may be electrically connected to the second end portions EP2 of the third light emitting elements LD3 and the first end portions EP1 of the fourth light emitting elements LD4 in the light emitting area EA.

For example, the fifth pixel electrode ELT5 may have a substantially curved or curved shape. For example, the fifth pixel electrode ELT5 may have a curved or substantially curved or bent or substantially bent structure at a boundary between an area in which at least one third light emitting element LD3 may be arranged or disposed and an area in which at least one fourth light emitting element LD4 may be arranged or disposed.

The fifth pixel electrode ELT5 may be electrically connected between the first and second pixel electrodes ELT1 and ELT2 through the light emitting elements LD. For example, the fifth pixel electrode ELT5 may be electrically connected to the first pixel electrode ELT1 through at least one of the first, second, and/or third light emitting elements LD1, LD2, and LD3, and may be electrically connected to the second pixel electrode ELT2 through at least one fourth light emitting element LD4.

In an embodiment, at least one pixel electrode ELT may extend from the light emitting area EA through the non-light emitting area NEA to the separating area SPA, and may be electrically connected to each of the alignment electrodes ALE through each of the contact holes CH in the separating area SPA. For example, the first, second, third, and fifth pixel electrodes ELT1, ELT2, ELT3, and ELT5 may extend from the light emitting area EA to the first separating area SPA1. In the first separating area SPA1, the first pixel electrode ELT1 may be electrically connected to the first alignment electrode ALE1 through the first contact hole CH1, and the second pixel electrode ELT2 may be electrically connected to the second alignment electrode ALE2 through the second contact hole CH2. In the first separating area SPA1, the third pixel electrode ELT3 may be electrically connected to the third alignment electrode ALE3 through the third contact hole CH3, and the fifth pixel electrode ELT5 may be electrically connected to the fourth alignment electrode ALE4 through the fourth contact hole CH4.

FIG. 4A and FIG. 4B illustrate that the first, second, third, and fifth pixel electrodes ELT1, ELT2, ELT3, and ELT5 all extend to the first separating area SPA1, but the disclosure is not limited thereto. For example, in an embodiment, at least one of the first, second, third, and fifth pixel electrodes ELT1, ELT2, ELT3, and ELT5 may extend to the first separating area SPA1 to be electrically connected to each alignment electrode ALE in the first separating area SPA1, and the remaining electrodes of the first, second, third, and fifth pixel electrodes ELT1, ELT2, ELT3, and ELT5 may extend to the second separating area SPA2 to be electrically connected to each alignment electrode ALE in the second separating area SPA2.

According to the above-described manner, the light emitting elements LD arranged or disposed between the alignment electrodes ALE and/or the patterns BNP corresponding thereto may be electrically connected in a desired shape by using the pixel electrodes ELT. For example, the first light emitting elements LD1, the second light emitting elements LD2, the third light emitting elements LD3, and the fourth light emitting elements LD4 may be sequentially electrically connected in series by using the pixel electrodes ELT.

In order to increase a utilization rate of the light emitting elements LD supplied to each light emitting area EA, by adjusting alignment signals for aligning the light emitting elements LD or by forming a magnetic field, the light emitting elements LD may be aligned so that a larger number (or ratio) of the light emitting elements LD in each light emitting area EA may be aligned in a specific or given direction. It is possible to connect the light emitting elements LD according to an alignment direction of a larger number of light emitting elements LD by using the pixel electrodes ELT. Accordingly, it is possible to improve the utilization rate of light emitting elements LD and improve the light efficiency of the pixel PXL.

In an embodiment, each pixel electrode ELT may be formed or directly formed on the first or second end portions EP1 or EP2 of the adjacent light emitting elements LD, thereby being electrically connected to the first or second end portions EP1 and EP2 of the light emitting elements LD.

The pixel electrodes ELT and the alignment electrodes ALE may be electrically connected to each other through respective contact holes CH in the outside (for example, the separating area SPA) of the light emitting area EA. The contact holes CH may be formed in an area excluding the light emitting area EA in which the light emitting elements LD are supplied and aligned, so that in the alignment step of the light emitting elements LD, a more uniform electric field may be formed in the light emitting area EA, and deviation of the light emitting elements LD may be prevented.

The bank BNK may be provided or disposed in the non-light emitting area NEA to surround the light emitting area EA and the separating area SPA. The bank BNK may be provided or disposed at an outer portion of each pixel area PXA and/or between adjacent pixel areas (PXA) to include openings OPA corresponding to the light emitting areas EA and the separating areas SPA of the pixels PXL. For example, in each pixel area PXA, the bank BNK may include a first opening OPA1 corresponding to the light emitting area EA, a second opening OPA2 corresponding to the first separating area SPA1, and a third opening OPA3 corresponding to the second separating area SPA2.

The bank BNK may form a dam structure that defines each light emitting area EA in which the light emitting elements LD should or may be supplied in the step of supplying the light emitting elements LD to each pixel PXL. For example, each light emitting area EMA may be partitioned by the second bank BNK2, so that a desired type and/or amount of light emitting element ink may be supplied into the light emitting area EMA.

The bank BNK may include at least one of a light blocking material and/or a light reflective material, thereby preventing light leakage between adjacent pixels PXL. For example, the bank BNK may include at least one of a black matrix material and/or a color filter material. For example, the bank BNK may be formed in a black opaque pattern that may block transmission of light. In an embodiment, a reflective film (not shown) may be formed on a surface (for example, a side wall) of the bank BNK to increase the light efficiency of each pixel PXL.

The bank BNK may be formed in a layer different from the patterns BNP through a process separate from the process of forming the patterns BNP. As an example, the bank BNK may be formed on an upper portion of an insulating film (for example, a first insulating film INS1 of FIG. 5A and FIG. 5B) provided or disposed on the patterns BNP and the alignment electrodes ALE.

The bank BNK may be provided or disposed in the same layer or a same layer as or a different layer from the patterns BNP, and may be formed simultaneously or sequentially with the patterns BNP. In case that the bank BNK and the patterns BNP are sequentially formed, the orders of position and/or of formation of the bank BNK and the patterns BNP are not particularly limited. The bank BNK and the patterns BNP may be integral with each other, or may be separately formed from the patterns BNP.

In an embodiment, the patterns BNP may be first formed on one or a surface of the base layer BSL. The alignment electrodes ALE and the bank BNK may be sequentially formed on one or a surface of the base layer BSL on which the patterns BNP may be formed.

In an embodiment, the alignment electrodes ALE may be first formed on one or a surface of the base layer BSL. The patterns BNP and the bank BNK may be simultaneously or sequentially formed on one or a surface of the base layer BSL on which the alignment electrodes ALE may be formed.

In an embodiment, the patterns BNP and the bank BNK may be first formed on one or a surface of the base layer BSL. The alignment electrodes ALE may be formed on one or a surface of the base layer BSL on which the patterns BNP and the bank BNK may be formed.

In case that the patterns BNP and the bank BNK are simultaneously formed, the patterns BNP and the bank BNK may be formed to be connected to or not connected to each other. For example, the patterns BNP and the bank BNK may be integral with each other so that their lower surfaces and the like are connected to each other. As an example, even if the patterns BNP and the bank BNK are simultaneously formed, the patterns BNP and the bank BNK may be formed to not be connected to each other. For example, the patterns BNP and the bank BNK are simultaneously formed on the same layer, but they may respectively have an independent pattern and may be separated from each other.

According to embodiments of FIG. 4A and FIG. 4B, in the process of supplying the light emitting elements LD to the light emitting area EA to align them, it is possible to form a uniform electric field in the light emitting area EA, and it is possible to minimize the deviation of the light emitting elements LD from the aligned positions. Even if at least a pair of pixel electrodes ELT extend through a boundary of the bank BNK to the separating area SPA, it is possible to prevent residues of the conductive film from remaining along a circumference of the bank BNK in the patterning process of the pixel electrodes ELT. Accordingly, short circuit defects between the pixel electrodes ELT may be prevented. This will be described in detail later.

Figure 10:
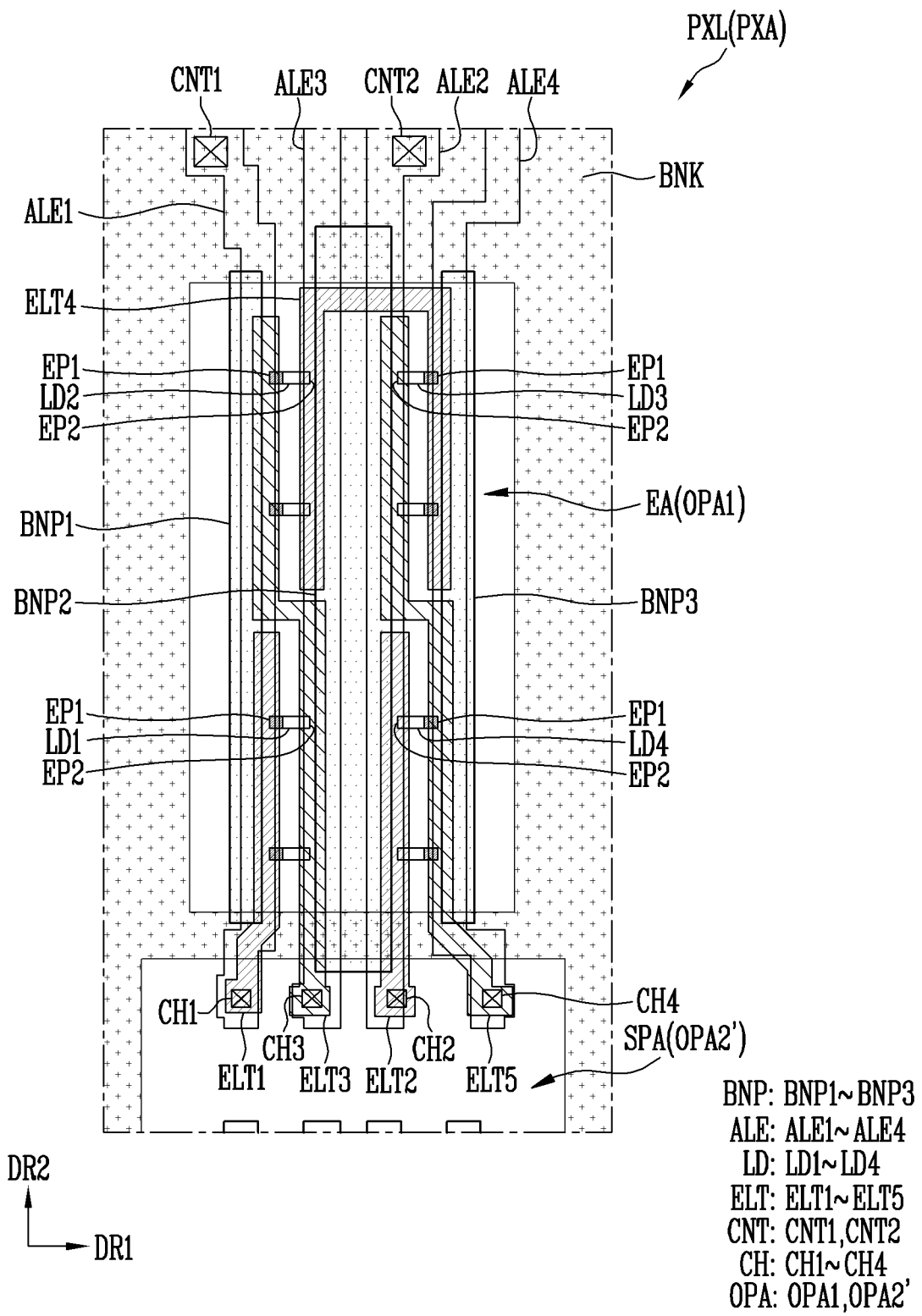

FIG. 5A to FIG. 5E and FIG. 6 respectively illustrate a schematic cross-sectional view of the pixel PXL according to an embodiment. For example, FIG. 5A to FIG. 5E illustrate schematic cross-sectional views of the pixel PXL taken along line I-I' of FIG. 4A according to different embodiments, and FIG. 10 illustrates a schematic cross-sectional view of the pixel PXL taken along line II-II' of FIG. 4A according to an embodiment.

Figure 5A:
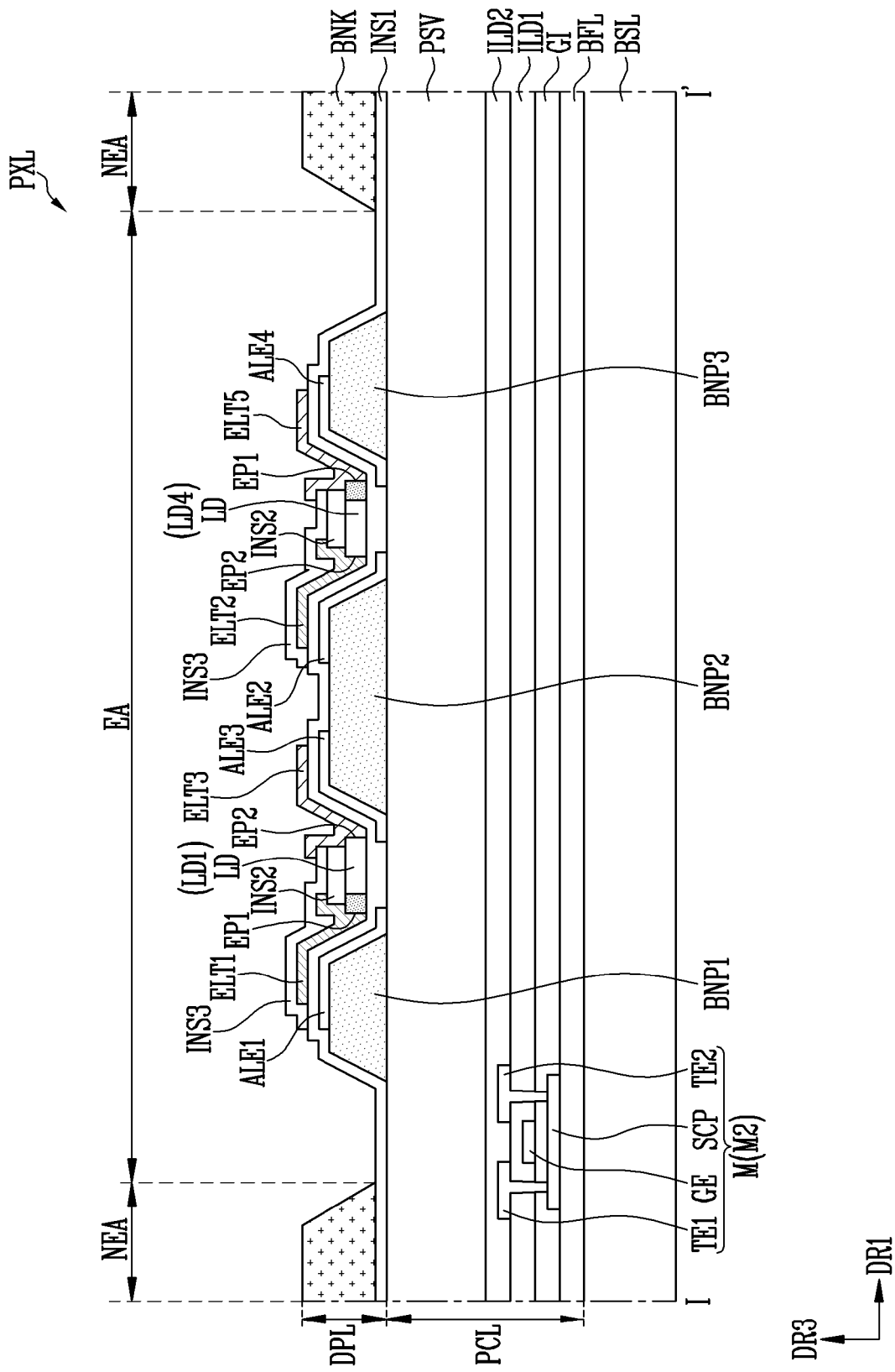
FIG. 5A to FIG. 5E and FIG. 6 respectively illustrate a schematic cross-sectional view of a pixel according to an embodiment.
Figure 5B:
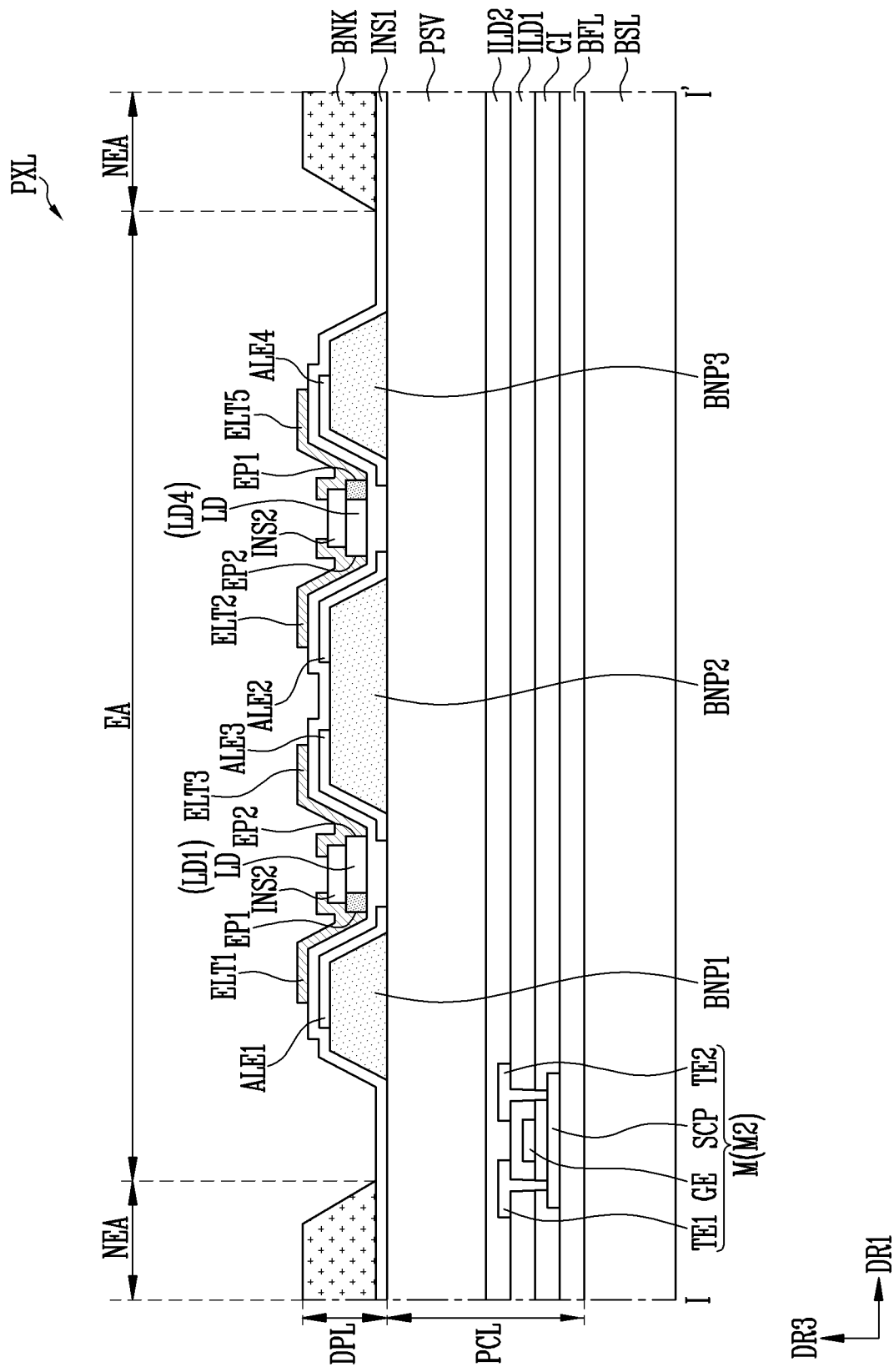
Figure 5C:
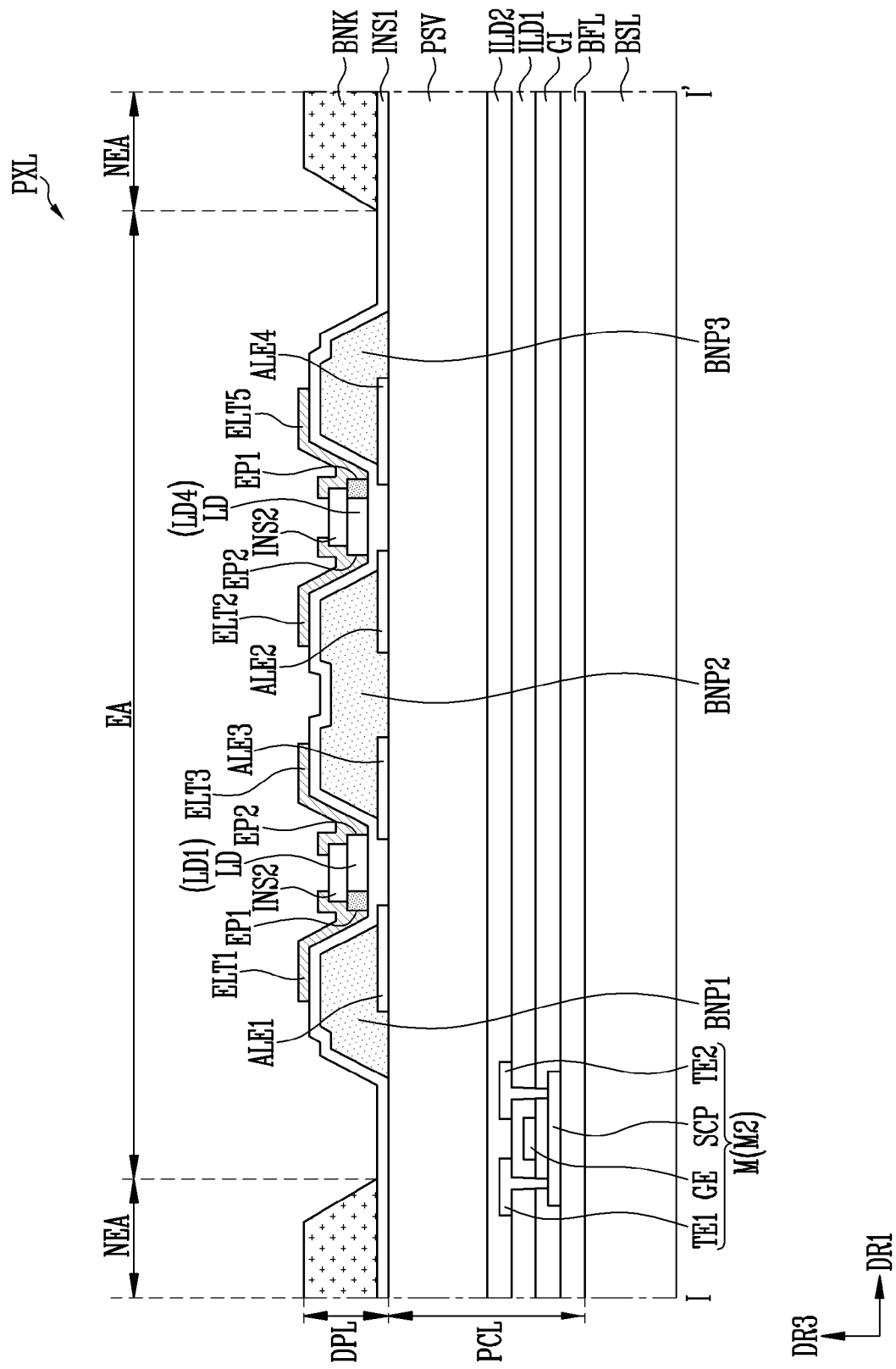
Figure 5D:
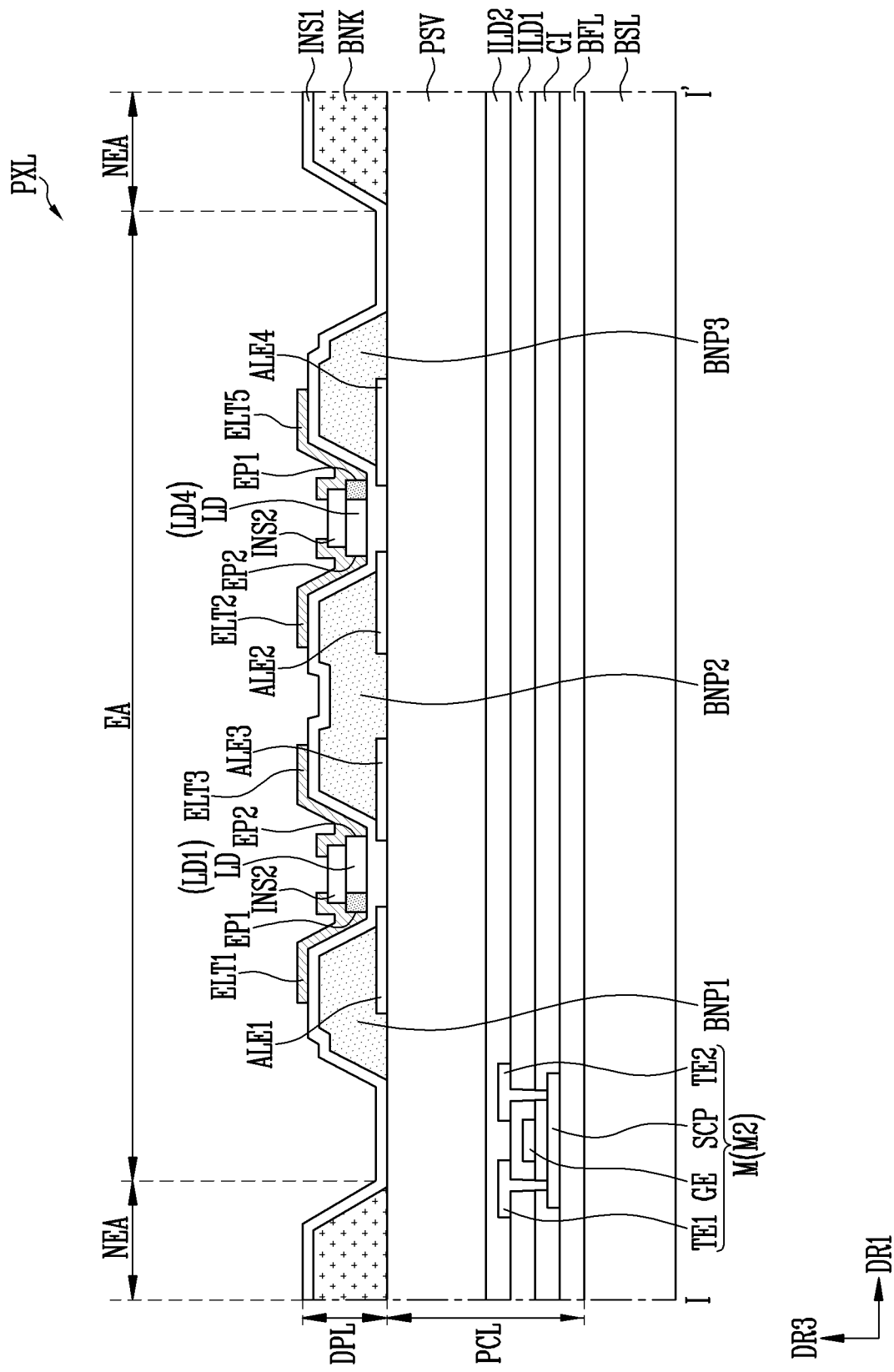
Figure 5E:
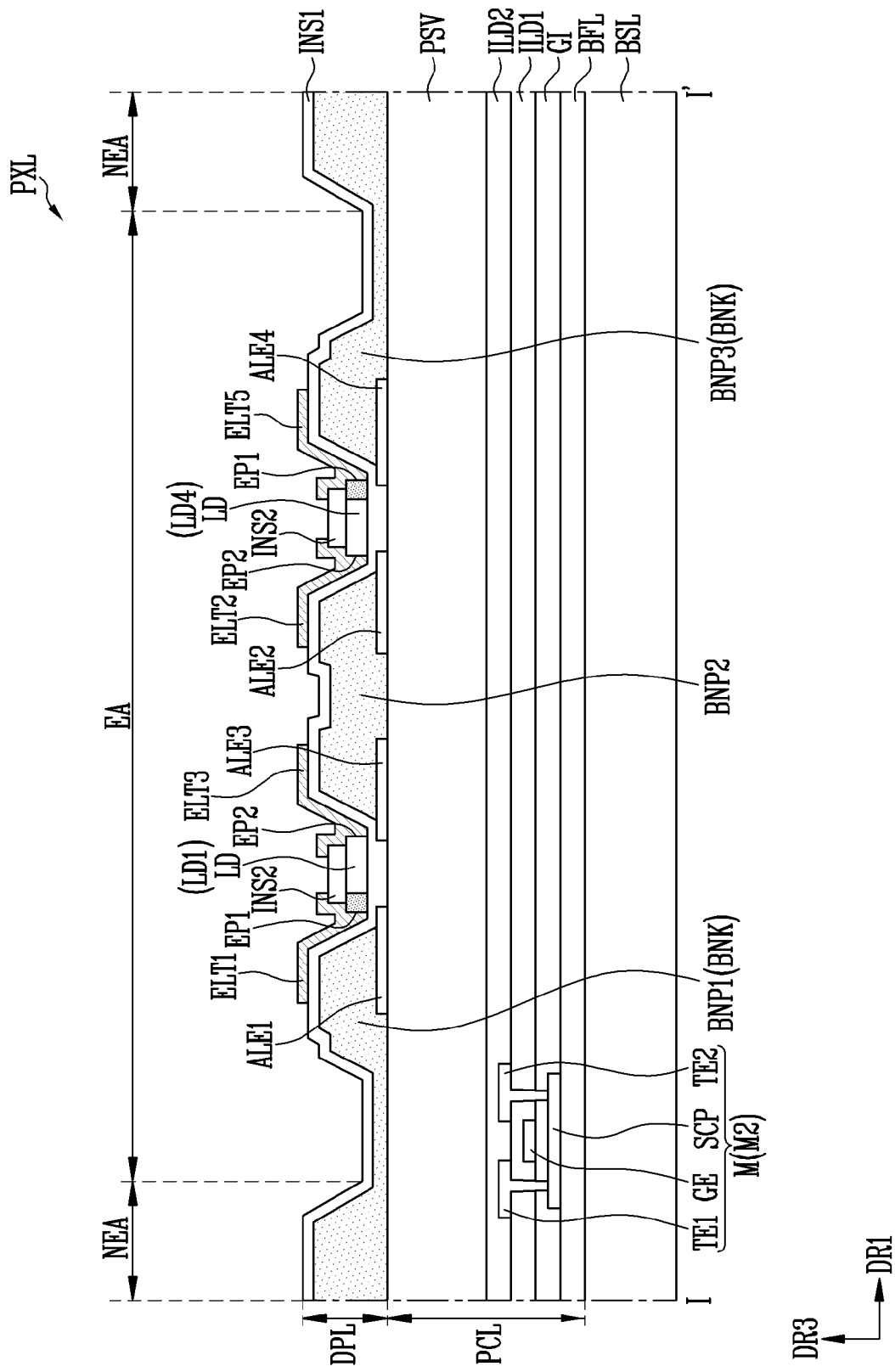

FIG. 5A and FIG. 5B illustrate different embodiments related to a step of forming the pixel electrodes ELT (or a mutual position of the pixel electrodes ELT according to the step) and the presence or absence of a third insulating film INS3. For example, FIG. 5A illustrates an embodiment in which after some or a number of the pixel electrodes ELT and the third insulating film INS3 are first formed, the remaining pixel electrodes ELT are formed, and FIG. 5B illustrates an embodiment in which the pixel electrodes ELT are formed on the same layer or on a same layer. FIG. 5C to FIG. 5E illustrate modified embodiments of embodiments of FIG. 5A and FIG. 5B in relation to positions, formation orders, and/or shapes of the patterns BNP, the alignment electrodes ALE, and/or the bank BNK, and for example, they illustrate different modified embodiments of an embodiment of FIG. 5B. FIG. 5A to FIG. 5E illustrate, as an example of circuit elements that may be disposed on a circuit layer PCL, an arbitrary transistor M (for example, the transistor M2 shown in FIG. 3A to FIG. 3C) that does not include the bottom metal layer BML.

Figure 6:
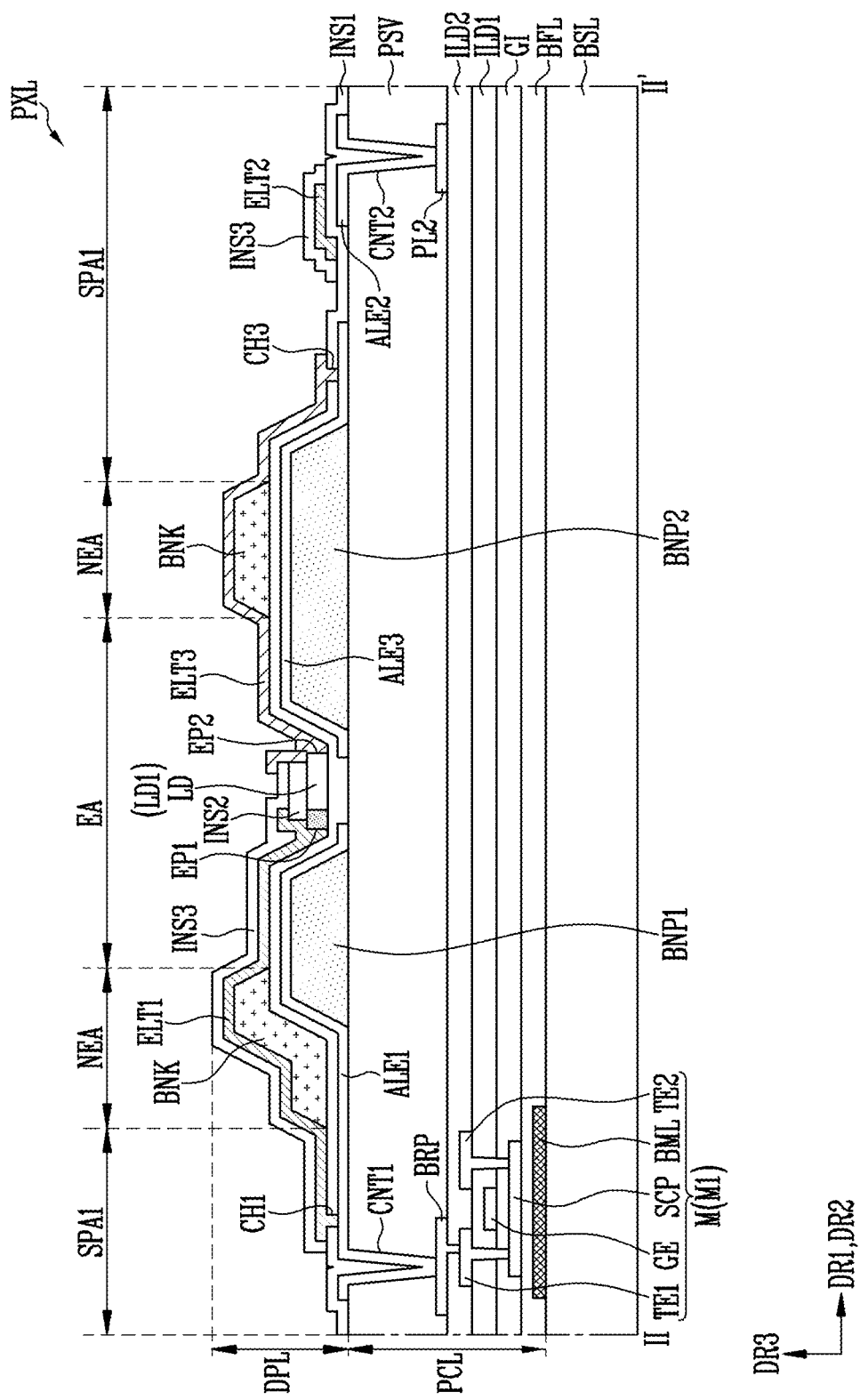

FIG. 6 illustrates a schematic cross-sectional view of the pixel PXL including the contact parts CNT and the contact holes CH according to an embodiment. FIG. 6 illustrates, as an example of the circuit elements that may be disposed on the circuit layer PCL, the transistor M electrically connected to the first alignment electrode ALE1 through the first contact part CNT1 and a bridge pattern BRP and including the lower metal layer BML (for example, the first transistor M1 of FIG. 3A to FIG. 3C), and as an example of a wire that may be disposed on the circuit layer PCL, the second power line PL2 electrically connected to the second alignment electrode ALE2 through the second contact part CNT2.

Referring to FIG. 2 to FIG. 6, the pixel PXL and the display device DD including the same according to an embodiment may include the circuit layer PCL and a display layer DPL disposed to overlap each other on one or a surface of the base layer BSL. For example, the display area DA may include the circuit layer PCL disposed on one or a surface of the base layer BSL, and the display layer DPL disposed on the circuit layer PCL. However, a mutual position of the circuit layer PCL and the display layer DPL on the base layer BSL may vary depending on embodiments. In case that the circuit layer PCL and the display layer DPL are divided into different layers and then they overlap each other, respective layout spaces for forming the pixel circuit PXC and the light emitting part EMU in a plan view may be sufficiently secured.

Circuit elements (for example, the transistors M and the storage capacitor Cst) forming the pixel circuit PXC of the corresponding pixel PXL and various wires electrically connected to the circuit elements may be disposed in each pixel area PXA of the circuit layer PCL. The alignment electrodes ALE, the light emitting elements LD, and/or the pixel electrodes ELT that form the light emitting part EMU of the corresponding pixel PXL may be disposed in each pixel area PXA of the display layer DPL.

The circuit layer PCL may include insulating layers in addition to the circuit elements and the wires. For example, the circuit layer PCL may include a buffer layer BFL, a gate insulating film GI, a first interlayer insulating film ILD1, a second interlayer insulating film ILD2, and/or a passivation film PSV, sequentially stacked on one or a side of the base layer BSL.

The circuit layer PCL may selectively further include a first conductive layer including the bottom metal layer BML disposed under or below at least some or a number of the transistors M (for example, the first transistor M1).

As an example, the first conductive layer may be disposed between the base layer BSL and the buffer layer BFL, and may include the bottom metal layer BML overlapping a gate electrode GE and/or a semiconductor pattern SCP of at least one transistor M (for example, the first transistor M1).

In an embodiment, the bottom metal layer BML may be electrically connected to one electrode of the corresponding transistor M. For example, in case that the first transistor M1 may include the bottom metal layer BML, the bottom metal layer BML may be electrically connected to a source electrode (or drain electrode) of the first transistor M1.

The buffer layer BFL may be disposed on one or a surface of the base layer BSL on which the first conductive layer may be selectively formed. The buffer layer BFL may prevent impurities from diffusing into each circuit element.

A semiconductor layer may be disposed on the buffer layer BFL. The semiconductor layer may include the semiconductor pattern SCP of each transistor M. The semiconductor pattern SCP may include a channel area overlapping the gate electrode GE, and first and second conductive areas (for example, source and drain areas) disposed at both sides of the channel area.

The gate insulating film GI may be disposed on the semiconductor layer. A second conductive layer may be disposed on the gate insulating film GI.

The second conductive layer may include the gate electrode GE of each transistor M. The second conductive layer may further include one electrode of the storage capacitor Cst and/or a predetermined wire.

The first interlayer insulating film ILD1 may be disposed on the second conductive layer. A third conductive layer may be disposed on the first interlayer insulating film ILD1.

The third conductive layer may include first and second transistor electrodes TE1 and TE2 of each transistor M. Here, the first and second transistor electrodes TE1 and TE2 may be source and drain electrodes. The third conductive layer may further include one electrode of the storage capacitor Cst and/or a predetermined wire.

The second interlayer insulating film ILD2 may be disposed on the third conductive layer. A fourth conductive layer may be disposed on the second interlayer insulating film ILD2.

The fourth conductive layer may include the bridge pattern BRP and/or a predetermined wire (for example, the first power line PL1 and/or the second power line PL2) for electrically connecting the circuit layer PCL and the display layer DPL. The bridge pattern BRP may be electrically connected to the first alignment electrode ALE1 and/or the first pixel electrode ELT1 of each light emitting part EMU through the first contact part CNT1. The second power line PL2 may be electrically connected to the second alignment electrode ALE2 and/or the second pixel electrode ELT2 of each light emitting part EMU through the second contact part CNT2. Each of the first and second contact parts CNT1 and CNT2 may be formed of a via hole and/or a contact hole formed in the passivation film PSV.

In an embodiment, the fourth conductive layer may be omitted. The bridge pattern BRP may not be provided or disposed, and the first alignment electrode ALE1 may be electrically connected to a predetermined circuit element through the first contact part CNT1. For example, the first alignment electrode ALE1 may be electrically connected or directly electrically connected to the first transistor electrode TE1 (or the second transistor electrode TE2) of the first transistor M1 through the first contact part CNT1.

In case that the fourth conductive layer is omitted, the second interlayer insulating film ILD2 may be selectively provided or disposed. For example, in case that the fourth conductive layer is omitted, the second interlayer insulating film ILD2 may also be omitted, so that the passivation film PSV may be formed or directly formed on the third conductive layer, or even if the fourth conductive layer is omitted, the second interlayer insulating film ILD2 and the passivation film PSV may be sequentially formed on the third conductive layer.

The positions of the first and/or second power lines PL1 and PL2 may be variously changed according to embodiments. For example, in case that the second interlayer insulating film ILD2 and/or the fourth conductive layer are omitted, each of the first and second power lines PL1 and PL2 may be provided to the first conductive layer, the second conductive layer, or the third conductive layer. In case that the first and/or second power lines PL1 and PL2 are provided as a multilayer, the first and/or second power lines PL1 and PL2 may include multi-layered wires provided or disposed on at least two of the first to third conductive layers (in case that the fourth conductive layer is provided or disposed, the first to fourth conductive layers).

The passivation film PSV may be disposed on the fourth conductive layer. In an embodiment, the passivation film PSV may include at least one organic insulating layer, and may substantially flatten a surface of the circuit layer PCL. The display layer DPL may be disposed on the passivation film PSV.

The display layer DPL may include the light emitting part EMU of each pixel PXL. For example, the display layer DPL may include the alignment electrodes ALE of each pixel PXL, the light emitting elements LD arranged or disposed between the alignment electrodes ALE, and the pixel electrodes ELT electrically connected to the light emitting elements LD. In an embodiment, at least some or a number of the pixel electrodes ELT may be electrically connected to different alignment electrodes ALE through respective contact holes CH formed in the first insulating film INS1.

The display layer DPL may include the patterns BNP disposed under or below the alignment electrodes ALE, and the first insulating film INS1 disposed on the alignment electrodes ALE. For example, the display layer DPL may include the patterns BNP disposed under or below one or an area of the alignment electrodes ALE to protrude from one or an area of each of the alignment electrodes ALE in an upper direction, and the first insulating film INS1 disposed on the alignment electrodes ALE to entirely cover or overlap the alignment electrodes ALE at least in the light emitting area EA. The display layer DPL may further include at least one conductive layer and/or insulating layer.

For example, the display layer DPL may include the patterns BNP, the alignment electrodes ALE, the first insulating film INS1, the light emitting elements LD, the second insulating film INS2, and the pixel electrodes ELT, which may be sequentially disposed and/or formed on the circuit layer PCL. The display layer DPL may selectively include the third insulating film INS3.

In an embodiment, as shown in FIG. 5A and FIG. 6, a pair of pixel electrodes ELT (for example, the first and third pixel electrodes ELT1 and ELT3, or the second and fifth pixel electrodes ELT2 and ELT5) facing each other with each light emitting element LD interposed therebetween may be formed on different layers, and, the third insulating film INS3 may be provided or disposed between the pair of pixel electrodes ELT.

For example, the third insulating film INS3 may be provided or disposed to cover or overlap one of the pair of pixel electrodes ELT. For example, the third insulating film INS3 may be formed or disposed on the first, second, and fourth pixel electrodes ELT1, ELT2, and ELT4, and the third and fifth pixel electrodes ELT3 and ELT5 may be formed or disposed on one or an end portion of the third insulating film INS3.

In an embodiment, as shown in FIG. 5B, a pair of pixel electrodes ELT facing each other with each light emitting element LD interposed therebetween may be formed or disposed on the same layer or on a same layer. For example, the pixel electrodes ELT of each pixel PXL may be simultaneously formed or disposed on the same layer or on a same layer. The third insulating film INS3 may be omitted.

The patterns BNP may be disposed on one or a surface of the base layer BSL on which the circuit layer PCL may be formed. For example, the patterns BNP may be provided or disposed on the passivation film PSV. The patterns BNP may protrude in a height direction (for example, third direction DR3) of the pixel PXL on one or a surface of the base layer BSL. Accordingly, one or an area of the alignment electrodes ALE disposed on the patterns BNP may upwardly protrude.

The patterns BNP may include an insulating material including at least one inorganic material and/or organic material. For example, the patterns BNP may include at least one layer of inorganic film that may include various inorganic insulating materials including a silicon nitride ($SiN_x$), a silicon oxide ($SiO_x$), or a silicon oxynitride ($SiO_xN_y$). As an example, the patterns BNP may include at least one layer of organic film including various types of organic insulating materials including a photo resist material, or may be formed of a single-layered or multi-layered insulator including organic or inorganic materials in combination.

A reflective wall structure may be formed or disposed around the light emitting elements LD by the patterns BNP and the alignment electrodes ALE disposed on the patterns BNP. For example, in case that the alignment electrodes ALE include a reflective electrode layer, light emitted through the first and second end portions EP1 and EP2 of the light emitting elements LD may be reflected by the reflective electrode layer to be emitted in the upper direction of each pixel PXL.

The patterns BNP may have various shapes. In an embodiment, the patterns BNP may be formed to have an inclined surface inclined at an angle of a predetermined range with respect to the base layer BSL as shown in FIG. 5A to FIG. 5E and FIG. 6. In an embodiment, the patterns BNP may have side walls such as a curved or substantially curved or stepped or substantially stepped shape. For example, at least one pattern BNP may have a cross-section of substantially a semicircle or substantially a semi-ellipse shape. The conductive layers (or electrodes) and/or insulating layers disposed on the patterns BNP may have a surface profile corresponding to the patterns BNP.

The alignment electrodes ALE may be disposed on the patterns BNP. The alignment electrodes ALE may be disposed to be spaced apart from each other in each light emitting area EA.

In an embodiment, each alignment electrode ALE may have a pattern separated for each pixel PXL, or may have a pattern commonly electrically connected to pixels PXL. For example, each of the first to fourth alignment electrodes ALE1 to ALE4 may have an independent pattern with both ends cut off or removed between the separating pattern SPA disposed at the outer periphery of the corresponding pixel area PXA and/or adjacent pixel areas PXA. In an embodiment, at least one alignment electrode (for example, the first alignment electrode ALE1) may have an independent pattern with both ends cut off or removed in the separating area SPA, and at least one other alignment electrode (for example, the second alignment electrode ALE2) may extend along the first direction DR1 or the second direction DR2 to be integrally connected to a predetermined alignment electrode (for example, the second alignment electrode ALE2 of the neighboring pixel PXL) of the neighboring pixel PXL in the first direction DR1 or the second direction DR2.

Each alignment electrode ALE may have conductivity by including at least one conductive material. The alignment electrodes ALE may include conductive materials that may be the same or different from each other. Each alignment electrode ALE may be formed as a single layer or multilayer.

The first insulating film INS1 may be disposed on one or a surface of the base layer BSL including the alignment electrodes ALE. For example, the first insulating film INS1 may be interposed between the alignment electrodes ALE and the pixel electrodes ELT.

The first insulating film INS1 may be formed or disposed to completely cover or overlap the alignment electrodes ALE in the light emitting area EA. The first insulating film INS1 may have the contact holes CH for exposing one or an area of each of the alignment electrodes ALE in the separating area SPA.

The bank BNK may be disposed on one or a surface of the base layer BSL including the first insulating film INS1. For example, the bank BNK may be provided or disposed in the non-light emitting area NEA to surround the light emitting area EA and the separating area SPA.

The bank BNK may be provided or disposed not to overlap or to overlap the first and/or second contact parts CNT1 and CNT2. For example, the bank BNK may be formed to not cover or overlap the first and second contact parts CNT1 and CNT2 as shown in FIG. 4A, or may be formed to cover or overlap the first and second contact parts CNT1 and CNT2 as shown in FIG. 4B.

In an embodiment, the bank BNK may be provided or disposed to not overlap the contact holes CH. Accordingly, it is possible to easily connect the alignment electrodes ALE to each pixel electrode ELT after the formation of the bank BNK.

The bank BNK may contain an insulating material including at least one inorganic material and/or an organic material. In an embodiment, the bank BNK may include a light blocking material or a color filter material, so that light leakage between adjacent pixels PXL may be blocked. The bank BNK may include at least one of materials included in the patterns BNP, or may include a material different from the materials included in the patterns BNP.

In an embodiment, the bank BNK may have a hydrophobic surface. For example, by forming the bank BNK itself in a hydrophobic pattern by using a hydrophobic material, or by forming a hydrophobic film made of a hydrophobic material on the bank BNK, the bank BNK may be formed to have the hydrophobic surface. For example, the bank BNK may be formed by using a hydrophobic organic insulating material having a large contact angle such as polyacrylate. In the process of supplying the light emitting elements LD, the light emitting element ink including the light emitting elements LD may be prevented from overflowing to the periphery of the light emitting area EA, and the supply area of the light emitting element ink may be controlled or facilitated.

FIGS. 5A and 5B illustrate the structure of the pixel PXL in an embodiment in which the patterns BNP, the alignment electrodes ALE, the first insulating film INS1, and bank BNK may be sequentially formed on one or a surface of the base layer BSL on which the circuit layer PCL may be formed, but the disclosure is not limited thereto.

For example, as shown in FIG. 5C, after the alignment electrodes ALE are first formed on one or a surface of the base layer BSL on which the circuit layer PCL may be formed, the patterns BNP, the first insulating film INS1, and the bank BNK may be sequentially formed. As an example, as shown in FIG. 5D and FIG. 5E, after the patterns BNP and the bank BNK are first formed on one or a surface of the base layer BSL on which the circuit layer PCL is formed, the alignment electrodes ALE and the first insulating film INS1 may be sequentially formed.

In case that the patterns BNP and the bank BNK are disposed on the same layer or on a same layer as in an embodiment of FIG. 5D and FIG. 5E, the patterns BNP and the bank BNK may be simultaneously or sequentially formed, and they may be formed to be connected to or not connected to each other. For example, as shown in FIG. 5D, the patterns BNP and the bank BNK may be formed to be spaced apart from each other on the same layer or on a same layer, and may be simultaneously or sequentially formed. As an example, as shown in FIG. 5E, the patterns BNP and the bank BNK may simultaneously formed on the same layer or on a same layer, and may be formed to be connected to each other. For example, the bank BNK the first and/or third patterns BNP1 and BNP3 may be integral with each other so that their lower surfaces may be connected to each other. The patterns BNP and the bank BNK may be formed by using a halftone mask, but are not limited thereto. In an embodiment, the patterns BNP and/or the bank BNK and the passivation film (PSV) or the like may be integral with each other within the spirit and the scope of the disclosure.

For example, in the disclosure, the positions, formation orders, and/or shapes of the patterns BNP, the alignment electrodes ALE, the first insulating film INS1, and/or the bank BNK are not particularly limited, but they may be variously changed according to embodiments.

The light emitting elements LD may be supplied and aligned in each light emitting area EA. In an embodiment, light emitting elements LD may be supplied to the light emitting area EA of each pixel PXL through an inkjet method, a slit coating method, or various other methods, and the light emitting elements LD may be aligned between the alignment electrodes ALE by applying a predetermined alignment signal (or alignment voltage) to each of the alignment electrodes ALE (or, alignment wires before being separated into the alignment electrodes ALE). For example, the light emitting elements LD may be aligned in an area between a pair of patterns BNP (for example, an area between the first and second patterns BNP1 and BNP2, and an area between the second and third patterns BNP2 and BNP3) disposed under or below a pair of alignment electrodes ALE receiving different alignment signals.

In an embodiment, at least some or a number of the light emitting elements LD may be aligned in a horizontal or diagonal direction between the pair of alignment electrodes ALE so that both end portions (for example, the first and second end portions EP1 and EP2) of the light emitting elements LD in a length direction overlap or do not overlap a pair of adjacent alignment electrodes ALE. Both end portions of the light emitting elements LD may be electrically connected to respective pixel electrodes ELT.

The second insulating film INS2 may be disposed on one or an area of the light emitting elements LD. The second insulating film INS2 may be locally disposed on one or an area of each of the light emitting elements LD to expose the first and second end portions EP1 and EP2 of each of the light emitting elements LD. Both end portions of the light emitting elements LD that are not covered or overlapped by the second insulating film INS2, for example, the first and second end portions EP1 and EP2, may be electrically connected by respective pixel electrodes ELT. In case that the second insulating film INS2 is formed on the light emitting elements LD after the alignment of the light emitting elements LD is completed, the light emitting elements LD may be stably fixed.

In an embodiment, the second insulating film INS2 may be omitted. One or an end of each of the pixel electrodes ELT may be disposed or directly disposed on an upper surface of the adjacent light emitting elements LD.

The third insulating film INS3 may be disposed to cover or overlap one of a pair of pixel electrodes ELT disposed on the first and second end portions EP1 and EP2 of the light emitting elements LD. In case that the second and/or third insulating films INS2 and INS3 are formed or disposed on the upper portion of the light emitting elements LD, electrical stability between the first and second end portions EP1 and EP2 of the light emitting elements LD may be secured. For example, a pair of pixel electrodes ELT adjacent to each other may be stably separated by the second and/or third insulating films INS2 and INS3. Accordingly, it is possible to prevent a short circuit defect from occurring between the first and second end portions EP1 and EP2 of the light emitting elements LD. In an embodiment in which the pair of pixel electrodes ELT are disposed on the same layer or on a same layer, the third insulating film INS3 may not be provided or disposed.

The pixel electrodes ELT may be disposed on the second and/or third insulating films INS2 and INS3, and may be made of various transparent conductive materials. For example, the pixel electrodes ELT may include at least one of various transparent materials such as an indium tin oxide (ITO), an indium zinc oxide (IZO), an indium tin zinc oxide (ITZO), a zinc oxide (ZnO), an aluminum doped zinc oxide (AZO), a gallium doped zinc oxide (GZO), a zinc tin oxide (ZTO), a gallium tin oxide (GTO), and a fluorine doped tin oxide (FTO), and they may be implemented to be substantially transparent or translucent to satisfy a predetermined transmittance. Accordingly, the light emitted from the light emitting elements LD through each of the first and second ends EP1 and EP2 may pass through the pixel electrodes ELT to be emitted to the outside of the pixel PXL.

In an embodiment, at least one insulating film and/or a light conversion layer (not shown) may be provided or disposed on the pixel electrodes ELT and/or the third insulating film INS3.

For example, the insulating film may be entirely formed or disposed on the display area DA to cover or overlap the patterns BNP, the pixel electrodes ELT, the first, second, and/or third insulating films INS1, INS2, and INS3, the light emitting elements LD, the pixel electrodes ELT, and the bank BNK. In an embodiment, the insulating film may include a single-layered or multiple-layered encapsulation film. In an embodiment, at least one-layered overcoat film, a filler, and/or an upper substrate may be further disposed on the insulating film.

A light conversion layer may be selectively provided or disposed on the light emitting part EMU of each pixel PXL. The light conversion layer may include a color conversion layer (or wavelength conversion layer) and/or a color filter layer corresponding to a predetermined color. The light conversion layer may be formed or disposed or may be directly formed or disposed on the pixel electrodes ELT and/or the third insulating film INS3 of each pixel PXL, or may be formed or disposed on the insulating film covering or overlapping the pixel electrodes ELT and/or the third insulating film INS3, but the position and the formation method of the light conversion layer are not particularly limited.

For example, in each pixel area PXA, light conversion particles (for example, a quantum dot of a predetermined color) for converting a color (or wavelength) of light emitted from the light emitting elements LD, light scattering particles for increasing a utilization rate of the light emitted from the light emitting elements LD, and/or a light conversion layer containing a color filter material of a predetermined color may be selectively further provided or disposed on the upper portion of the display layer DPL.

In embodiments of FIG. 4A to FIG. 6, the light emitting area EA in which the light emitting elements LD are supplied and aligned may be formed to improve or optimize the alignment characteristic of the light emitting elements LD. For example, in each light emitting area EA, the light emitting part EMU may be formed between the alignment electrodes ALE to uniformly align the light emitting elements LD and to prevent the light emitting elements LD from being deviated from an aligned position.

For example, in the light emitting area EA, each pattern BNP may have a uniform width and continuously extends along the second direction DR2, and the patterns BNP may be arranged or disposed at uniform or substantially uniform intervals.

Similarly, in the light emitting area EA, each alignment electrode ALE may have a uniform width and continuously extends along the second direction DR2, and a pair of alignment electrodes ALE receiving different alignment signals (or, a pair of alignment wires before being separated into the alignment electrodes ALE) may be spaced apart from each other at a uniform interval.

The first insulating film INS1 may be formed to entirely and uniformly cover or overlap the alignment electrodes ALE in the light emitting area EA and to partially expose the alignment electrodes ALE by each contact hole CH in the separating area SPA.

As the contact holes CH are disposed in the separating area SPA, at least some or a number of the pixel electrodes ELT, for example, the first, second, third, and fifth pixel electrodes ELT1, ELT2, ELT3, and ELT5 may extend to the separating area SPA. The first, second, third, and fifth pixel electrodes ELT1, ELT2, ELT3, and ELT5 may be electrically connected to different alignment electrodes ALE through respective contact holes CH in the separating area SPA.

According to embodiments of FIG. 4A to FIG. 6, even if alignment signals including an alternating current (AC) signal are applied to the alignment electrodes ALE (or, alignment wires) to align the light emitting elements LD, an AC electro-osmosis (ACEO) effect may prevent the light emitting elements LD from deviating from the aligned position thereof. For example, the light emitting part EMU may be formed so that a uniform electric field may be formed between the pair of alignment electrodes ALE in the light emitting area EA, an ink including the light emitting elements LD (for example, a light emitting element ink including at least one kind of light emitting elements LD) may be supplied to the light emitting area EA in a state in which the alignment electrodes ALE are entirely covered or overlapped by the first insulating film INS1, and the light emitting elements LD may be aligned by forming an electric field between the alignment electrodes ALE. Accordingly, it is possible to prevent or minimize flowing of the light emitting element ink, and to prevent or minimize the light emitting elements LD from deviating from aligned positions thereof.

Therefore, according to the above-described embodiments, the light emitting elements LD may be more stably aligned inside of the light emitting area EA. It is possible to improve the light emitting characteristic and light efficiency of the pixel PXL by increasing the utilization rate of the light emitting elements LD supplied to the light emitting area EA.

Figure 7A:
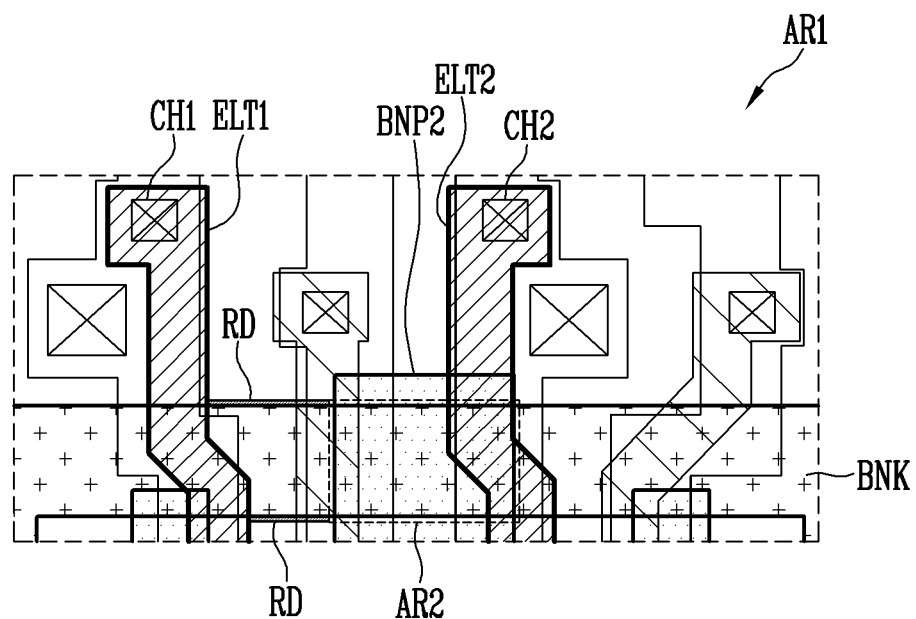
FIG. 7A and FIG. 7B illustrate enlarged views of area AR1 of FIG. 4A.
Figure 7B:
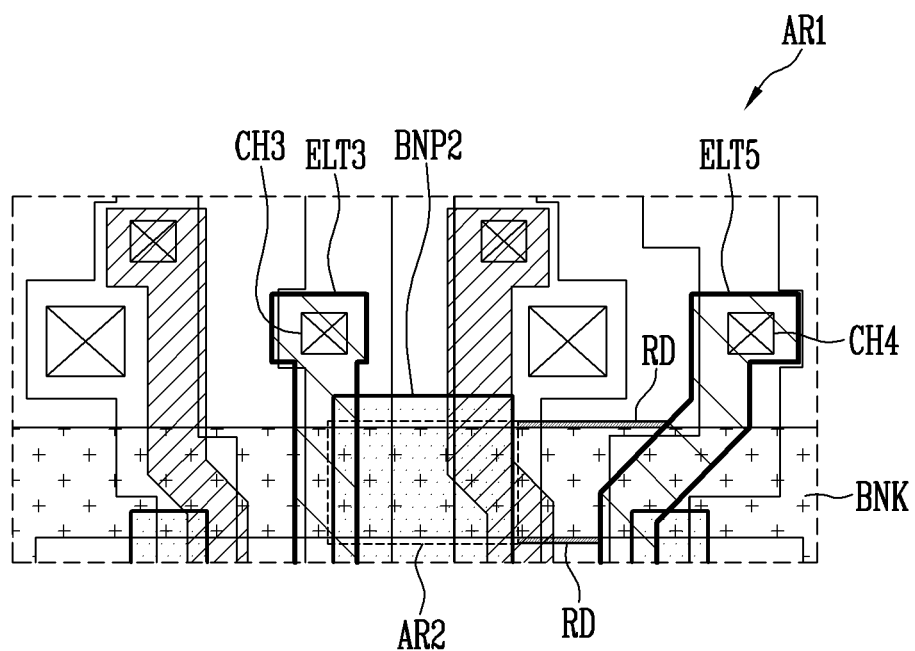

FIG. 7A and FIG. 7B illustrate enlarged views of area AR1 of FIG. 4A. For example, FIG. 7A shows an embodiment in which a residue RD of a conductive film is cut off or removed between the first pixel electrode ELT1 and the second pixel electrode ELT2, and FIG. 7B shows an embodiment in which the residue RD of the conductive film is cut off or removed between the third pixel electrode ELT3 and the fifth pixel electrode ELT5.

Referring to FIG. 4A to FIG. 7A, the first pixel electrode ELT1 and the second pixel electrode ELT2 may extend to the separating area SPA (for example, the first separating area SPA1), and may be formed or disposed on the same layer or on a same layer in the same process. For example, after the conductive film is entirely formed on one or a surface of the base layer BSL provided with the patterns BNP, the alignment electrodes ALE, the bank BNK, and the light emitting elements LD, by patterning the conductive film through a photo process or the like, the first pixel electrode ELT1 and the second pixel electrode ELT2 (and/or the fourth pixel electrode ELT4) may be formed.

As described above, in embodiments, the second pattern BNP2 may be extended to the separating area SPA so that the second pattern BNP2 overlaps the edge area of the bank BNK at the boundary between the non-light emitting area NEA and the separating area SPA. Even if the residue RD of the conductive film occurs along the circumference of the bank BNK in the area between the first and second pixel electrodes ELT1 and ELT2 in the process of patterning the conductive film, the residue RD of the conductive film may be cut off or removed without being connected to the area (for example, the AR2 area) in which the second pattern BNP2 and the bank BNK overlap. For example, the residue RD of the conductive film may be cut off or removed in the circumference of and/or around the area in which the second pattern BNP2 and the bank BNK overlap. Accordingly, the residue RD of the conductive film may not overlap the second pattern BNP2, and one or an end portion thereof may remain in the pixel PXL in a form of a conductive pattern disconnected around the second pattern BNP2.

For example, as shown in FIG. 6, since the area in which the second pattern BNP2 and the bank BNK overlap protrudes in the height direction of the base layer BSL compared with the remaining area, the conductive film applied to form the pixel electrodes ELT may upwardly protrude in the area in which the second pattern BNP2 and the bank BNK overlap compared with the remaining area. Accordingly, in the process of etching the conductive film by forming a mask such as a photo resist pattern on the conductive film, in the area in which the second pattern BNP2 and the bank BNK overlap, the photo resist pattern may be formed in a relatively thin thickness to be sufficiently etched as desired. Accordingly, as the residue RD of the conductive film is cut off or removed between the first pixel electrode ELT1 and the second pixel electrode ELT2, it is possible to prevent a short circuit defect from occurring between the first and second pixel electrodes ELT1 and ELT2.

Even at the boundary between the non-light emitting area NEA and the light emitting area EA, the second pattern BNP2 and the bank BNK may overlap in the area between the first pixel electrode ELT1 and the second pixel electrode ELT2. Accordingly, even if the residue RD of the conductive film occurs in the process of forming the first pixel electrode ELT1 and the second pixel electrode ELT2, the residue RD of the conductive film is cut off or removed in the area between the first pixel electrode ELT1 and the second pixel electrode ELT2. Therefore, it is possible to prevent a short circuit defect from occurring between the first and second pixel electrodes ELT1 and ELT2.

For example, the pixel PXL may include the residue RD remaining in the form of at least one conductive pattern at the boundary between the non-light emitting area NEA and the separating area SPA and/or at the boundary between the non-light emitting area NEA and the light emitting area EA. Each conductive pattern may be disposed between the first pixel electrode ELT1 and the second pixel electrode ELT2, and may extend along the boundary of the non-light emitting area NEA.

In an embodiment, each conductive pattern may or may not be electrically connected to the first pixel electrode ELT1 or the second pixel electrode ELT2. For example, one or an end portion of at least one conductive pattern may be electrically connected to the first pixel electrode ELT1 or the second pixel electrode ELT2, and the other end portion or another end portion of the at least one conductive pattern may be disconnected and floated around the second pattern BNP2.

Referring to FIG. 4A to FIG. 7B, similar to that described in FIG. 7A, it is possible to prevent a short circuit defect from occurring between the third and fifth pixel electrodes ELT3 and ELT5. For example, the third pixel electrode ELT3 and the fifth pixel electrode ELT5 may extend to the separating area SPA (for example, the first separating area SPA1), and may be formed or disposed on the same layer or on a same layer in the same process. For example, after the conductive film may be entirely formed or disposed on one or a surface of the base layer BSL that are provided with the patterns BNP, the alignment electrodes ALE, the bank BNK, the light emitting elements LD, the first, second, and fourth pixel electrodes ELT1, ELT2, and ELT4, and/or the third insulating film INS3, the third pixel electrode ELT3 and the fifth pixel electrode ELT5 may be formed by patterning the conductive film through a photo process or the like within the spirit and the scope of the disclosure.

At the boundary between the non-light emitting area NEA and the separating area SPA, and at the boundary between the non-light emitting area NEA and the light emitting area EA, the second pattern BNP2 and the bank BNK may overlap each other in the area between the third pixel electrode ELT3 and the fifth pixel electrode ELT5. Accordingly, even if the residue RD of the conductive film occurs along the circumference of the bank BNK in the patterning process of the conductive film for forming the third pixel electrode ELT3 and the fifth pixel electrode ELT5, the residue RD of the conductive film is cut off or removed in the area between the third pixel electrode ELT3 and the fifth pixel electrode ELT5. Therefore, it is possible to prevent a short circuit defect from occurring between the third and fifth pixel electrodes ELT3 and ELT5. For example, at the boundary between the non-light emitting area NEA and the separating area SPA, the second pattern BNP2 may be disposed to overlap the bank BNK between the third and fifth pixel electrodes ELT3 and ELT5, for example in the right area of the third pixel electrode ELT3. Accordingly, in the process of forming the pixel electrodes ELT, the conductive film for forming the pixel electrodes ELT may be formed or disposed to be relatively high in an area corresponding to the right area of the third pixel electrode ELT3, and thus, a mask such as a photoresist pattern may be formed on the conductive film to have a relatively thin thickness. Therefore, in the area corresponding to the right area of the third pixel electrode ELT3, the patterning process of the conductive film smoothly proceeds, so that no residue remains.

At the boundary between the non-light emitting area NEA and the separating area SPA, between the third and fifth pixel electrodes ELT3 and ELT5, for example, in the left area of the fifth pixel electrode ELT5 in which the second pattern BNP2 may not be provided or disposed, the conductive film for forming the pixel electrodes ELT may be formed or disposed to be relatively low, and thus, a mask such as a photoresist pattern may be formed on the conductive film to have a relatively large thickness. Therefore, in the left area immediately adjacent to the fifth pixel electrode ELT5, the conductive film may be incompletely etched, so that the residue RD may remain. However, as the second pattern BNP2 is disposed in the right area of the third pixel electrode ELT3 so that it is adjacent to or directly adjacent to the third pixel electrode ELT3, the residue RD does not lead to the third pixel electrode ELT3 and is cut off or removed in an area that meets the second pattern BNP2 (or a peripheral area therearound). Accordingly, the residue RD of the conductive film is cut off or removed in the area between the third pixel electrode ELT3 and the fifth pixel electrode ELT5. Therefore, the third and fifth pixel electrodes ELT3 and ELT5 may be stably separated.

For example, the pixel PXL may include the residue RD remaining in the form of at least one conductive pattern between the third pixel electrode ELT3 and the fifth pixel electrode ELT5, at the boundary between the non-light emitting area NEA and the separating area SPA and/or at the boundary between the non-light emitting area NEA and the light emitting area EA. The at least one conductive pattern may be disposed between the third pixel electrode ELT3 and the fifth pixel electrode ELT5, and may extend along the boundary of the non-light emitting area NEA.

In an embodiment, the at least one conductive pattern may or may not be electrically connected to the third pixel electrode ELT3 or the fifth pixel electrode ELT5. For example, one or an end portion of the at least one conductive pattern may be electrically connected to the third pixel electrode ELT3 or the fifth pixel electrode ELT5, and the other end portion or another end portion of the at least one conductive pattern may be disconnected and floated around the second pattern BNP2.

FIG. 7A and FIG. 7B illustrate an embodiment in which the short-circuit defect is prevented between the pixel electrodes ELT provided or disposed on the same layer or on a same layer according to the structure in which some or a number (for example, the first, second, and fourth pixel electrodes ELT1, ELT2, and ELT4) of the pixel electrodes ELT and other some or a number of (for example, the third and fifth pixel electrodes ELT3 and ELT5) thereof may be sequentially formed, but the disclosure is not limited thereto. For example, as in an embodiment of FIG. 5B, the pixel electrodes ELT may be simultaneously patterned to be formed on the same layer. It is possible to prevent a short circuit defect from occurring between adjacent pixel electrodes ELT by disposing at least one pattern BNP to overlap an edge area of the bank BNK in an area between the adjacent pixel electrodes ELT.

According to embodiments of FIG. 4A to FIG. 7B, it is possible to prevent a short circuit defect from occurring between the pixel electrodes ELT extending to the separating area SPA. Thus, it is possible to prevent the pixel PXL from being defective and to improve a yield of the display device DD.

FIG. 8 to FIG. 11 respectively illustrate a top plan view of the pixel PXL according to an embodiment. For example, FIG. 8 to FIG. 11 show different modified embodiments of the pixel PXL according to an embodiment of FIG. 4A.

Figure 11:
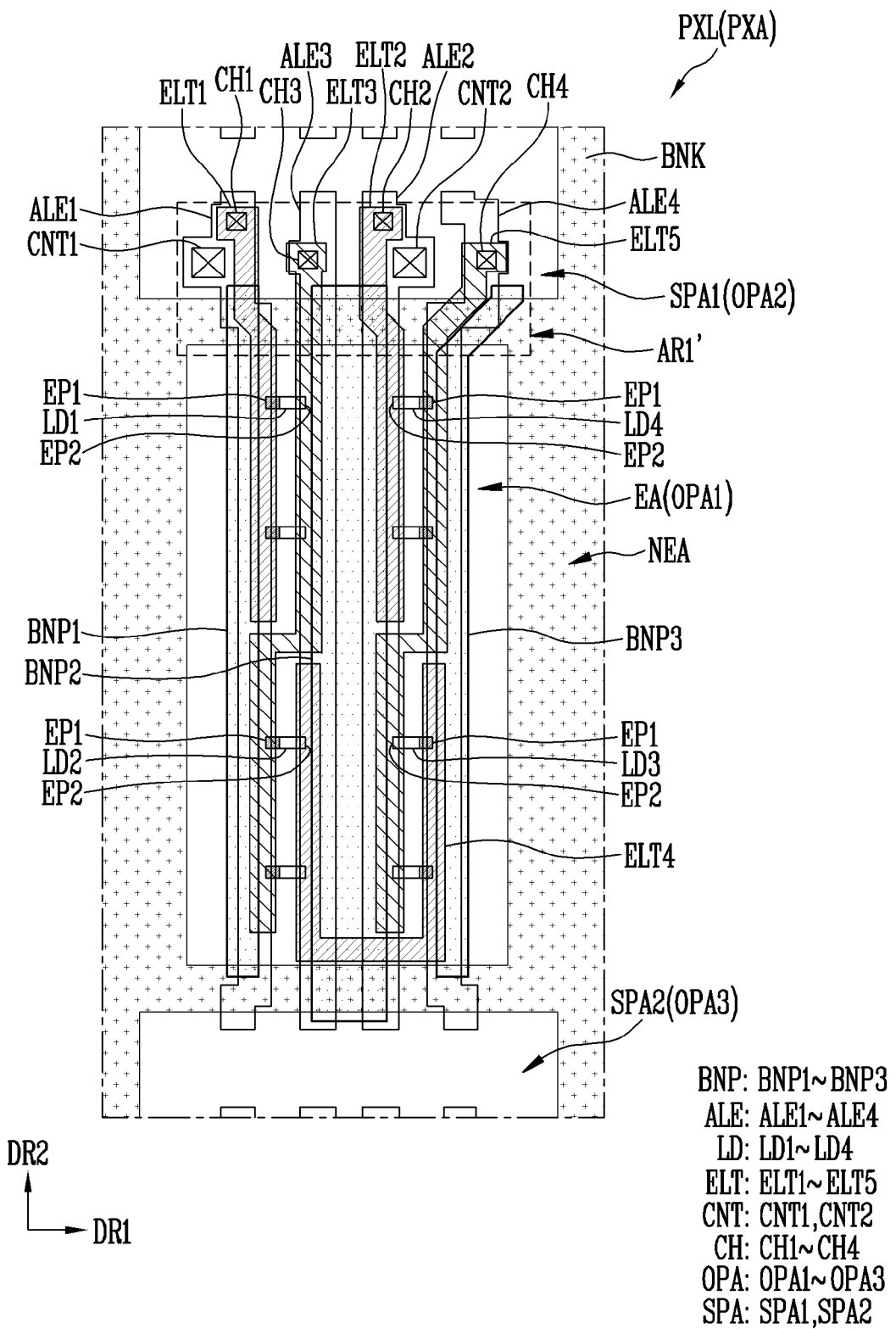
Figure 12A:
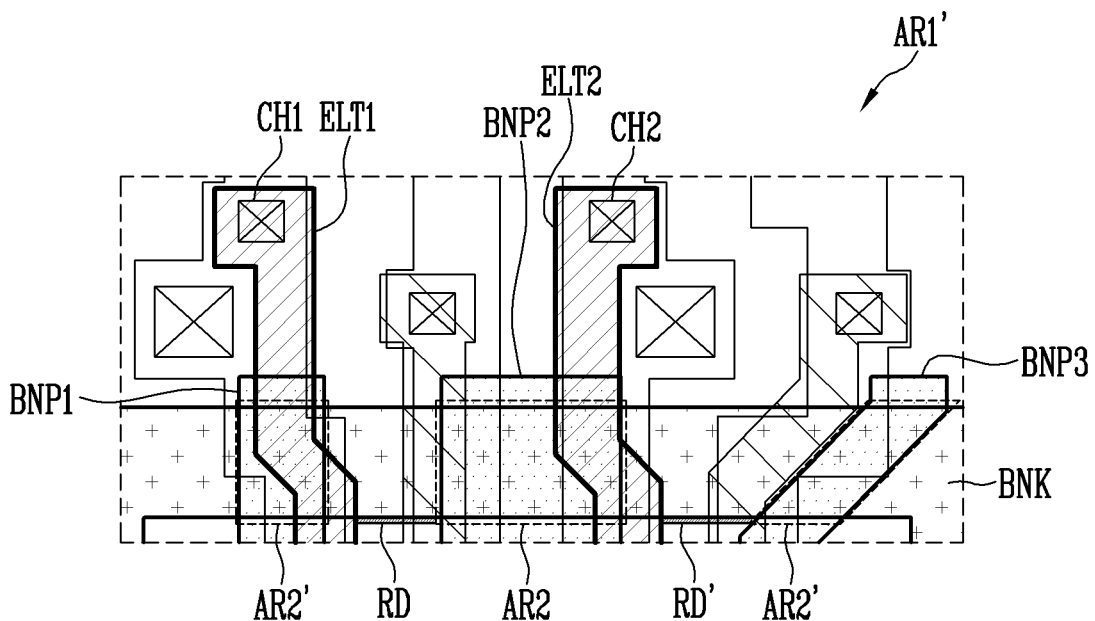
FIG. 12A and FIG. 12B illustrate enlarged views of area AR1' of FIG. 11.
Figure 12B:
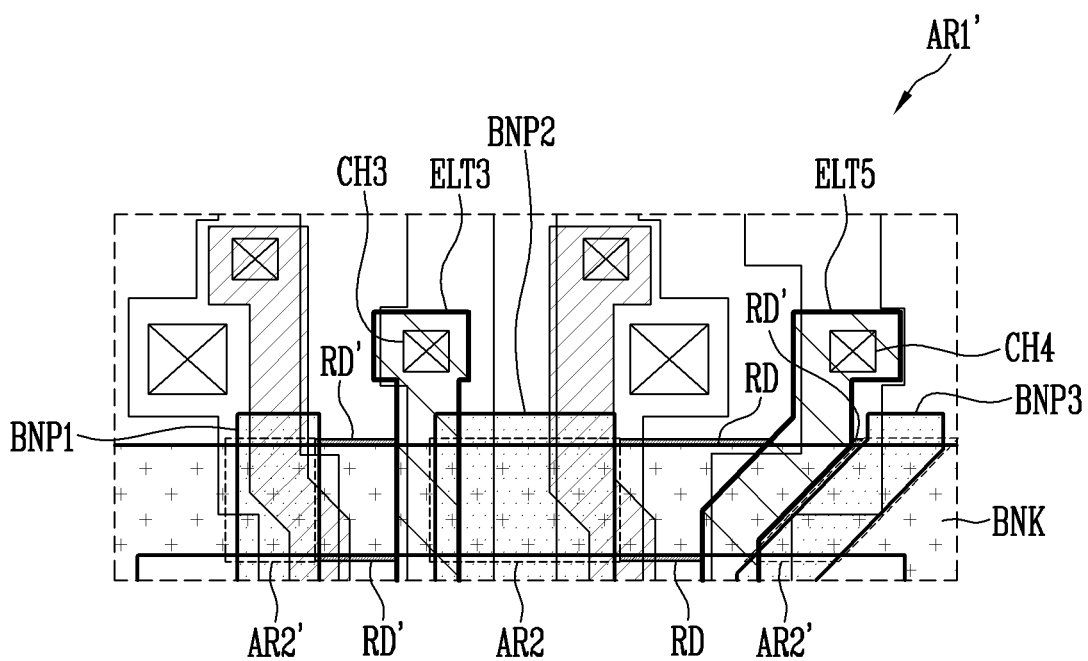

FIG. 12A and FIG. 12B illustrate enlarged views of area AR1' of FIG. 11. For example, FIG. 12A shows an embodiment in which residues RD and RD' of a conductive film are cut off or removed between the first pixel electrode ELT1 and the second pixel electrode ELT2, and FIG. 12B shows an embodiment in which the residues RD and RD' of the conductive film are cut off or removed between the third pixel electrode ELT3 and the fifth pixel electrode ELT5.

In embodiments of FIG. 8 to FIG. 12B, the same reference numerals are denoted in reference to configurations similar to or identical to those of the above-described embodiments (for example, embodiments of FIG. 4A to FIG. 7B), and detailed descriptions thereof will be omitted.

First, referring to FIG. 2 to FIG. 9, the configuration of the light emitting part EMU may be changed by changing the design of the pixel electrodes ELT. For example, by changing the shape, position, number, and/or connection structure of the pixel electrodes ELT, the number of serial stages forming the light emitting part EMU may be changed.

Figure 8:
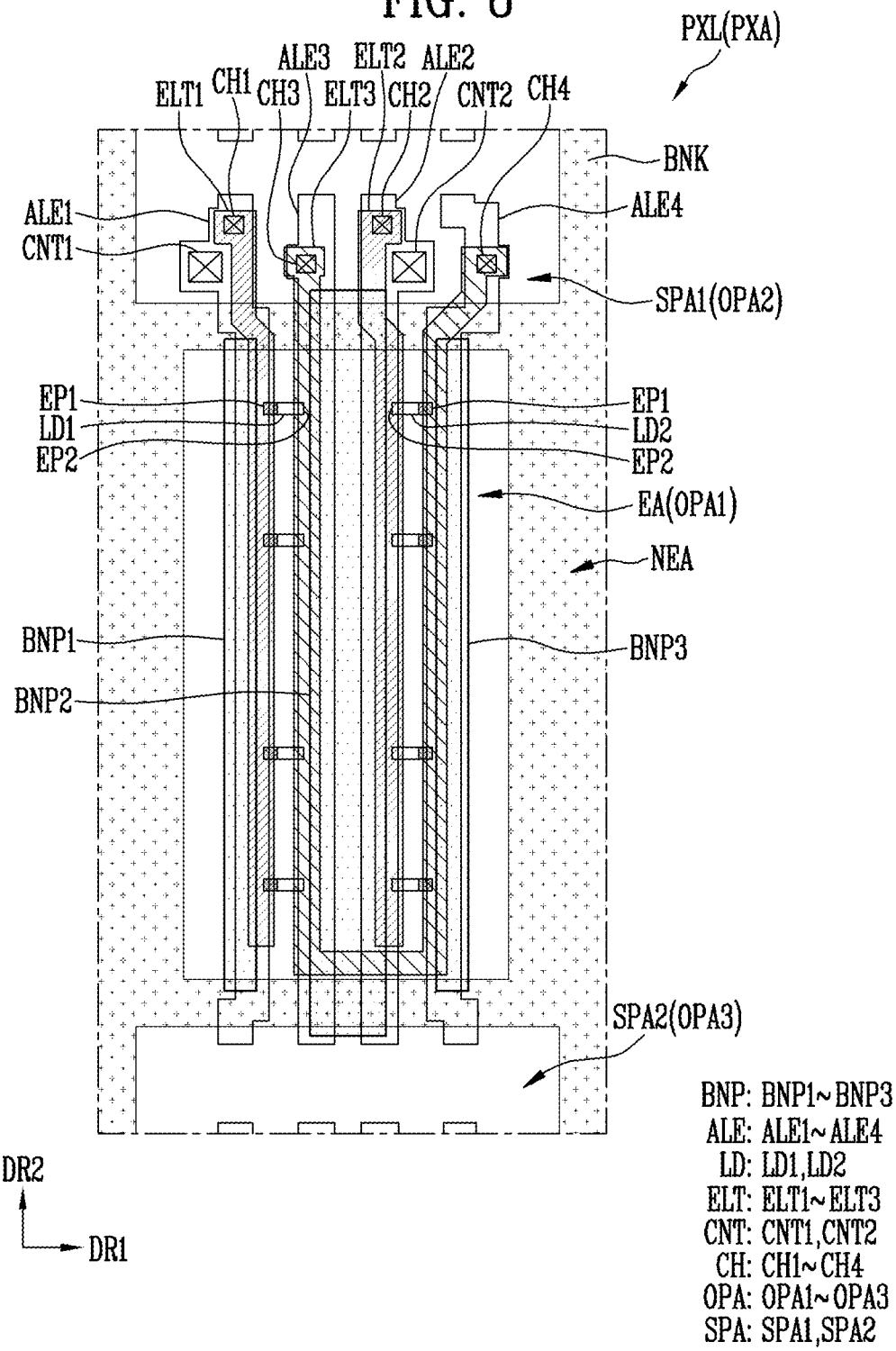
FIG. 8 to FIG. 11 respectively illustrate a top plan view of a pixel according to an embodiment.

For example, as in an embodiment of FIG. 8, by changing the design of the pixel electrodes ELT, the light emitting part EMU having a two-stage serial structure may be formed. As an example, as in an embodiment of FIG. 9, by changing the design of the pixel electrodes ELT, the light emitting part EMU having a single-stage serial structure (that, an in-parallel structure) may be formed. The structure of the light emitting part EMU may be changed by variously changing the design of the pixel electrodes ELT.

Referring to FIG. 8, the first pixel electrode ELT1 may overlap the first end portions EP1 of the first light emitting elements LD1 aligned between the first alignment electrodes ALE1, and the first and third alignment electrodes ALE1 and ALE3. The first pixel electrode ELT1 may be electrically connected to the first alignment electrode ALE1 through the first contact hole CH1, and may directly or indirectly contact the first end portions EP1 of the first light emitting elements LD1 to be electrically connected thereto.

The second pixel electrode ELT2 may overlap the second end portions EP2 of the second light emitting elements LD2 aligned between the second alignment electrodes ALE2, and the second and fourth alignment electrodes ALE2 and ALE4. The second pixel electrode ELT2 may be electrically connected to the second alignment electrode ALE2 through the second contact hole CH2, and may directly or indirectly contact the second end portions EP2 of the second light emitting elements LD2 to be electrically connected thereto.

The third pixel electrode ELT3 may overlap the third and fourth alignment electrodes ALE3 and ALE4, the second end portions EP2 of the first light emitting elements LD1, and the first ends EP1 of the second light emitting elements LD2. The third pixel electrode ELT3 may be electrically connected to the third and fourth alignment electrodes ALE3 and ALE4 through the third and fourth contact holes CH3 and CH4, and may directly or indirectly contact the second end portions EP2 of the first light emitting elements LD1 and the first end portions EP1 of the second light emitting elements LD2 to be electrically connected thereto.

Accordingly, the light emitting part EMU having the two-stage serial structure may be formed.

Figure 9:
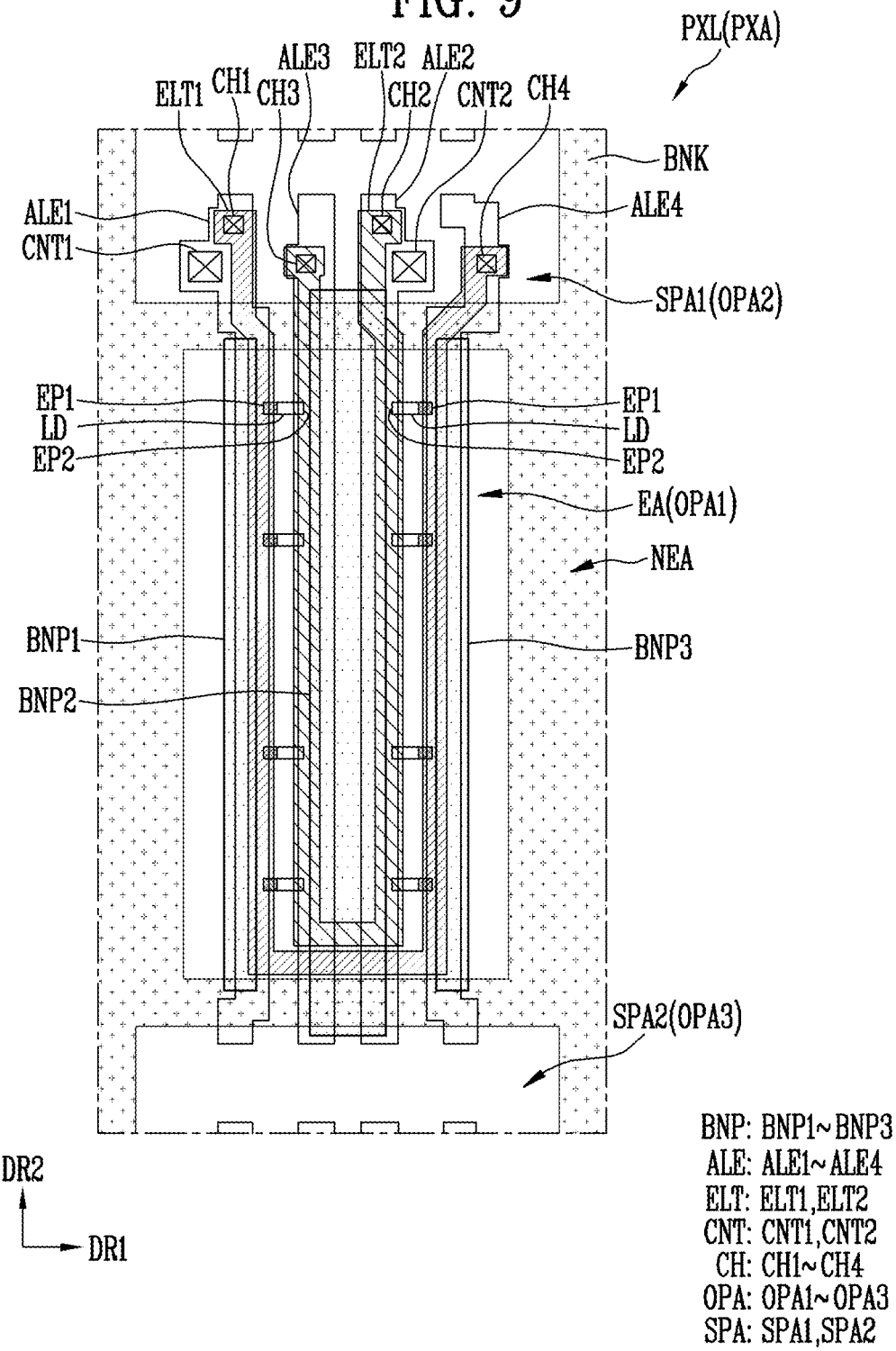

Referring to FIG. 9, the first pixel electrode ELT1 may overlap the first and fourth alignment electrodes ALE1 and ALE4, and the first end portions EP1 of the light emitting elements LD. The first pixel electrode ELT1 may be electrically connected to the first and fourth alignment electrodes ALE1 and ALE4 through the first and fourth contact holes CH1 and CH4, and may directly or indirectly contact the first end portions EP1 of the light emitting elements LD to be electrically connected thereto.

The second pixel electrode ELT2 may overlap the second and third alignment electrodes ALE2 and ALE3 and the second end portions EP2 of the light emitting elements LD. The second pixel electrode ELT2 may be electrically connected to the second and third alignment electrodes ALE2 and ALE3 through the second and third contact holes CH2 and CH3, and may directly or indirectly contact the second end portions EP2 of the light emitting elements LD to be electrically connected thereto.

Accordingly, the light emitting part EMU having the in-parallel structure may be formed.

Referring to FIG. 2 to FIG. 6 and FIG. 10, the disposition structure of the separating area SPA, the contact parts CNT, and/or the contact holes CH may be variously changed according to embodiments. For example, the separating area SPA may be disposed below the light emitting area EA with the non-light emitting area NEA interposed therebetween. The bank BNK may include a second opening OPA2' corresponding to the separating area SPA, and the alignment electrodes ALE may be cut off or removed in the separating area SPA.

The alignment electrodes ALE may be electrically connected to respective pixel electrodes ELT through respective contact holes CH in the separating area SPA, and as the positions of the contact holes CH are changed, the shapes of the alignment electrodes ALE and/or the pixel electrodes ELT may be changed. For example, the first, second, third, and fifth pixel electrodes ELT1, ELT2, ELT3, and ELT5 may extend to the separating area SPA through the non-light emitting area NEA below the light emitting area EA, and may be electrically connected to different alignment electrodes ALE through respective contact holes CH in the separating area. For example, compared with an embodiment of FIG. 4A, the pixel electrodes ELT may have a structure that is substantially up-and-down symmetric (or vertically symmetric).

Compared with an embodiment of FIG. 4A, positions of the first light emitting elements LD1, the second light emitting elements LD2, the third light emitting elements LD3, and the fourth light emitting elements LD4 may be changed. For example, in an embodiment of FIG. 4A, the first light emitting elements LD1, the second light emitting elements LD2, the third light emitting elements LD3, and the fourth light emitting elements LD4 may be arranged or disposed in a counterclockwise direction, while in an embodiment of FIG. 10, the first light emitting elements LD1, the second light emitting elements LD2, the third light emitting elements LD3, and the fourth light emitting elements LD4 may be arranged or disposed in a clockwise direction.

The first alignment electrode ALE1 and the second alignment electrode ALE2 may be electrically connected to the first power line PL1 (and/or the pixel circuit PXC) and the second power line PL2 through respective contact parts CNT in an area disposed on the light emitting area EA. For example, the first alignment electrode ALE1 and the second alignment electrode ALE2 may be respectively electrically connected to the first power line PL1 and the second power line PL2 through the first contact part CNT1 and the second contact part CNT2 in the non-light emitting area NEA disposed at an upper end of the light emitting area EA.

As in an embodiment of FIG. 10, in case that the contact parts CNT and the contact holes CH are distributed and formed in different areas, a degree of freedom in design of the pixel PXL may be improved. For example, compared with an embodiment of FIG. 4A in which the contact parts CNT and the contact holes CH may be densely disposed, design limit or limits on the positions and sizes of the contact parts CNT and/or the contact holes CH in an embodiment of FIG. 10 may be reduced.

Referring to FIG. 2 to FIG. 6 and FIG. 11 to FIG. 12B, in addition to the second pattern BNP2, at least one of the first and third patterns BNP1 and BNP3 may extend from the light emitting area EA through the non-light emitting area NEA to the separating area SPA. For example, the first and third patterns BNP1 and BNP3 may extend to the first separating area SPA1 to overlap upper and lower edge areas of the bank BNK at the boundary between the non-light emitting area NEA and the separating area SPA and at the boundary between the non-light emitting area NEA and the light emitting area EA.

In an embodiment, at least one pattern BNP may be disposed to be closer to the outside than the pixel electrodes ELT along the first direction DR1 in the separating area SPA. For example, one or an area of the first pattern BNP1 may be disposed to be closer to the outside than the first pixel electrode ELT1 along the first direction DR1 in the separating area SPA. The third pattern BNP3 may be bent to the right so that it may be disposed to be closer to the outside than the fifth pixel electrode ELT5 along the first direction DR1 in the separating area SPA.

Accordingly, in the first direction DR1, an area (for example, area ART) in which the patterns BNP and the bank BNK overlap may be formed outside the pixel electrodes ELT. Accordingly, the residual RD' of the conductive film is cut off or removed from extending in the outer direction of the pixel electrodes ELT, so that it is possible to prevent a short circuit defect from occurring between the pixel electrodes ELT along the edge of the separating area SPA.

FIG. 13A to FIG. 13D illustrate top plan views of a of manufacturing method of the pixel PXL according to an embodiment. For example, FIG. 13A to FIG. 13D sequentially show a manufacturing method of the pixel PXL according to an embodiment of FIG. 4A. FIG. 14 illustrates a schematic cross-sectional view taken along line III-III' of FIG. 13C.

Referring to FIG. 2 to FIG. 13A, the patterns BNP, alignment wires AL, the first insulating film INS1, and the bank BNK may be formed or disposed on the base layer BSL on which the circuit layer PCL may be selectively formed.

The alignment wires AL may be elements that are later separated as the alignment electrodes ALE. For example, the alignment electrodes ALE may first be formed in a form of respective alignment wires AL. For example, in order to align the light emitting elements LD in each light emitting area EA, the alignment electrodes ALE may be divided into groups in the entire display area DA, and the alignment electrodes ALE of each group may be first formed as an integral alignment line AL, and then a predetermined alignment signal may be applied in the step of supplying and aligning the light emitting elements LD.

For example, the first alignment electrodes ALE1 of the pixels PXL may be first integrally formed in a form of a first alignment line AL1, the second and third alignment electrodes ALE2 and ALE3 of the pixels PXL may be first integrally formed in a form of a second alignment line AL2, and the fourth alignment electrodes ALE4 of the pixels PXL may be first integrally formed in a form of a third alignment line AL3.

Referring to FIG. 2 to FIG. 13B, the light emitting elements LD may be supplied to each light emitting area EA on the base layer BSL on which the patterns BNP, the alignment lines AL, the first insulating film INS1, and the bank BNK may be formed, and predetermined alignment signals are applied to the alignment wires AL, so that the light emitting elements LD may be aligned.

In an embodiment, the light emitting elements LD may be supplied to each light emitting area EA through an inkjet method or the like within the spirit and the scope of the disclosure. For example, an inkjet head may be disposed at the upper portion of the base layer BSL on which the circuit layer PCL, the patterns BNP, the alignment wires AL, the first insulating film INS1, and the bank BNK may be formed or disposed, and then a light emitting element ink including a desired type of light emitting elements LD may be supplied to each light emitting area EA.

While supplying the light emitting element ink to each light emitting area EA, or after supplying the light emitting element ink, by applying respective alignment signals to respective alignment wires AL, an electric field may be formed between the alignment wires AL. For example, a first alignment signal, a second alignment signal, and a third alignment signal may be applied to the first alignment wire AL1, the second alignment wire AL2, and the third alignment wire AL3, respectively. Accordingly, the light emitting elements LD may be aligned between the alignment wires AL. For example, the light emitting elements LD may be disposed in areas between the patterns BNP, and may be aligned in a horizontal direction (for example, the first direction DR1) or a diagonal direction.

The first and second alignment signals may be signals having different potentials and/or phases, and accordingly, an electric field that induces alignment of the light emitting elements LD between the first and second alignment wires AL1 and AL2 may be formed. Similarly, the second and third alignment signals may be signals having different potentials and/or phases, and accordingly, an electric field that induces alignment of the light emitting elements LD between the second and third alignment wires AL2 and AL3 may be formed.

In an embodiment, the first and third alignment signals may be the same signal or different signals. In case that the first and third alignment signals are different signals, the first and third alignment wires AL1 and AL3 may be formed to be separated from each other. In case that the first and third alignment signals are the same signal, the first and third alignment wires AL1 and AL3 may be formed to be electrically connected to each other to receive the same signal or to be separated from each other but to receive the same signal.

In an embodiment, in order to control an alignment direction of the light emitting elements LD, the alignment signals may be adjusted, or a magnetic field may be formed. For example, the alignment signals may be adjusted or a magnetic field may be formed so that the first end portions EP1 of the light emitting elements LD may be further directed toward the first alignment wire AL1, between the first and second alignment wires AL1 and AL2. The alignment signals may be adjusted or a magnetic field may be formed so that the first end portions EP1 of the light emitting elements LD may be further directed toward the third alignment wire AL3, between the second and third alignment wires AL2 and AL3.

After the alignment of the light emitting elements LD is completed, the alignment wires AL may be separated into the alignment electrodes ALE of each pixel PXL by cutting off the alignment wires AL in each separating area SPA.

Referring to FIG. 2 to FIG. 13D, the pixel electrodes ELT may be formed or disposed on the base layer BSL on which the patterns BNP, the alignment electrodes ALE, the first insulating film INS1, the bank BNK, and the light emitting elements LD may be provided and/or or disposed.

Figure 13B:
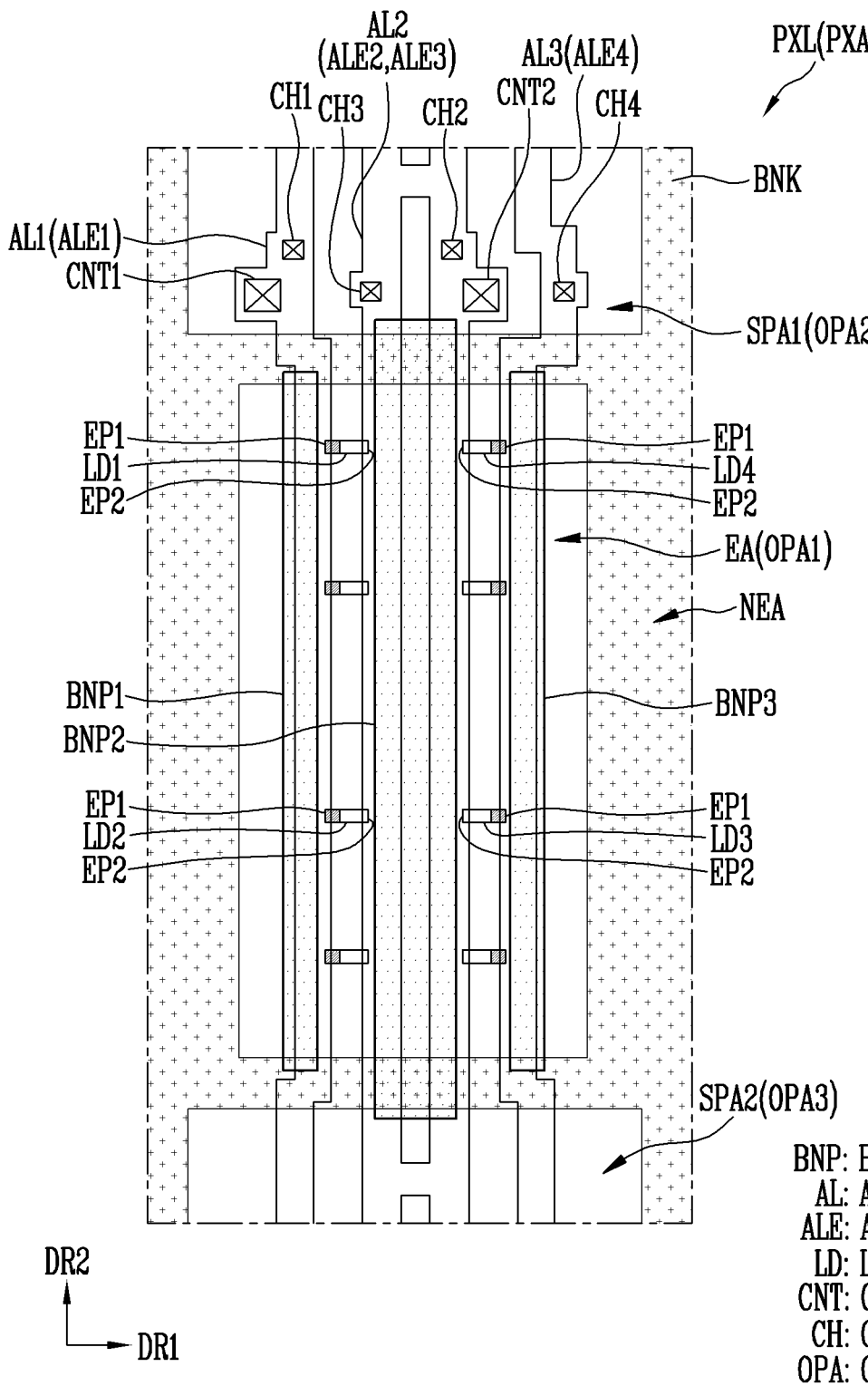
Figure 13C:
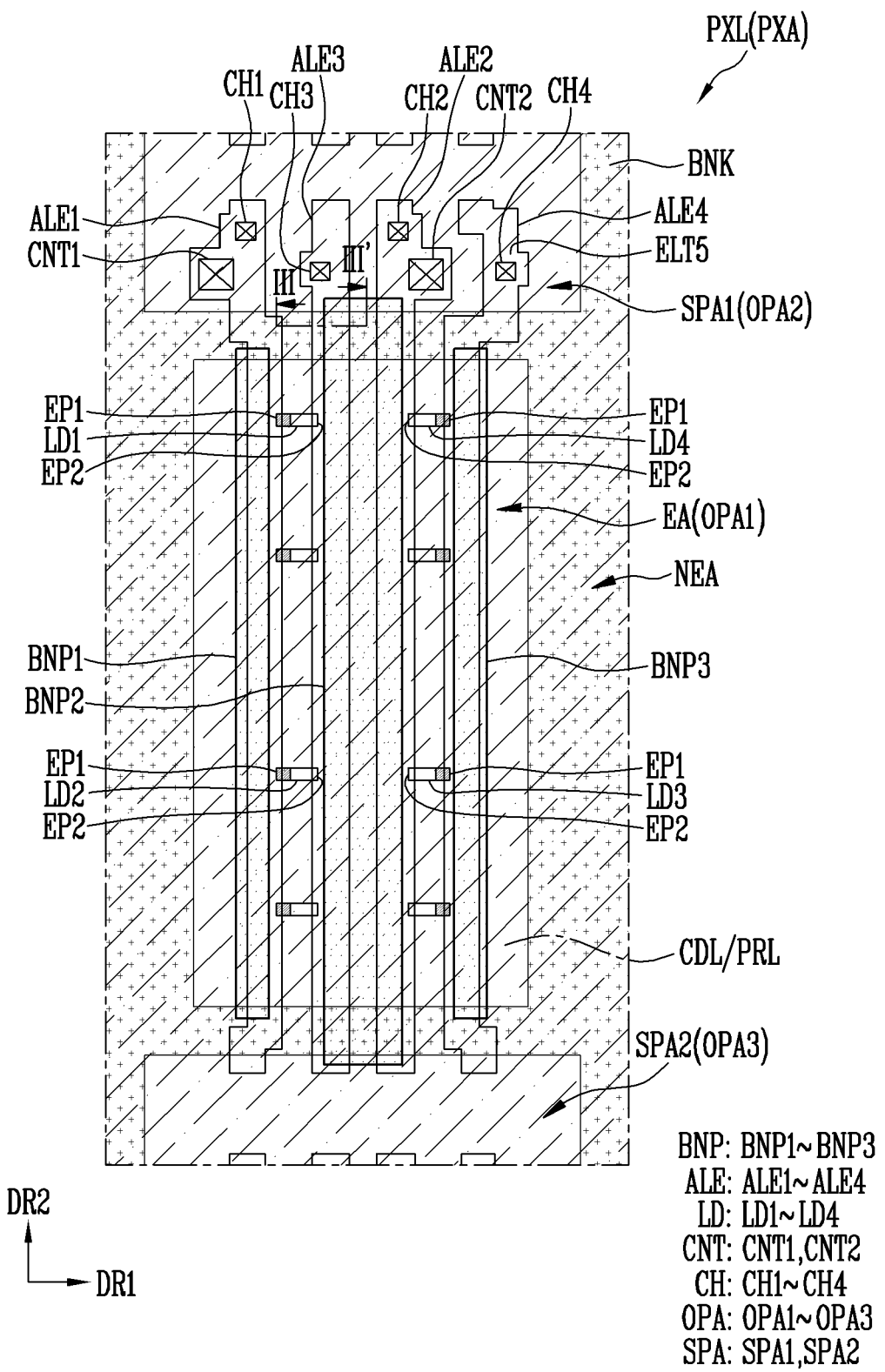
Figure 13D:
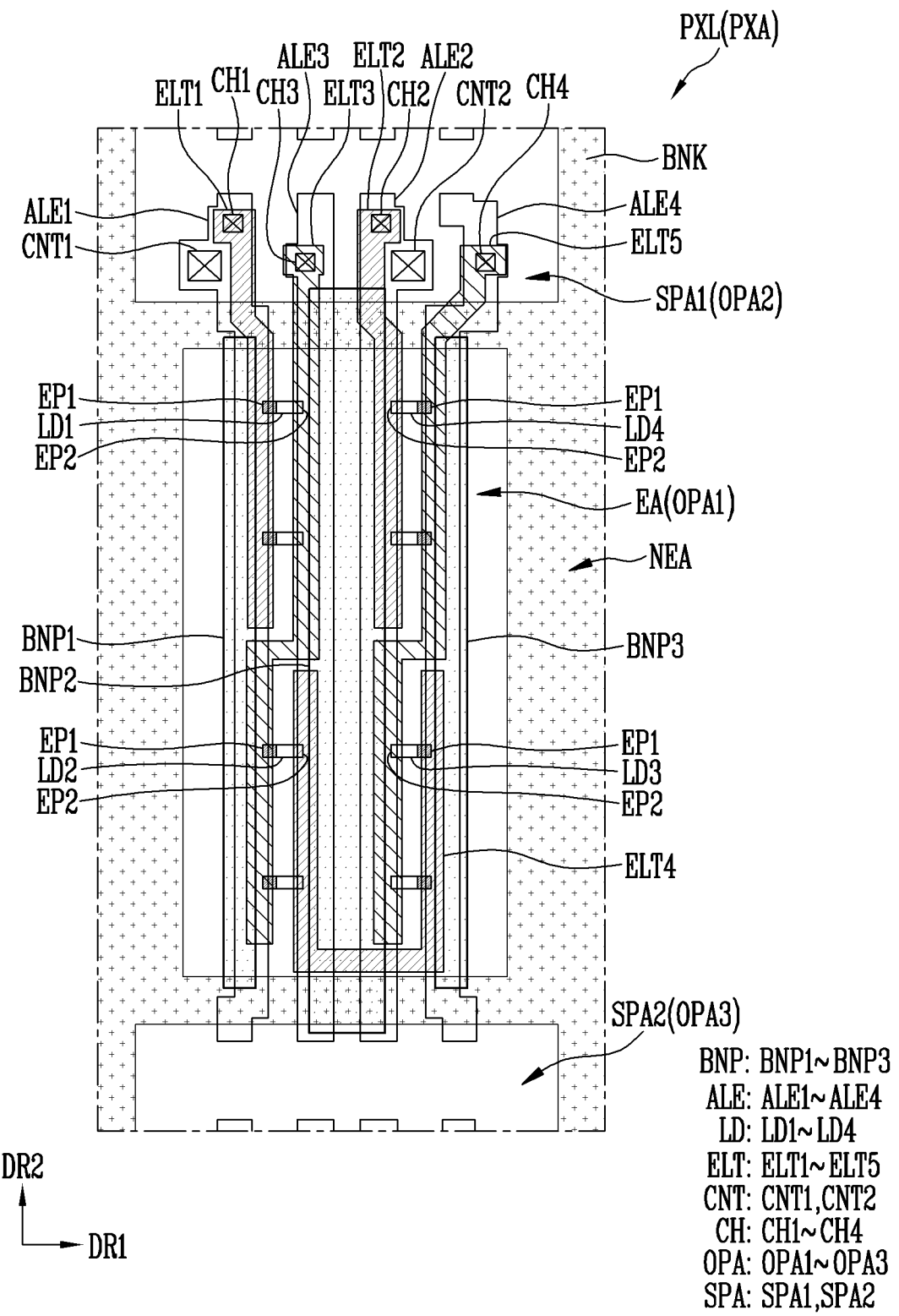
Figure 14:
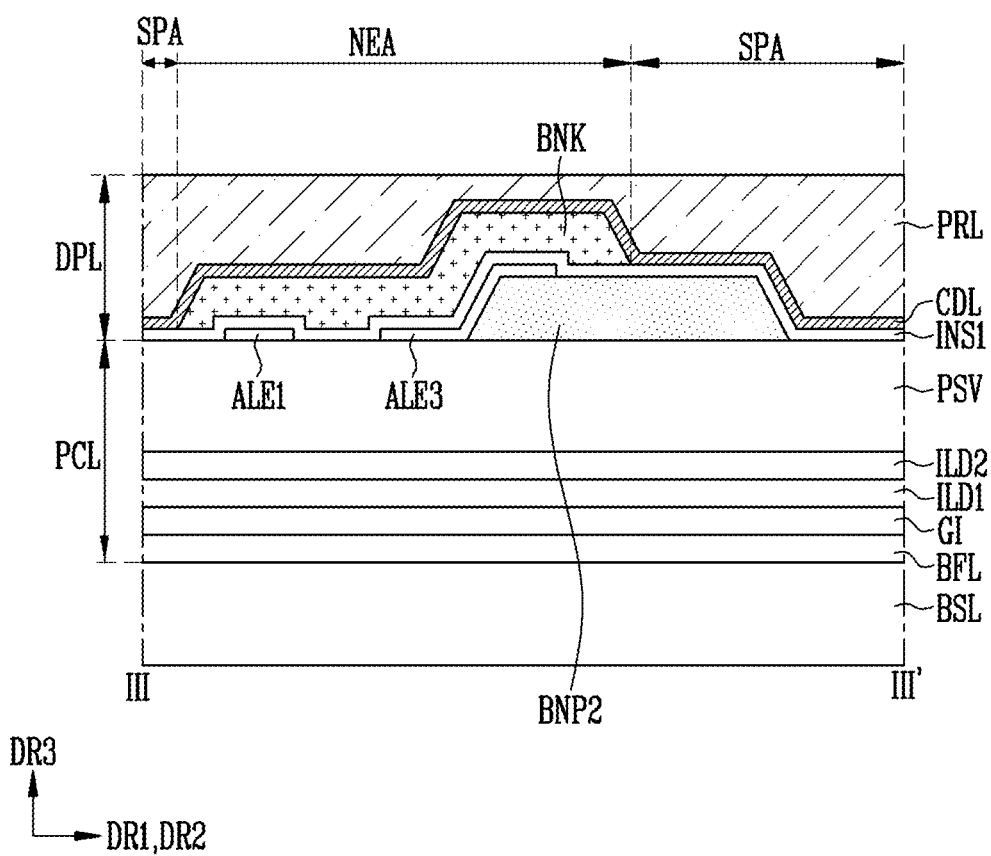
FIG. 14 illustrates a schematic cross-sectional view taken along line III-III' of FIG. 13C.

For example, as shown in FIG. 13C and FIG. 14, a conductive film CDL and a photo resist film PRL may be formed or disposed on the base layer BSL on which the patterns BNP, the alignment electrodes ALE, the first insulating film INS1, the bank BNK, and the light emitting elements LD may be formed and/or provided or disposed. The conductive film CDL may be used for forming the pixel electrodes ELT, and may be entirely formed in the display area DA. The photo resist film PRL may be used for forming a mask for patterning the conductive film CDL, and may be formed as a mask pattern corresponding to the pixel electrodes ELT after being entirely formed in the display area DA.

The pixel electrodes ELT may be formed by selectively etching the conductive film CDL through a photo process.

As shown in FIG. 14, in the area in which the patterns BNP, for example, BNP1 and the bank BNK overlap, as the conductive film CDL protrudes to be higher than the remaining area, the photo resist film PRL may be formed to have a relatively thin thickness. Accordingly, in the case of etching the conductive film CDL in the area in which the patterns BNP and the bank BNK overlap, it is possible to stably pattern the photo resist film PRL on the conductive film CDL, and thus it is possible to sufficiently etch the conductive film CDL as desired. Therefore, according to embodiments, it is possible to prevent a short circuit defect from occurring between the pixel electrodes ELT.

The disclosure has been described according to the embodiments, but it should be noted that the foregoing embodiments are provided only for illustration while not limiting the disclosure. In addition, it will be understood by those skilled in the art that various changes in form and details may be made therein without departing from the scope of the disclosure.

The scope of the disclosure may be determined by the scope of the accompanying claims. In addition, all changes or modifications that come within the meaning and range of the claims and their equivalents will be interpreted as including the range of the disclosure.

What is claimed is:
1. A pixel comprising:
    a light emitting area, a non-light emitting area adjacent to the light emitting area, and a separating area spaced apart from the light emitting area, the non-light emitting area being disposed between the light emitting area and the separating area;
    a first pattern and a second pattern that are spaced apart from each other along a first direction in the light emitting area and respectively extend along a second direction;
    a first light emitting element disposed between the first pattern and the second pattern;
    a first electrode electrically connected to a first end portion of the first light emitting element;

a second electrode electrically connected to a second end portion of the first light emitting element, the second electrode being connected to a different electrical node than the first electrode; and a bank disposed in the non-light emitting area, wherein the first electrode and the second electrode extend from the light emitting area through the non-light emitting area to the separating area, the second pattern extends from the light emitting area through the non-light emitting area to the separating area, overlaps an edge of the bank, and is disposed in an area between the first electrode and the second electrode at a boundary of the non-light emitting area and the separating area.

2. The pixel of claim 1, further comprising:

a first alignment electrode that is disposed on the first pattern, extends along the second direction in the light emitting area, and extends from the light emitting area through the non-light emitting area to the separating area;

a second alignment electrode that is disposed on the second pattern, extends along the second direction in the light emitting area, and extends from the light emitting area through the non-light emitting area to the separating area; and a first insulating film that overlaps the first alignment electrode and the second alignment electrode in the light emitting area, the first insulating film being disposed between the first alignment electrode and the second alignment electrode and the first electrode and the second electrode.

3. The pixel of claim 2, wherein the first alignment electrode and the second alignment electrode are spaced apart from each other at a substantially uniform interval in the light emitting area and respectively have a substantially uniform width.

4. The pixel of claim 3, wherein the first pattern partially overlaps the first alignment electrode and has a substantially uniform width in the light emitting area; and the second pattern partially overlaps the second alignment electrode and has a substantially uniform width, the second pattern being spaced apart from the first pattern by a constant interval in the light emitting area.

5. The pixel of claim 2, further comprising:

a second light emitting element disposed between the first pattern and the second pattern.

6. The pixel of claim 5, further comprising:

a third electrode that is disposed between the first electrode and the second electrode, and is electrically connected between the first electrode and the second electrode through the first light emitting element and the second light emitting element; and a third alignment electrode that is disposed between the first alignment electrode and the second alignment electrode, and overlaps an area of the second pattern.

7. The pixel of claim 6, wherein the first electrode overlaps a first area of the first alignment electrode and a first end portion of the first light emitting element, the third electrode overlaps a first area of the third alignment electrode, a second end portion of the first light emitting element, a second area of the first alignment electrode, and a first end portion of the second light emitting element, and the third electrode has a substantially curved or substantially bent shape.

8. The pixel of claim 7, wherein the third electrode extends from the light emitting area through the non-light emitting area to the separating area, and is electrically connected to the third alignment electrode through a third contact hole formed in the first insulating film in the separating area.

9. The pixel of claim 8, wherein the second pattern overlaps the edge of the bank and is disposed in an area between the third electrode and the second electrode at a boundary of the non-light emitting area and the separating area.

10. The pixel of claim 7, further comprising:

a third pattern facing the first pattern, the second pattern being disposed between the third pattern and the first pattern; and a fourth alignment electrode that is disposed on the third pattern, extends along the second direction in the light emitting area, and extends from the light emitting area through the non-light emitting area to the separating area.

11. The pixel of claim 10, wherein the first alignment electrode and the third alignment electrode are spaced apart from each other by a first constant distance along the first direction, and have a substantially uniform width in the light emitting area; and the second alignment electrode and the fourth alignment electrode are spaced apart from each other by the first constant distance along the first direction, and have a substantially uniform width in the light emitting area.

12. The pixel of claim 11, wherein the first pattern overlaps an area of the first alignment electrode in the light emitting area, the second pattern overlaps an area of the second alignment electrode and the third alignment electrode in the light emitting area, the third pattern overlaps an area of the fourth alignment electrode in the light emitting area, the first pattern, the second pattern, and the third pattern have a substantially uniform width, and the second pattern is spaced apart from the first pattern and the third pattern by a same distance in the light emitting area.

13. The pixel of claim 10, further comprising:

a fourth electrode that has a substantially curved or substantially bent shape, overlaps a second area of the third alignment electrode and a first area of the fourth alignment electrode, and is electrically connected between the second electrode and the third electrode; and a fifth electrode that has a substantially curved or substantially bent shape, overlaps a first area of the second alignment electrode and a second area of the fourth alignment electrode, and is electrically connected between the second electrode and the fourth electrode.

14. The pixel of claim 13, further comprising:

a third light emitting element that is disposed between the second pattern and the third pattern, and includes a first end portion electrically connected to the fourth electrode and a second end portion electrically connected to the fifth electrode; and a fourth light emitting element that is disposed between the second pattern and the third pattern, and includes a first end portion electrically connected to the fifth electrode and a second end portion electrically connected to the second electrode.

15. The pixel of claim 13, wherein
at least one of the first pattern or the third pattern extends from the light emitting area through the non-light emitting area to the separating area.
16. The pixel of claim 15, wherein
the third pattern extends to the separating area, and is closer to an outside of the separating area than the fifth electrode along the first direction in the separating area.
17. The pixel of claim 1, further comprising:
a conductive pattern that is disposed between the first electrode and the second electrode at a boundary between the non-light emitting area and the separating area or at a boundary between the non-light emitting area and the light emitting area, and extends along a boundary of the non-light emitting area.
18. The pixel of claim 17, wherein
an end portion of the conductive pattern is electrically connected to one of the first electrode or the second electrode, and
another end portion of the conductive pattern is floating.
19. The pixel of claim 17, wherein
the conductive pattern does not overlap the second pattern, and
an end portion of the conductive pattern is removed around the second pattern.
20. The pixel of claim 1, wherein
the second pattern has a first edge disposed in the light emitting area and a second edge opposite the first edge disposed in the separating area,
the bank has a first edge facing the light emitting area and a second edge opposite the first edge facing the separating area,
at least the first edge of the bank is directly over the second pattern, and
the non-light emitting area is defined as the area between the first edge of the bank and the second edge of the bank.
21. A pixel comprising:
a light emitting area, a non-light emitting area adjacent to the light emitting area, and a separating area spaced apart from the light emitting area, the non-light emitting area being disposed between the light emitting area and the separating area;
a first pattern and a second pattern that are spaced apart from each other along a first direction in the light emitting area and respectively extend along a second direction;
a first light emitting element disposed between the first pattern and the second pattern;
a first electrode electrically connected to a first end portion of the first light emitting element;
a second electrode electrically connected to a second end portion of the first light emitting element; and
a bank disposed in the non-light emitting area;
a first alignment electrode that is disposed on the first pattern, extends along the second direction in the light emitting area, and extends from the light emitting area through the non-light emitting area to the separating area;
a second alignment electrode that is disposed on the second pattern, extends along the second direction in the light emitting area, and extends from the light emitting area through the non-light emitting area to the separating area; and
a first insulating film that overlaps the first alignment electrode and the second alignment electrode in the light emitting area, the first insulating film being disposed between the first alignment electrode and the second alignment electrode and the first electrode and the second electrode, wherein
the first electrode and the second electrode extend from the light emitting area through the non-light emitting area to the separating area, and
the second pattern extends from the light emitting area through the non-light emitting area to the separating area, overlaps an edge of the bank, and is disposed in an area between the first electrode and the second electrode at a boundary of the non-light emitting area and the separating area,
the first alignment electrode is electrically connected to the first electrode through a first contact hole formed in the first insulating film in the separating area, and
the second alignment electrode is electrically connected to the second electrode through a second contact hole formed in the first insulating film in the separating area.
22. A pixel comprising:
a light emitting area, a non-light emitting area adjacent to the light emitting area, and a separating area spaced apart from the light emitting area, the non-light emitting area being disposed between the light emitting area and the separating area;
a first pattern and a second pattern that are spaced apart from each other along a first direction in the light emitting area and respectively extend along a second direction;
a first light emitting element disposed between the first pattern and the second pattern;
a first electrode electrically connected to a first end portion of the first light emitting element;
a second electrode electrically connected to a second end portion of the first light emitting element; and
a bank disposed in the non-light emitting area;
a first alignment electrode that is disposed on the first pattern, extends along the second direction in the light emitting area, and extends from the light emitting area through the non-light emitting area to the separating area;
a second alignment electrode that is disposed on the second pattern, extends along the second direction in the light emitting area, and extends from the light emitting area through the non-light emitting area to the separating area; and
a first insulating film that overlaps the first alignment electrode and the second alignment electrode in the light emitting area, the first insulating film being disposed between the first alignment electrode and the second alignment electrode and the first electrode and the second electrode, wherein
the first electrode and the second electrode extend from the light emitting area through the non-light emitting area to the separating area, and
the second pattern extends from the light emitting area through the non-light emitting area to the separating area, overlaps an edge of the bank, and is disposed in an area between the first electrode and the second electrode at a boundary of the non-light emitting area and the separating area,
the separating area is disposed below the light emitting area, and
the first electrode and the second electrode are electrically connected to the first alignment electrode and the second alignment electrode, respectively, through respective contact holes in the separating area.

23. The pixel of claim 22, wherein
the first alignment electrode and the second alignment electrode are electrically connected to a first power line and a second power line, respectively, through respective contact parts in an area disposed at an upper end of the light emitting area.

24. A display device comprising:
a pixel disposed in a display area, wherein
the pixel includes:
- a light emitting area, a non-light emitting area adjacent to the light emitting area, and a separating area spaced apart from the light emitting area, the non-light emitting area being disposed between the light emitting area and the separating area; and
- a first pattern and a second pattern that are spaced apart from each other along a first direction in the light emitting area and respectively extend along a second direction;
- a light emitting element disposed between the first pattern and the second pattern;
- a first electrode electrically connected to a first end portion of the light emitting element;
- a second electrode electrically connected to a second end portion of the light emitting element, the second electrode being connected to a different electrical node than the first electrode; and
- a bank disposed in the non-light emitting area, the first electrode and the second electrode extend from the light emitting area through the non-light emitting area to the separating area, and the second pattern extends from the light emitting area through the non-light emitting area to the separating area, overlaps an edge of the bank, and is disposed in an area between the first electrode and the second electrode at a boundary of the non-light emitting area and the separating area.

* * * * *